US009876499B2

(12) United States Patent
Kozuma et al.

(10) Patent No.: US 9,876,499 B2
(45) **Date of Patent: *Jan. 23, 2018**

(54) SEMICONDUCTOR DEVICE, ELECTRONIC COMPONENT, AND ELECTRONIC DEVICE

(71) Applicant: Semiconductor Energy Laboratory Co., Ltd., Atsugi-shi, Kanagawa-ken (JP)

(72) Inventors: Munehiro Kozuma, Kanagawa (JP); Takayuki Ikeda, Kanagawa (JP); Yoshiyuki Kurokawa, Kanagawa (JP); Takeshi Aoki, Kanagawa (JP); Yuki Okamoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/279,594

(22) Filed: Sep. 29, 2016

(65) Prior Publication Data

US 2017/0085264 A1 Mar. 23, 2017

Related U.S. Application Data

(63) Continuation of application No. 15/007,350, filed on Jan. 27, 2016, now Pat. No. 9,461,646.

(30) Foreign Application Priority Data

Jan. 29, 2015 (JP) ................................ 2015-014997
Aug. 19, 2015 (JP) ................................ 2015-161815

(51) Int. Cl.
*H03K 19/177* (2006.01)
*H03K 19/00* (2006.01)
*H03K 19/0948* (2006.01)

(52) U.S. Cl.
CPC ..... *H03K 19/0013* (2013.01); *H03K 19/0948* (2013.01); *H03K 19/1776* (2013.01); *H03K 19/17728* (2013.01)

(58) Field of Classification Search
CPC .......... H03K 19/0013; H03K 19/0948; H03K 19/1776; H03K 19/17728
USPC ..................................................... 326/38, 41
See application file for complete search history.

(56) References Cited

U.S. PATENT DOCUMENTS 6,590,423 B1 * 7/2003 Wong ................ H03K 19/0963 326/93
6,864,708 B2 3/2005 Takahashi et al.
(Continued)

OTHER PUBLICATIONS

Lotze.N et al., "A 62 mV 0.13 μm CMOS Standard-Cell-Based Design Technique Using Schmitt-Trigger Logic", IEEE Journal of Solid-State Circuits, 2012, vol. 47, No. 1, pp. 47-60.
(Continued)

*Primary Examiner* — Don Le
(74) *Attorney, Agent, or Firm* — Fish & Richardson P.C.

(57) ABSTRACT

A semiconductor device suitable for low-voltage driving. The semiconductor device includes a first transistor, a second transistor, a power supply line, a circuit, and a memory circuit. The first transistor controls electrical continuity between the circuit and the power supply line. The memory circuit stores data for setting a gate potential of the first transistor. The second transistor controls electrical continuity between an output node of the memory circuit and a gate of the first transistor. The second transistor is a transistor with an ultralow off-state current, for example, an oxide semiconductor transistor. In a period for operating the circuit, a first potential is input to the power supply line and the second transistor is turned off. In a period for updating the gate potential of the first transistor, a second potential is input to the power supply line. The second potential is higher than the first potential.

14 Claims, 43 Drawing Sheets

(56) References Cited

U.S. PATENT DOCUMENTS

| | | | | |
|---|---|---|---|---|
| 7,589,584 | B1 | 9/2009 | Bui | |
| 8,970,251 | B2 | 3/2015 | Kurokawa | |
| 9,111,638 | B2 * | 8/2015 | Burnett | G11C 11/419 |
| 2003/0090311 | A1 * | 5/2003 | Pan | G11C 5/145 327/390 |
| 2006/0050581 | A1 * | 3/2006 | Luk | G11C 7/06 365/205 |
| 2006/0181306 | A1 | 8/2006 | Cho | |
| 2007/0247186 | A1 | 10/2007 | Sakata et al. | |
| 2009/0237107 | A1 | 9/2009 | Lee et al. | |
| 2014/0159771 | A1 | 6/2014 | Ikeda et al. | |
| 2014/0327470 | A1 | 11/2014 | Nazarian et al. | |
| 2015/0311897 | A1 * | 10/2015 | Bjorklund | H03K 19/1776 326/41 |

OTHER PUBLICATIONS

Ali.S et al., "A Robust, Low Power, High Speed Voltage Level Shifter With Built-in Short Circuit Current Reduction", 2011 20th European Conference on Circuit Theory and Design (ECCTD), Aug. 29, 2011, pp. 142-145.

Calhoun.B et al., "Flexible Circuits and Architectures for Ultralow Power", Proceedings of the IEEE, Feb. 1, 2010, vol. 98, No. 2, pp. 267-282.

Grossmann.P et al., "Minimum Energy Analysis and Experimental Verification of a Latch-Based Subthreshold FPGA", IEEE Transactions on Circuits and Systems, Dec. 1, 2012, vol. 59, No. 12, pp. 942-946.

Aoki.T et al., "Normally-Off Computing with Crystalline InGaZnO-based FPGA", ISSCC 2014 (Digest of Technical Papers. IEEE International Solid-State Circuits Conference), Feb. 12, 2014, vol. 2014, pp. 502-504.

Zimmermann.R et al., "Low-Power Logic Styles: CMOS Versus Pass-Transistor Logic", IEEE Journal of Solid-State Circuits, Jul. 1, 1997, vol. 32, No. 7, pp. 1079-1090.

Lee.K et al., "Demonstration of a Subthreshold FPGA Using Monolithically Integrated Graphene Interconnects", IEEE Transactions on Electron Devices, 2013, vol. 60, No. 1, pp. 383-390.

* cited by examiner

100

| Specifications | NMOS | PMOS | OS(IGZO) |
|---|---|---|---|
| L/W (μm)/(μm) | 0.24 / 4.15 | 0.24 / 8.15 | 0.81 / 2.96 |
| Vd (V) | 0.1, 0.4 | 0.1, 0.4 | 0.1, 3.3 |
| Vth (V) | 0.43 | -0.26 | 1.07 |
| S-value (mV/dec) | 73.2 | 74 | 98.5 |
| Icut (A) | $8.29\times10^{-11}$ | $3.77\times10^{-10}$ | Measurement below the lower limit |

| | Configuration | Under operation | Context switching | Update |
|---|---|---|---|---|
| IOVDD | ON/OFF | ON/OFF | ON/OFF | ON/OFF |
| $HVDD_{cfg}$ | ON | OFF | OFF | ON |
| $HVDD_{ctx}$ | ON | OFF | ON | OFF |
| LVDD | ON | ON | ON | ON |
| Operation of user's circuits | – | ○ | ○ | ○ |

<RO3>

<CNT4>

SEMICONDUCTOR DEVICE, ELECTRONIC COMPONENT, AND ELECTRONIC DEVICE

CROSS-REFERENCE TO RELATED APPLICATIONS

This application is a continuation of U.S. application Ser. No. 15/007,350, filed Jan. 27, 2016, now allowed, which claims the benefit of foreign priority applications filed in Japan as Serial No. 2015-014997 on Jan. 29, 2015, and Serial No. 2015-161815 on Aug. 19, 2015, all of which are incorporated by reference.

BACKGROUND OF THE INVENTION

1. Field of the Invention

The specification, the drawings, and the claims of the present application (hereinafter referred to as "this specification and the like") disclose a semiconductor device, an electronic component, an electronic device, an operation method therefor, and a manufacturing method therefor. Examples of the technical field of one embodiment of the present invention include a semiconductor device, a memory device, a processor, a switch circuit (e.g., a power switch and a routing switch), a display device, a liquid crystal display device, a light-emitting device, a lighting device, a power storage device, an input device, an imaging device, a method of driving any of them, and a method of manufacturing any of them.

2. Description of the Related Art

A programmable logic device (PLD) includes a plurality of programmable logic elements (PLEs) and a plurality of programmable switch elements. In the PLD, data on a function of each PLE and data on connection between PLEs by programmable switch elements are stored as configuration data in a configuration memory.

There have been proposed a variety of applications taking advantage of ultralow off-state current of a transistor in which a channel is formed in an oxide semiconductor layer (hereinafter such a transistor is referred to as oxide semiconductor transistor or OS transistor).

For example, Patent Document 1 and Non-Patent Document 1 each suggest a field-programmable gate array (FPGA) including a nonvolatile configuration memory that retains a potential corresponding to configuration data at a gate of a pass transistor by connecting the gate of the pass transistor to one of a source and a drain of an oxide semiconductor transistor. These documents disclose that the FPGAs achieve low power consumption in standby mode due to fine-grained power gating and the nonvolatile configuration memory, and low power consumption and fast configuration switching using contexts.

REFERENCE

Patent Document

Patent Document 1: United States Patent Application Publication No. 2014/0159771

Non-Patent Document

Non-Patent Document 1: T. Aoki et al., "Normally-Off Computing with Crystalline InGaZnO-based FPGA", *IEEE ISSCC Dig. Tech. Papers,* 2014, pp. 502-503.

Non-Patent Document 2: P. J. Grossmann et al., "Minimum Energy Analysis and Experimental Verification of a Latch-Based Subthreshold FPGA", *IEEE Trans. Circuits and Systems*, December 2012, vol. 59, no. 12, pp. 942-946.

Non-Patent Document 3: K.-J. Lee et al., "Demonstration of a Subthreshold FPGA Using Monolithically Integrated Graphene Interconnects", *IEEE Trans. on Electron Devices*, January 2013, vol. 60, no. 1, pp. 383-390.

Non-Patent Document 4: B. H. Calhoun et al., "Flexible Circuits and Architectures for Ultralow Power", *Proceedings of The IEEE*, February 2010, vol. 98, no. 2, pp. 267-282.

Non-Patent Document 5: N. Lotze and Y. Manoli, "A 62 mV 0.13 μm CMOS Standard-Cell-Based Design Technique Using Schmitt-Trigger Logic", *IEEE J. Solid-State Circuits*, January 2012, vol. 47, no. 1, pp. 47-60.

Non-Patent Document 6: R. Zimmermann and W. Fichtner, "Low-Power Logic Styles: CMOS Versus Pass-Transistor Logic", *IEEE J. Solid-State Circuits*, July 1997, vol. 32, no. 7, pp. 1079-1090.

Non-Patent Document 7: S. Ali, S. Tanner, and P. A. Farine, "A Robust, Low Power, High Speed Voltage Level Shifter With Built-in Short Circuit Current Reduction", *IEEE ECCTD,* 2011, pp. 142-145.

SUMMARY OF THE INVENTION

An object of one embodiment of the present invention is to provide a novel semiconductor device or a method for driving the semiconductor device. Another object of one embodiment of the present invention is to reduce power consumption, perform stable operation in low-voltage driving, perform fine-grained power gating, increase power efficiency, achieve both low power driving and low power consumption, or perform subthreshold driving.

Note that the description of a plurality of objects does not mutually preclude the existence. One embodiment of the present invention does not necessarily achieve all the objects. Objects other than those listed above are apparent from the description of the specification, drawings, and claims, and such objects could be an object of one embodiment of the present invention.

First Embodiment

One embodiment of the present invention is a semiconductor device including a first transistor, a second transistor, a power supply line, a circuit, and a memory circuit. The first transistor has a function of controlling electrical continuity between the circuit and the power supply line. The memory circuit has a function of storing data for setting a potential of a gate of the first transistor. The second transistor includes an oxide semiconductor layer where a channel is formed. The second transistor has a function of controlling electrical continuity between an output node of the memory circuit and the gate of the first transistor. In a period during which the circuit operates, a first potential is input to the power supply line and the second transistor is turned off. In a period during which the potential of the gate of the first transistor is updated, a second potential higher than the first potential is input to the power supply line and the second transistor is turned on.

Second Embodiment

In First Embodiment, the circuit may include at least one configuration memory for storing configuration data. The configuration of the circuit is changed in accordance with the configuration data.

Third Embodiment

One embodiment of the present invention is a semiconductor device including a first input node, a first output node, a first transistor, a first circuit, and a dynamic logic circuit. The first circuit includes a second input node, a second output node, a first retention node, a second retention node, and second to fifth transistors. The dynamic logic circuit includes a third input node and a third output node. A first terminal of the first transistor is electrically connected to the third output node. A second terminal of the first transistor is electrically connected to the first output node. The second input node is electrically connected to the first input node. The second output node is electrically connected to the third input node. The second transistor and the third transistor are electrically connected in series between the second input node and the second output node. A gate of the second transistor is electrically connected to the first retention node. A gate of the third transistor is electrically connected to the second retention node. A first terminal of the fourth transistor is electrically connected to the first retention node. A first signal is input to a second terminal of the fourth transistor. A first terminal of the fifth transistor is electrically connected to the second retention node. A second signal is input to a second terminal of the fifth transistor. The first, fourth, and fifth transistors each include an oxide semiconductor layer where a channel is formed.

Fourth Embodiment

One embodiment of the present invention is a semiconductor device including a first input node, a first output node, a first transistor, n first circuits (n is an integer larger than one), a dynamic logic circuit, n first wirings, a second wiring, a third wiring, and n fourth wirings. The n first circuits each include a second input node, a second output node, a first retention node, a second retention node, and second to fifth transistors. The dynamic logic circuit includes a third input node and a third output node. A first terminal of the first transistor is electrically connected to the third output node. A second terminal of the first transistor is electrically connected to the first output node. In each of the n first circuits, the second transistor and the third transistor are electrically connected in series between the second input node and the second output node; a gate of the second transistor is electrically connected to the first retention node; a gate of the third transistor is electrically connected to the second retention node; a first terminal of the fourth transistor is electrically connected to the first retention node; and a first terminal of the fifth transistor is electrically connected to the second retention node. The first input node is electrically connected to the second input nodes of the n first circuits. The third input node is electrically connected to the second output nodes of the n first circuits. The n first wirings are electrically connected to gates of the fourth transistors in the respective n first circuits. The second wiring is electrically connected to second terminals of the fourth transistors in the n first circuits. The third wiring is electrically connected to gates of the fifth transistors in the n first circuits. The n fourth wirings are electrically connected to second terminals of the fifth transistors in the respective n first circuits. The first, fourth, and fifth transistors each include an oxide semiconductor layer where a channel is formed.

Fifth Embodiment

In Third Embodiment and Fourth Embodiment, the dynamic logic circuit may include a second circuit for precharging the third output node to be high level in a precharge period, and a third circuit for keeping the third output node at high level in the precharge period.

Sixth Embodiment

One embodiment of the present invention is a semiconductor device including a power supply line, a power switch, and a fourth circuit. The power switch includes a memory circuit and a sixth transistor. The memory circuit includes the semiconductor device according to any one of Third to Fifth Embodiments. The sixth transistor has a function of controlling electrical continuity between the fourth circuit and the power supply line. The sixth transistor is a p-channel transistor. A gate of the sixth transistor is electrically connected to the first output node in the memory circuit.

Seventh Embodiment

One embodiment of the present invention is a semiconductor device including a power supply line, a power switch, and a fourth circuit. The power switch includes a first memory circuit and a sixth transistor. The fourth circuit includes a second memory circuit. The second memory circuit has a function of storing data for setting a configuration of the fourth circuit. Each of the first and second memory circuits includes the semiconductor device according to any one of Embodiments 3 to 5. The sixth transistor has a function of controlling electrical continuity between the fourth circuit and the power supply line. The sixth transistor is a p-channel transistor. A gate of the sixth transistor is electrically connected to the first output node in the first memory circuit.

One embodiment of the present invention can provide a novel semiconductor device or a method for driving the semiconductor device. One embodiment of the present invention can reduce power consumption, perform stable operation in low-voltage driving, perform fine-grained power gating, increase power efficiency, achieve both low power driving and low power consumption, or perform subthreshold driving.

The description of a plurality of effects does not preclude the existence of other effects. In one embodiment of the present invention, there is no need to achieve all the effects described above. In one embodiment of the present invention, an object other than the above objects, an effect other than the above effects, and a novel feature will be apparent from the description of the specification and the drawings.

DETAILED DESCRIPTION OF THE INVENTION

Figure 1A:
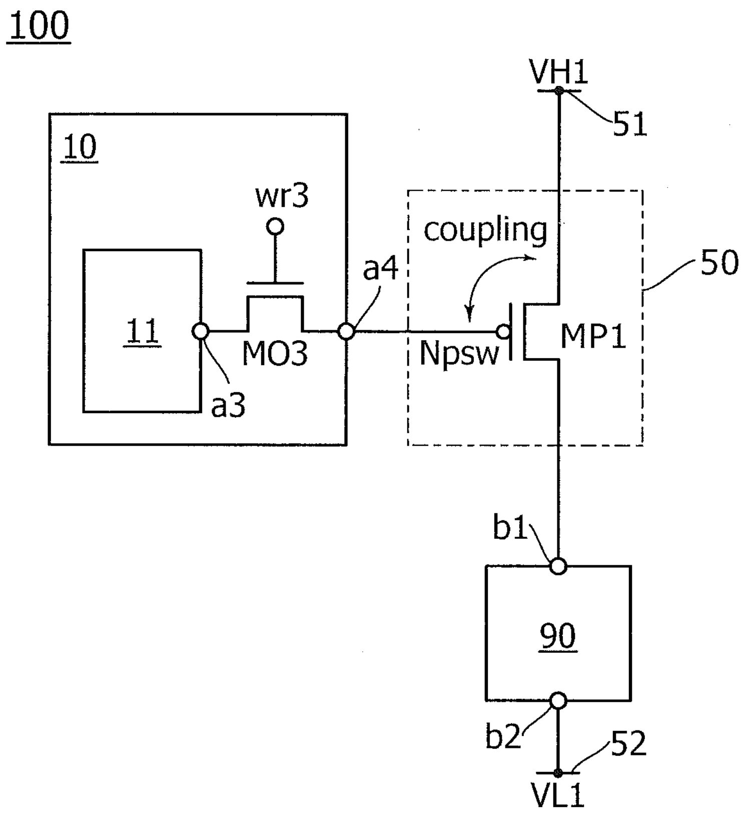
FIG. 1A is a block diagram illustrating a structure example of a semiconductor device.

Embodiments and an example of the present invention will be described below. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments and the example.

Any of the embodiments and the example described below can be combined as appropriate. When a plurality of structure examples (including a manufacturing method example, an operation method example, and the like) are shown in one embodiment or one example, any of the structure examples can be combined with each other or combined with at least one structure example shown in another embodiment or example as appropriate.

In the drawings, the same components, components having similar functions, components formed of the same material, or components formed at the same time are sometimes denoted by the same reference numerals, and description thereof is not repeated in some cases.

In this specification, a high power supply potential VDD may be simply referred to as potential VDD or VDD, for example. The same applies to other components (e.g., signal, voltage, circuit, element, electrode, and wiring).

When the same reference numerals need to be distinguished from each other, "_1", "_2", "<j>", "[i, j]", or the like is added to the reference numerals in some cases. For example, to distinguish a plurality of wirings WL from each other, the wiring WL in the second row is sometimes described as a wiring WL<2> using an address number (row number).

Embodiment 1

<<Structure Example 1 of Semiconductor Device>>

Figure 1B:
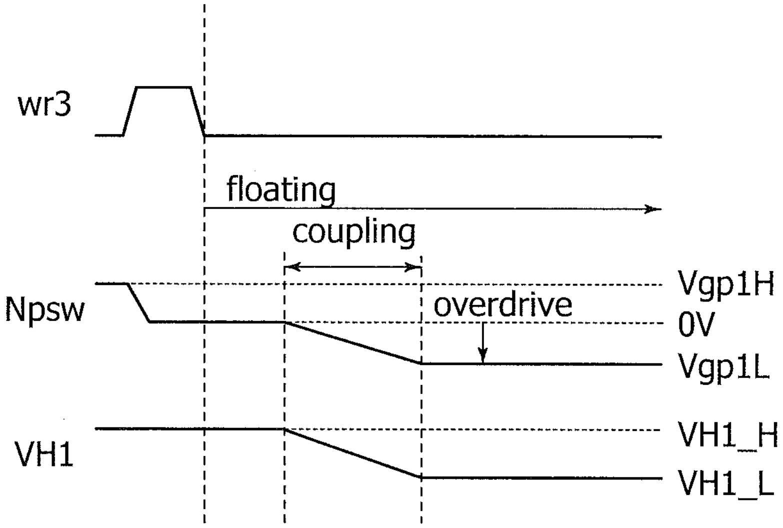
FIG. 1B is a timing chart showing an operation example of the semiconductor device.

Here, a semiconductor device capable of power gating will be described. FIG. 1A is a block diagram illustrating a structure example of a semiconductor device. FIG. 1B is a timing chart showing an operation example of the semiconductor device. A semiconductor device 100 illustrated in FIG. 1A includes a memory circuit 10, a power switch (PSW) 50, a wiring 51, a wiring 52, and a circuit 90.

The circuit 90 has a node b1 and a node b2. The node b1 is an input node for VH1 (high power supply potential), and the node b2 is an input node for VL1 (low power supply potential). The wiring 51 is a power supply line for supplying VH1 to the circuit 90. The wiring 52 is a power supply line for supplying VL1 to the circuit 90. The node b2 is electrically connected to the wiring 52. The PSW 50 has a function of interrupting VH1 supply to the circuit 90. The PSW 50 includes a transistor MP1. Here, the transistor MP1 is a p-channel transistor. The transistor MP1 has a function of controlling electrical continuity between the wiring 51 and the node b1. A gate of the transistor MP1 (a node Npsw) is electrically connected to a node a4 of the memory circuit 10. The node a4 is an output node of the memory circuit 10. The node Npsw and the wiring 51 are capacitively coupled through parasitic capacitance (e.g., gate capacitance of the transistor MP1).

The memory circuit 10 stores data for setting the potential of the node Npsw. The memory circuit 10 includes a circuit 11, a transistor MO3, and the node a4. The transistor MO3 is a pass transistor that controls electrical continuity between a node a3 and the node a4. A signal wr3 is input to a gate of the transistor MO3. The circuit 11 is configured to control the potential of a first terminal (e.g., a drain) of the transistor MO3 and has a function of storing data. The node a3 is an output node of the circuit 11. The memory circuit 10 and the PSW 50 form a programmable power switch (PPS).

<<Operation Example of Semiconductor Device>>

FIG. 1B shows waveforms of the signal wr3, the potential of the node Npsw, and the potential of the wiring 51. In FIG. 1B, the waveform represented by VH1 is the waveform of the potential of the wiring 51. In the semiconductor device 100, VH1 supplied to the circuit 90 can be changed. FIG. 1B illustrates an example where VH1 is changed from VH1_H to VH1_L. Here, VH1_L is a potential lower than VH1_H, and Vgp1H is a potential capable of turning off the transistor MP1.

The transistor MO3 is turned on by setting the signal wr3 to high level (H). The potential of the node Npsw depends on the potential of the node a3 and is assumed to become 0 V here. When the signal wr3 is set to low level (L), the transistor MO3 is turned off and the node Npsw becomes a floating node. By changing the potential (VH1) of the wiring 51 from the high potential (VH1_H) to the low potential (VH1_L), the potential of the node Npsw decreases due to capacitive coupling and becomes a negative potential Vgp1L. In other words, the transistor MP1 can be overdriven without providing a power supply circuit generating a negative potential. Since the power efficiency of a negative potential generator circuit is low, not providing such a circuit leads to a reduction in power consumption of the semiconductor device 100. Furthermore, VH1_L can be stably supplied to the circuit 90 in the semiconductor device 100; thus, the circuit 90 can operate stably even with a low power supply potential.

In the semiconductor device 100, the transistor MO3 and the parasitic capacitance of the node Npsw form a one-transistor one-capacitor (1T1C) memory circuit. In order to drive the circuit 90 stably with the low potential VH1_L, it is necessary to decrease leakage of charge from the gate of the transistor MP1 in an electrically floating state as much as possible. As a means of solving this, the use of a transistor with an ultralow off-state current as the transistor MO3 is given, for example.

An off-state current refers to a current that flows between a source and a drain of a transistor in an off state. In the case of an n-channel transistor, for example, when the threshold voltage of the transistor is approximately 0 V to 2 V, a current flowing between a source and a drain when a voltage between a gate and the source is negative can be referred to as an off-state current. An ultralow off-state current means, for example, that an off-state current per micrometer of channel width is lower than or equal to 100 zA ($100\times10^{-21}$ A; z represents zepto). Since the off-state current is preferably as low as possible, the normalized off-state current is preferably lower than or equal to 10 zA/μm or lower than or equal to 1 zA/μm, more preferably lower than or equal to 10 yA/μm ($10\times10^{-24}$ A/μm; y represents yocto).

In order to make the off-state current of the transistor extremely low, a channel of the transistor is formed in a semiconductor with a wide bandgap, for example, a semiconductor with a bandgap of greater than or equal to 3.0 eV. An example of such a semiconductor is an oxide semiconductor containing metal oxide. A transistor with an oxide semiconductor layer in which a channel is formed (OS transistor) has a low leakage current due to thermal excitation and an ultralow off-state current.

An oxide semiconductor for an OS transistor preferably contains at least one of indium (In) and zinc (Zn). Typical examples of the oxide semiconductor for an OS transistor include In—Ga—Zn oxide and In—Sn—Zn oxide. By reducing impurities serving as electron donors, such as moisture or hydrogen, and also reducing oxygen vacancies, an i-type (intrinsic) or a substantially i-type oxide semiconductor can be obtained. Here, such an oxide semiconductor can be referred to as a highly purified oxide semiconductor. A channel formed in a highly purified oxide semiconductor enables the off-state current normalized by channel width of an OS transistor to be as low as several yoctoamperes per micrometer to several zeptoamperes per micrometer. An OS transistor and an oxide semiconductor will be described in detail in Embodiments 2 and 3.

Figure 2A:
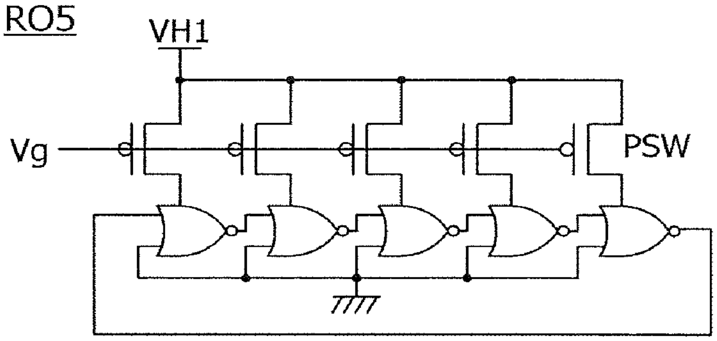
FIG. 2A is a circuit diagram of a ring oscillator (RO5)
Figure 2B:
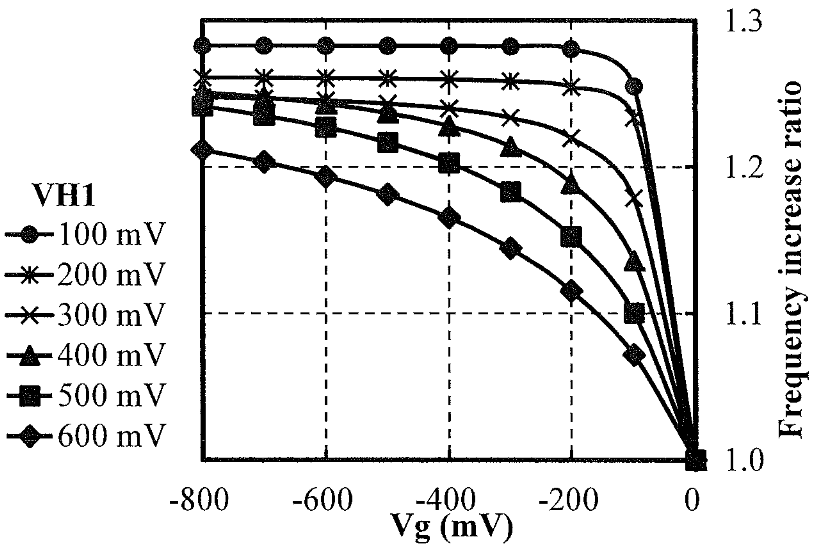
FIG. 2B shows the results of calculating operation of RO5.

The operation of the PPS in this embodiment was confirmed by calculation. A five-stage ring oscillator (RO5) was assumed as a semiconductor device, and Vg dependence of the oscillation frequency ratio was calculated by SPICE simulation. FIG. 2A is a circuit diagram of RO5. FIG. 2B shows the calculation results. RO5 includes a five-stage NOR circuit. Each NOR is provided with a power switch composed of a p-channel transistor. Note that Vg is the gate potential of the p-channel transistor.

The oscillation frequency of RO5 when VH1 is varied from 100 mV to 600 mV (in increments of 100 mV) and Vg is varied from −800 mV to 0 mV (in increments of 100 mV) at varying VH1 was calculated to obtain an oscillation frequency ratio with the oscillation frequency at Vg of 0 mV as a reference. As shown in FIG. 2B, application of a slight negative potential to the gate of the power switch can significantly improve RO5 operating performance in low-voltage driving.

<<Circuit Structure Examples>>

Figure 3:
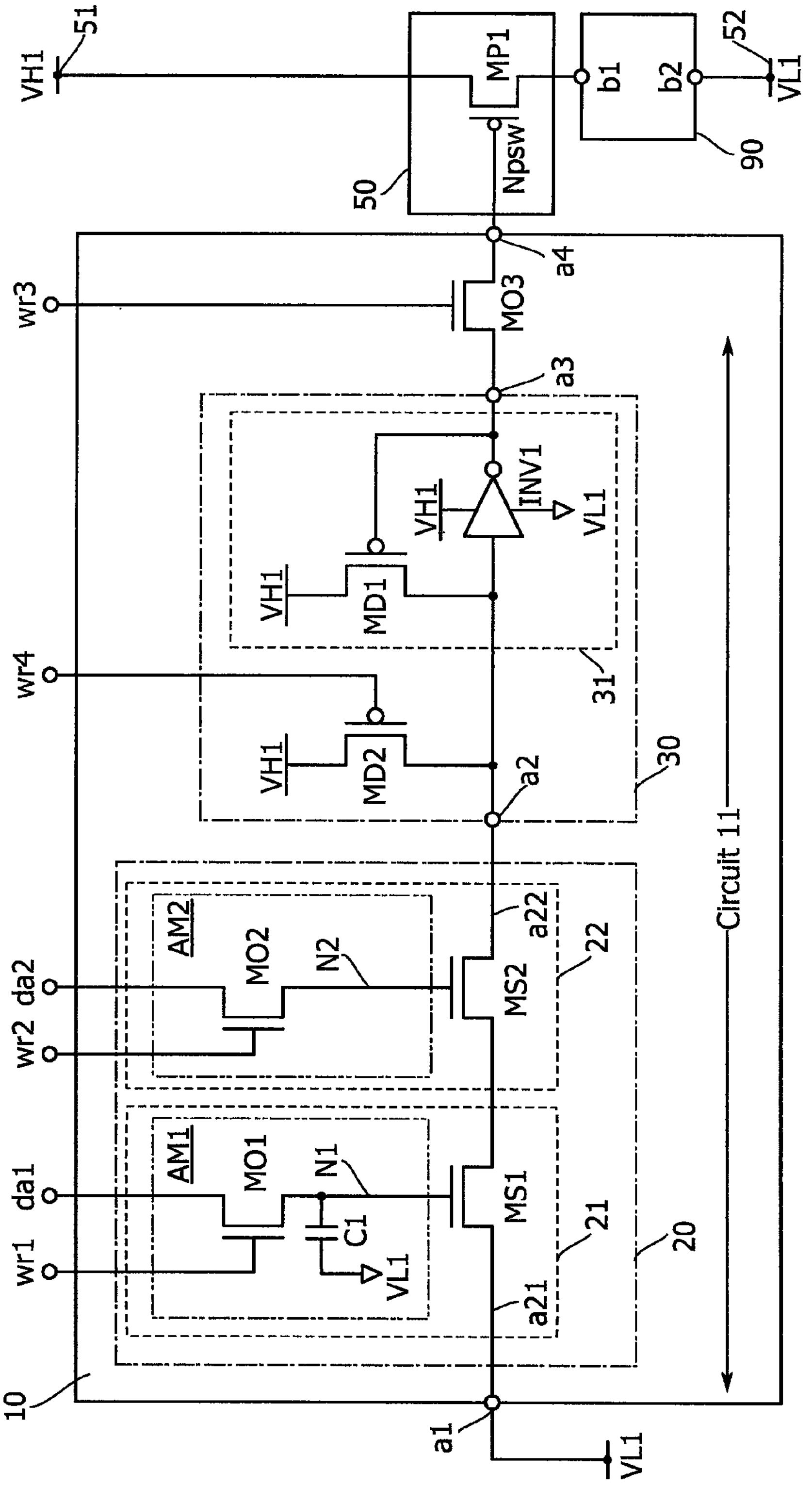
FIG. 3 is a circuit diagram illustrating a structure example of a semiconductor device.

A specific structure of the semiconductor device 100 will be described below. FIG. 3 is a circuit diagram illustrating a structure example of the semiconductor device 100. The memory circuit 10 includes the node a1, the node a4, the circuit 11, and the transistor MO3. An input node of the memory circuit 10 is the node a1 and an output node thereof is the node a4. For example, VL1 is input to the node a1 in order to keep the logic of the node a1 at "L". VL1 can be 0 V or a ground potential (GND).

The circuit 11 in FIG. 3 includes a circuit 20, a circuit 30, the node a2, and the node a3. VH1 and VL1 are input to the circuit 11. An input node of the circuit 30 is the node a2 and an output node thereof is the node a3.

<<Circuit 20>>

The circuit 20 includes a circuit 21, a circuit 22, a node a21, and a node a22. The node a21 is an input node of the circuit 20 and is electrically connected to the node a1. The node a22 is an output node of the circuit 20 and is electrically connected to the node a2. The circuit 21 includes a transistor MS1 and a circuit AM1. The circuit 22 includes a transistor MS2 and a circuit AM2. The transistor MS1 and the transistor MS2 are electrically connected in series between the node a21 and the node a22. Each of the transistors MS1 and MS2 is a pass transistor that controls electrical continuity between the node a21 and the node a22. The circuit AM1 is electrically connected to a gate of the transistor MS1. The circuit AM2 is electrically connected to a gate of the transistor MS2.

<Circuit AM1>

The circuit AM1 stores data that sets whether the transistor MS1 is turned on or off. A signal da1 is a data signal for setting the on/off state of the transistor MS1. The circuit AM1 includes a node N1, a transistor MO1, and a capacitor C1 and is a 1T1C memory circuit. The circuit AM1 is capable of retaining an analog potential and thus can also be referred to as analog memory. The node N1 is a retention node and is electrically connected to the gate of the transistor MS1. The capacitor C1 is a storage capacitor for holding charge of the node N1. One terminal of the capacitor C1 is supplied with VL1, and the other terminal thereof is electrically connected to the node N1. The transistor MO1 is a pass transistor for controlling electrical continuity between the node N1 and a node to which the signal da1 is input. A signal wr1 is input to a gate of the transistor MO1.

<Circuit AM2>

The circuit AM2 stores data that sets whether the transistor MS2 is turned on or off, and includes a node N2 and a transistor MO2. A signal da2 is a data signal for setting the on/off state of the transistor MS2. The node N2 is a retention node and is electrically connected to the gate of the transistor MS2. The transistor MO2 is a pass transistor capable of controlling electrical continuity between the node N2 and a node to which the signal da2 is input. A signal wr2 is input to a gate of the transistor MO2.

The circuit AM2 is a 1T1C memory circuit like the circuit AM1 and can retain an analog potential, and thus can be referred to as analog memory. In the circuit AM2, the storage capacitance of the node N2 serves as parasitic capacitance of the node N2 (e.g., gate capacitance of the pass transistor MS2). As in the circuit AM1, a capacitor connected to the node N2 may be intentionally provided in the circuit AM2. The reduction in storage capacitance of the node N2 leads to a shorter retention time but can increase the writing speed of the circuit AM2. Note that it is possible not to provide the capacitor C1 in the circuit AM1.

(Transistors MO1 and MO2)

Turning off the transistor MO1 makes the node N1 electrically floating and the circuit AM1 in a retention state. Similarly, turning off the transistor MO2 makes the node N2 electrically floating and the circuit AM2 in a retention state. Accordingly, to extend a retention period of the circuits AM1 and AM2, the transistors MO1 and MO2 are preferably transistors with an ultralow off-state current. That is, like the transistor MO3, the transistors MO1 and MO2 are OS transistors, for example.

(Retention Time)

Long-term data retention, for example, 10-year data retention at 85° C. achievable by using an OS transistor as a write transistor will be described, with the circuit AM2 as an example.

The memory capacity of the circuit AM2 is assumed to be one bit. Under conditions where the power supply potential ranges from 2 V to 3.5 V, the storage capacitance of the node N2 is 21 fF, and the allowable variation of a retained potential is less than 0.5 mV, a leakage current from the node N2 needs to be less than $33\times10^{-24}$ A to keep a variation of a retained potential within the allowable range at 85° C. for ten years. When a leakage from other portions is extremely small and the transistor MO2 contributes to almost all the leakage, given that the transistor MO2 has a channel width of 350 nm, the leakage current of the transistor MO2 per channel width is preferably less than $93\times10^{-24}$ A/μm. This means that the circuit AM2 can retain data at 85° C. for ten years when the transistor MO2 is an OS transistor.

Note that in a memory circuit using the off-state current characteristics of an OS transistor (e.g., the circuit AM1), a predetermined potential continues to be supplied to the OS transistor in a retention period in some cases. For example, a potential that turns off the OS transistor completely may continue to be supplied to a gate of the OS transistor. Alternatively, a potential that sets the OS transistor in a normally-off state may continue to be supplied to a backgate of the OS transistor. In such cases, voltage continues to be supplied to the memory circuit in a retention period; however, almost no current flows and thus little power is consumed. Because of little power consumption, even if a predetermined voltage is supplied to the memory circuit, the memory circuit including the OS transistor can be regarded as being substantially nonvolatile.

<Circuit 30>

The circuit 30 has a function of precharging the node a2 to "H" and a function of keeping the logic of the node a2 at "H". The circuit 30 includes a transistor MD2, a circuit 31, the node a2, and the node a3.

The transistor MD2 is a pass transistor for establishing electrical continuity between the node a2 and a node supplied with VH1. A signal wr4 is input to a gate of the transistor MD2. By turning on the transistor MD2, the node a2 can be precharged to be H level. The transistor MD2 can thus be referred to as a precharge circuit.

The circuit 31 includes a transistor MD1 and an inverter INV1. The circuit 31 has a function of keeping the logic of the node a2 at "H" and is sometimes referred to as a keeper circuit. The circuit 31 is provided as necessary. The transistor MD1 has a source supplied with VH1, a drain electrically connected to the node a2, and a gate electrically connected to an output node of INV1. An input node of INV1 is electrically connected to the node a2, and the output node thereof is electrically connected to the node a3. VH1 and VL1 are input to INV1. By the circuit 31, the inverted logic of the node a2 is written to the node a3.

In the circuit 31, when the transistor MD1 is turned on, the node a2 is made electrically connected to a wiring that supplies VH1. Accordingly, the transistor MD2 is turned on in a precharge period, so that the logic of the node a2 is kept at "H" and the logic of the node a3 is kept at "L" by the circuit 31.

The circuit 30 can be referred to as a dynamic logic circuit. A period during which the transistor MD2 is on is a precharge period, in which the node a2 is charged to VH1. A period during which the transistor MD2 is off is a verification period, in which the logic of the node a3 is determined in accordance with the on/off states of the transistors MS1 and MS2. That is, the logic of the node a3 is determined in accordance with the logics of the nodes N and N2. In the verification period, the logic of the node a3 is kept at "L" when at least one of the transistors MS1 and MS2 is off, and the logic of the node a3 is changed from "L" to "H" when the transistors MS1 and MS2 are on. In other words, the memory circuit 10 has a function of outputting a potential that depends on data stored in the circuits AM1 and AM2, from the node a3.

An operation example of the semiconductor device 100 will be described below with reference to FIGS. 4A and 4B. In the following description, rewriting data in a circuit that stores configuration data is referred to as configuration or configuration operation, and a mode for implementing configuration operation is referred to as a configuration mode.

<<Operation Example of Semiconductor Device 100>>

Figure 4B:
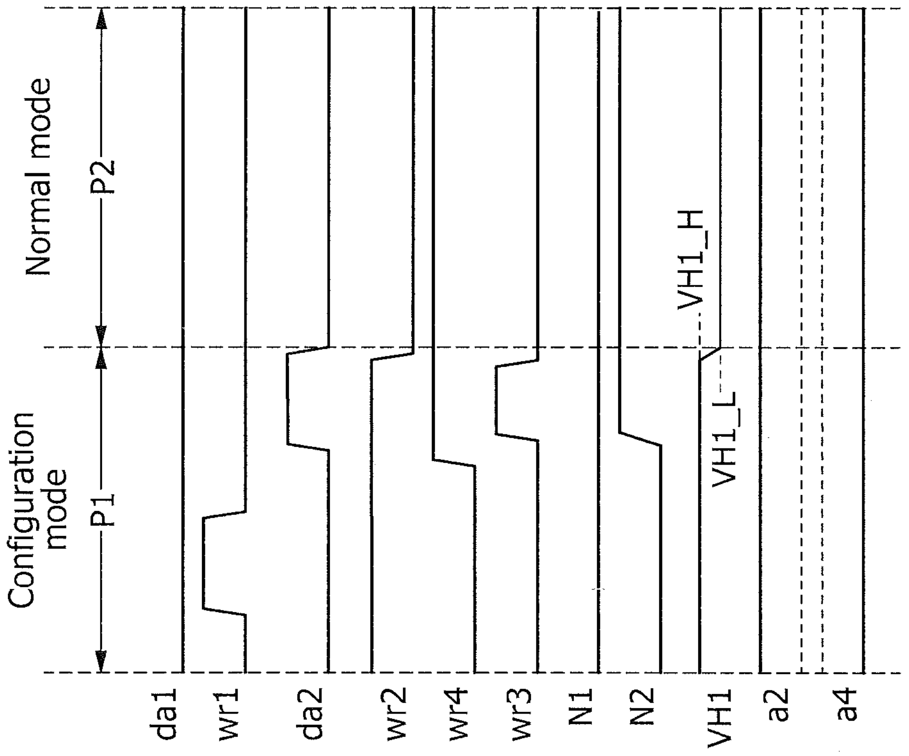
FIGS. 4A and 4B are timing charts each illustrating an operation example of a semiconductor device.
Figure 4A:
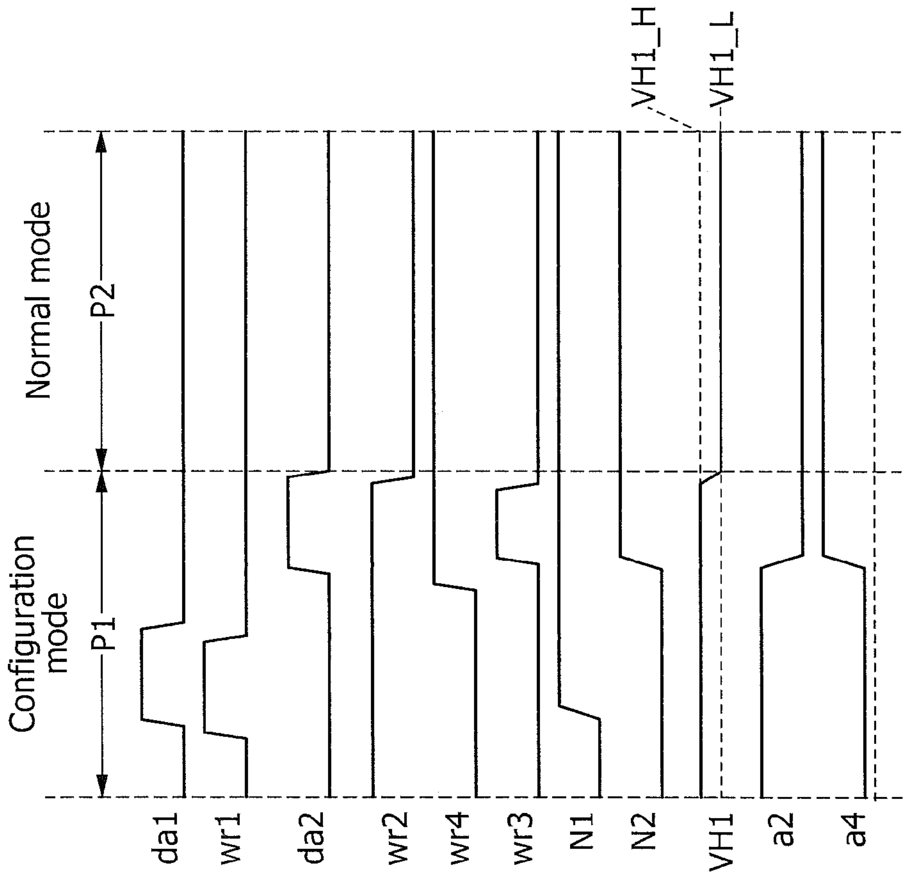

FIGS. 4A and 4B are timing charts illustrating an operation example of the semiconductor device 100. FIG. 4A shows an example of writing "H" to the circuit AM1, and FIG. 4B shows an example of writing "L" to the circuit AM1.

The semiconductor device 100 is in a configuration mode in a period P1 and in a normal mode (where normal operation is performed) in a period P2. In the period P1, VH1 is set to VH1_H to precharge the node a2. In the period P2, VH1 is set to VH1_L, which is lower than VH1_H, to drive the circuit 90 with low voltage.

In the period P1, data is written to the circuits AM1 and AM2. In the period P1, the signal wr2 is set to H level so that the transistor MO2 is turned on. The signal wr3 is set to L level so that the transistor MO3 is turned off. Moreover, the signal wr4 is set to L level so that the transistor MD2 is turned on, whereby the node a2 is precharged to be H level.

Data is written to the circuit AM1. The signal wr1 is set to H level so that the transistor MO1 is turned on, whereby the signal da1 is written to the node N1. The node N1 is set to "H" in the example of FIG. 4A, and set to "L" in the example of FIG. 4B. Then, the signal wr1 is set to L level so that the transistor MO1 is turned off. The node N1 becomes a floating node; thus, charge of the node N1 is retained and the circuit AM1 is brought into a retention state.

Next, "H" is written to the circuit AM2. First, the signal wr4 is set to H level so that the transistor MD2 is turned off. Subsequently, the signal da2 is set to H level, whereby the node N2 is changed from "L" to "H". Accordingly, in the example of FIG. 4A, both the transistors MS1 and MS2 are turned on, and electrical continuity between the node a2 and the node a1 is established. As a result, the node a2 becomes "L" owing to VL1 supplied to the node a1. On the other hand, in the example of FIG. 4B, the transistor MS2 is turned on because the node N2 is changed from "L" to "H", whereas the transistor MS1 is off because the node N1 is at L level. Thus, electrical continuity is not established between the node a2 and the node a1, so that the logic of the node a2 is kept at "H" and the logic of the node a3 is kept at "L" by the circuit 31. In order to make the circuit AM2 in a retention state, the signal wr2 is set to L level so that the transistor M02 is turned off, and then the signal da2 is set to L level. The configuration operation is thus completed.

In the write operation to the circuit AM2, after the transistor M02 is turned on, the signal wr3 is set to H level so that the transistor MO3 is turned on. Electrical continuity between the node a4 and the node a3 is established accordingly. In the example of FIG. 4A, the node a4 becomes "H" because the node a2 is at "L". In the example of FIG. 4B, the node a4 is kept at "L". Subsequently, the node a4 becomes a floating node when the signal wr3 is set to L level to turn off the transistor MO3; thus, the potential of the node a4, that is, the gate potential of the transistor MP1 is retained by a memory circuit composed of the gate parasitic capacitance of the transistor MP1 and the transistor MO1.

In the period P2, the PSW 50 is driven with the potential of the node a4, which is set in the period P1. In the example of FIG. 4A, the transistor MP1 is turned off, so that the circuit 90 is power gated and supply of VH1 is interrupted. Meanwhile, in the example of FIG. 4B, the transistor MP1 is turned on. By decreasing VH1 from VH1_H to VH1_L, the transistor MP1 is overdriven in the above manner. The circuit 90 is supplied with VH1_L and performs normal operation.

In other words, power gating with fine time granularity is achieved by controlling the PSW 50 by the memory circuit 10. Moreover, when the semiconductor device 100 includes a plurality of circuits 90, providing the memory circuit 10 and the PSW 50 in each of the circuits 90 enables power gating with fine spatial granularity. Consequently, power consumption of the semiconductor device 100 can be effectively decreased. Since the circuit AM1, the circuit AM2, and the transistor MO3 need not be driven in the period P2, a driver circuit that supplies signals to them is not required to operate. Accordingly, the driver circuit is configured to undergo power gating and power management is performed such that power supply to the driver circuit is interrupted in the period P2. As a result, power consumption of the semiconductor device 100 can be further decreased.

<Variations of Memory Circuit 10>

Figure 5A:
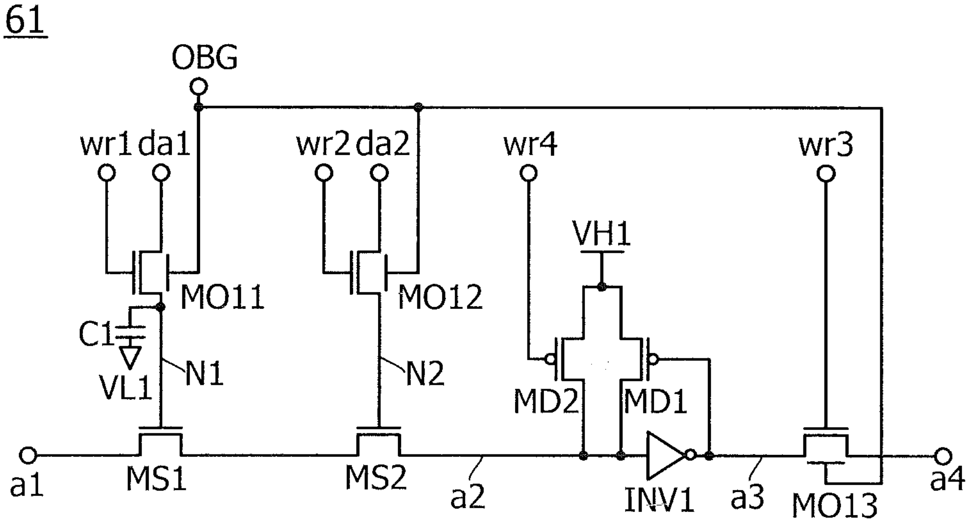
FIGS. 5A and 5B are circuit diagrams each illustrating a structure example of a memory circuit.
Figure 5B:
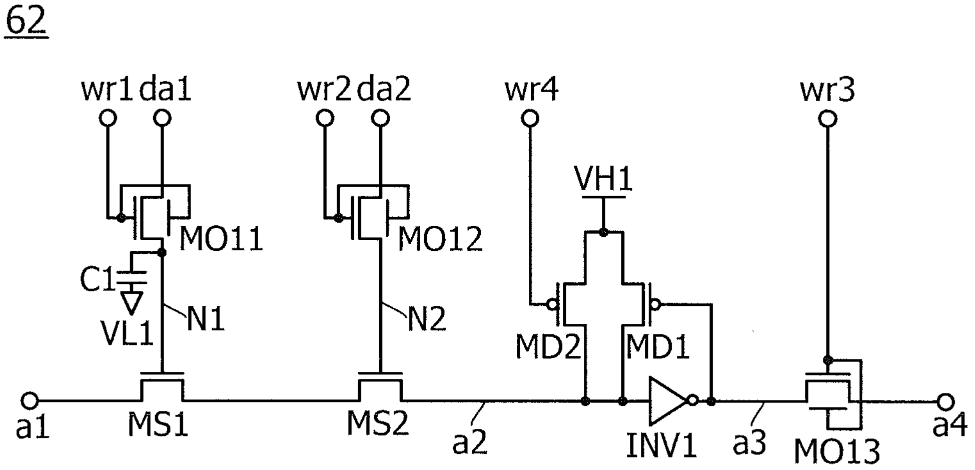

FIGS. 5A and 5B show variation examples of the memory circuit 10. A memory circuit 61 (FIG. 5A) and a memory circuit 62 (FIG. 5B) differ from the memory circuit 10 in including transistors MO1 to MO13 with a backgate.

In the memory circuit 61, the backgates of the transistors MO11 to MO13 are electrically connected to a node OBG. The threshold voltages of the transistors MO11 to MO13 can be controlled with the potential of the node OBG. When a charge trap layer is provided in an insulating layer between the backgates and channel formation regions of the transistors MO11 to MO13, a step of injecting charge to the charge trap layers of the transistors MO11 to MO13 by using the node OBG can be performed in fabricating the memory circuit 61. When the memory circuit 61 fabricated through this step is actually used, the memory circuit 61 may operate without controlling the potential of the node OBG while the backgates of the transistors MO11 to MO13 are made electrically floating.

In the memory circuit 62, the backgates of the transistors MO11 to MO13 are electrically connected to the gates of the respective transistors. Such a device structure can improve the on-state current characteristics of the transistors MO11 to MO13. The backgate of the transistor MO11 may be electrically connected to a source or a drain thereof. The same applies to the transistors MO12 and MO13.

In the memory circuits 61 and 62, it is possible not to provide the transistor MO11 with the backgate. When the transistor MO11 has the backgate, the backgate may be electrically connected to any of the terminal OBG and the gate, source, and drain of the transistor MO11. The same applies to the transistors MO12 and MO13.

The memory circuit 10 can be used as a memory circuit for retaining data that is to be processed by a combinational circuit, such as a look-up table or a multiplexer, and can be used in a variety of semiconductor devices. For example, the memory circuit 10 can be used for configuration memory that stores configuration data for a programmable logic device (PLD).

A PLD includes a programmable routing switch (PRS) for controlling electrical continuity between one programmable logic element (PLE, also referred to as logic block) and another PLE. The PLE includes a combinational circuit such as a look-up table (LUT) and a multiplexer, for example.

The structure of a PLD can be changed by changing connection states of routing switches and structures of PLEs. The function of the PLD can be changed by change in logic that is processed by the PLEs. Data for setting the connection state or logic is referred to as configuration data, and a memory circuit for storing configuration data is referred to as configuration memory. Storing of configuration data in the configuration memory is referred to as configuration. In particular, rewrite (refresh) of configuration data stored in the configuration memory is sometimes referred to as reconfiguration. The PLD can be set to have a structure suitable for a user's request by producing (programming) desired configuration data and performing the configuration.

Figure 6:
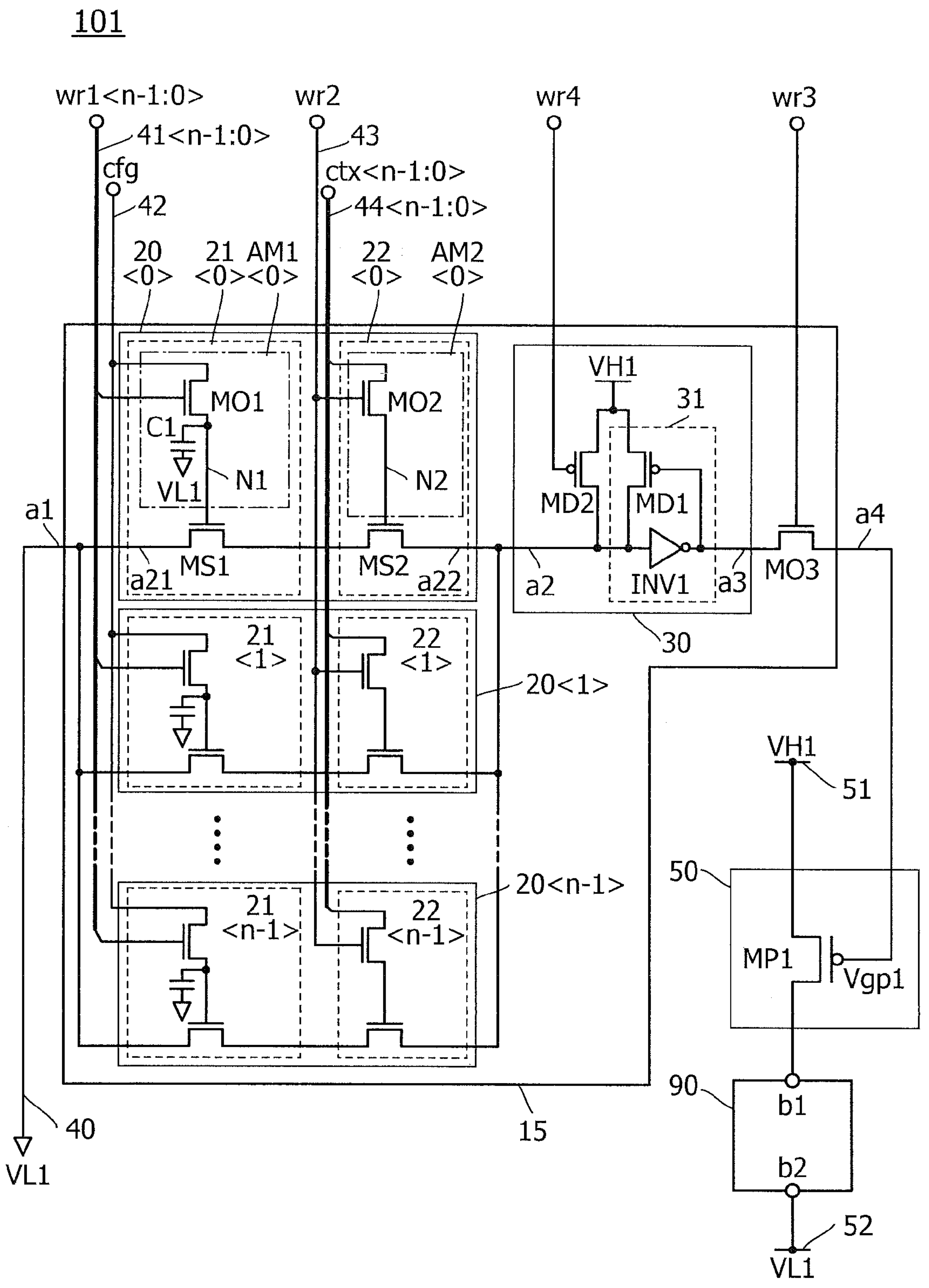
FIG. 6 is a circuit diagram illustrating a structure example of a semiconductor device.

A multi-context PLD (MC-PLD) includes a configuration memory capable of storing sets of configuration data. The structure of the MC-PLD can be changed quickly only by switching the sets of configuration data to be loaded. Furthermore, the MC-PLD can perform dynamic configuration, in which a set of configuration data that are not selected can be rewritten during execution of processing. For example, the use of the memory circuit 10 makes it possible to obtain a PPS, a PRS, a configuration memory, and the like that conform to multi-context. FIG. 6 illustrates an example of a semiconductor device including a PPS conformable to multi-context.

<<Structure Example 2 of Semiconductor Device>>

A semiconductor device 101 illustrated in FIG. 6 includes a memory circuit 15, the PSW 50, a wiring 51, a wiring 52, and the circuit 90. The memory circuit 15 is a variation example of the memory circuit 10 and includes n circuits 20 (20<n−1:0>; n is an integer larger than 1), a circuit 30, a wiring 40, n wirings 41 (41<n−1:0>), a wiring 42, a wiring 43, and n wirings 44 (44<n−1:0>). The operation and functions of the circuit 20, the circuit 30, and the PSW 50 in the semiconductor device 101 are similar to those in the semiconductor device 100.

The node a1 is electrically connected to the wiring 40. The wiring 40 has a function of supplying VL1. The node a21 and the node a22 in each of the circuits 20<n−1:0> are electrically connected to the node a1 and the node a2, respectively. That is, the circuits 20<n−1:0> are electrically connected in parallel between the node a1 and the node a2.

Circuits 21<n−1:0> electrically connected in parallel serve as configuration memory that can store n configuration data. A signal cfg can function as a configuration data signal. The wirings 41<n−1:0> are electrically connected to gates of respective transistors MO<n−1:0> and supplied with respective signals wr1<n−1:0>. The wiring 42 is supplied with the signal cfg and electrically connected to first terminals of the transistors MO1<n−1:0>.

Circuits 22<n−1:0> select one circuit 21<j (j is an integer of 0 to (n−1)) for outputting configuration data, among the circuits 21<n−1:0>. The circuits 22<n−1:0> serve as selectors for selecting contexts. Accordingly, the circuits 22<n−1:0> are not provided when a context function is not needed. The wiring 43 is supplied with the signal wr2 and electrically connected to gates of transistors MO2<n−1:0>. The wirings 44<n−1:0> are supplied with respective signals ctx<n−1:0> and electrically connected to first terminals of the respective transistors MO2<n−1:0>. The signals ctx<n−1:0> are context data signals and can be referred to as control signals for controlling the selectors composed of the circuits 22<n−1:0>.

When context data in which the signal ctx<j> among the signals ctx<n−1:0> is "H" is written to the memory circuit 15, a transistor MS2<j> in a circuit AM2<j> at an address j (in the j-th row) is turned on, and logic that depends on configuration data stored in a circuit AM1<j> is output from a node a22<j>. This series of operations can be hereinafter referred to as selecting context<j>.

<<Operation Example>>

Figure 7:
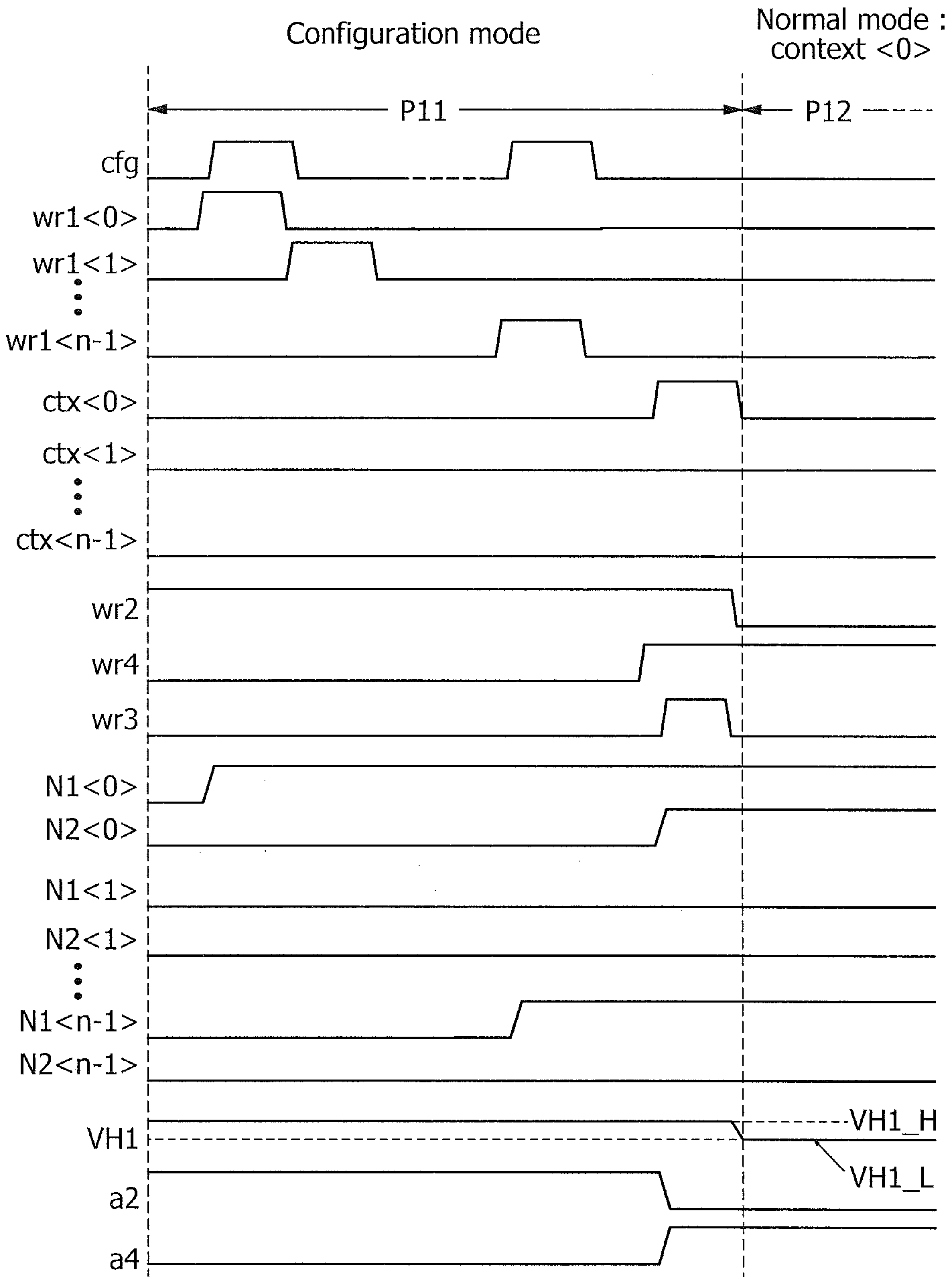
FIG. 7 is a timing chart showing an operation example of a semiconductor device.
Figure 8:
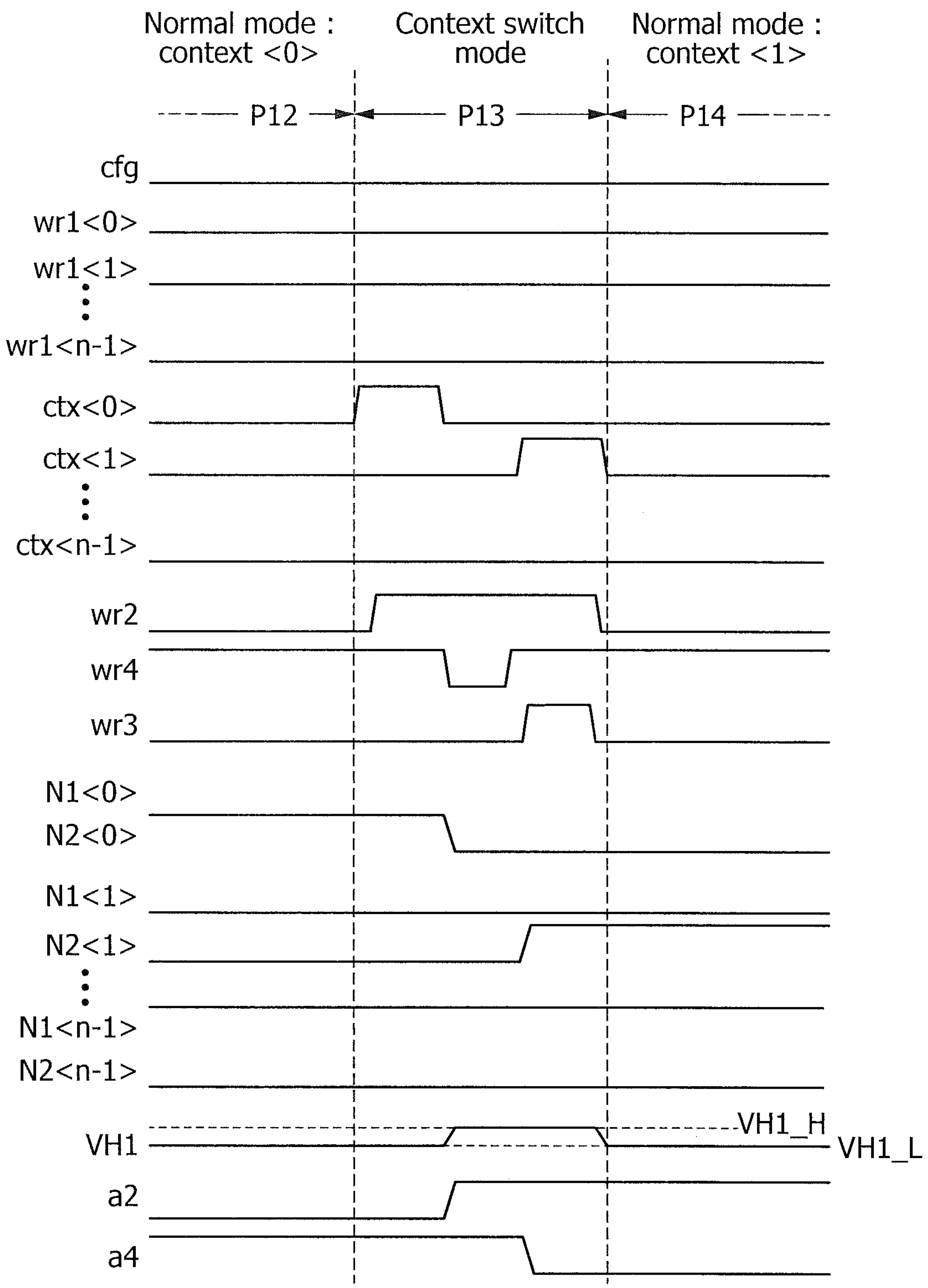
FIG. 8 is a timing chart showing an operation example of a semiconductor device.

FIG. 7 and FIG. 8 show an example of the operation of the semiconductor device 101. The semiconductor device 101 operates in a manner similar to that of the semiconductor device 100 and accordingly, the following description focuses on its differences with the semiconductor device 100.

<Configuration Mode>

In a period P11, the semiconductor device 101 is in the configuration mode. The operation of the semiconductor device 101 in the period P11 is similar to the configuration operation of the semiconductor device 100. VH1 is VH1_H. First, configuration data are sequentially written to the circuits AML<n−1:0>. The potentials of nodes N1<n−1:0> correspond to the potential level of the signal cfg.

Next, with the signals ctx<n−1:0>, "H" is written to one of the circuits AM2<n−1:0> and "L" is written to the other circuits AM2. In the example of FIG. 7, "H" is written to the circuit AM2<0>. A node N2<0> becomes H level and nodes N2<n−1:1> are L level.

When the signal wr3 is set to H level, the inverted logic of the node a2 is written to the node a4, whereby the node a4 becomes "H". When the signal wr3 is set to L level, the node a4 becomes floating and the logic thereof is maintained.

<Normal Mode>

In a period P12, the semiconductor device 101 is in the normal mode, and context<0> is selected. The operation of the semiconductor device 101 in the period P12 is similar to that of the semiconductor device 100 in the normal mode. VH1 is changed from VH1_H to VH1_L. Since the node a4 is at "H", the circuit 90 is power gated and supply of VH1 is interrupted by the PSW 50.

<Context Switching Mode>

In a period P13, the semiconductor device 101 is in the context switching mode. The data retained in the circuit AM2<0> is rewritten to be "L", and "H" is written to one of the circuits AM2<n−1:0>. Here, "H" is written to the circuit AM2<1>.

First, the signals ctx<n−1:0> having the same logic levels as those in the period P11 are input. Then, the signal wr2 is set to "H" so that the transistors MO2<n−1:0> are turned on, and the signals ctx<n−1:0> are written to the respective circuits AM2<n−1:0>.

Next, VH1 is set to the high potential VH1_H to update the circuits AM2<n−1:0>. The transistor MD2 is turned on by setting the signal wr4 to L level. The node a2 is precharged and becomes "H". The transistor MO3 is off and thus the node a4 is kept at "H". Then, the signals ctx<n−1:0> are set to L level, so that "L" is written to the circuits AM2<n−1:0> and transistors MS2<n−1:0> are turned off. As a result, a shoot-through current can be prevented from flowing between the node a1 and the node a2.

Next, the signal wr4 is set to H level so that the transistor MD2 is turned off. The signal ctx<1> is set to H level and the other signals ctx are set to L level, whereby "H" is written to the node N2<1> and "L" is written to the other nodes N2. The node a2 remains at "H" because the node N1<1> is at "L" although the transistor MO2<1> is on. The node a4 remains at "H" because the transistor MO3 is off.

In a period during which the signals ctx<n−1:0> are written to the respective circuits AM2<n−1:0>, the signal wr3 is set to H level so that the transistor MO3 is turned on. Thus, the inverted logic of the node a2 is written to the node a4, and the node a4 becomes "L". The transistor MO3 is turned off by setting the signal wr3 to L level, whereby the potential of the node a4 is maintained.

<Normal Mode>

In a period P14, the semiconductor device 101 is in the normal mode, and context<1> is selected. Since the transistor MP1 is on, the circuit 90 is supplied with VH1_L and performs normal operation.

As described above, power gating with fine time granularity and fine spatial granularity can be executed in the semiconductor device 101 as in the semiconductor device 100; thus, power consumption can be decreased. Since the semiconductor devices 100 and 101 are circuits based on pass transistors, they can retain data with a smaller number of elements than those of SRAM. Thus, the size of a semiconductor device including the semiconductor device 100 or 101 can be small, and the power consumption thereof can be reduced. Furthermore, in order for SRAM to retain 1-bit data, complementary data needs to be written in a memory cell; however, the semiconductor devices 100 and 101 do not need such operation. Accordingly, in the semiconductor devices 100 and 101, the circuit for driving the circuits AM1 and AM2 and the transistor MO3 can be simplified.

<<Structure Example of Switch Circuit>>

The memory circuit 15 illustrated in FIG. 6 can constitute a programmable switch circuit. Structure examples of such a switch circuit are shown in FIG. 9 and FIG. 10.

Figure 9:
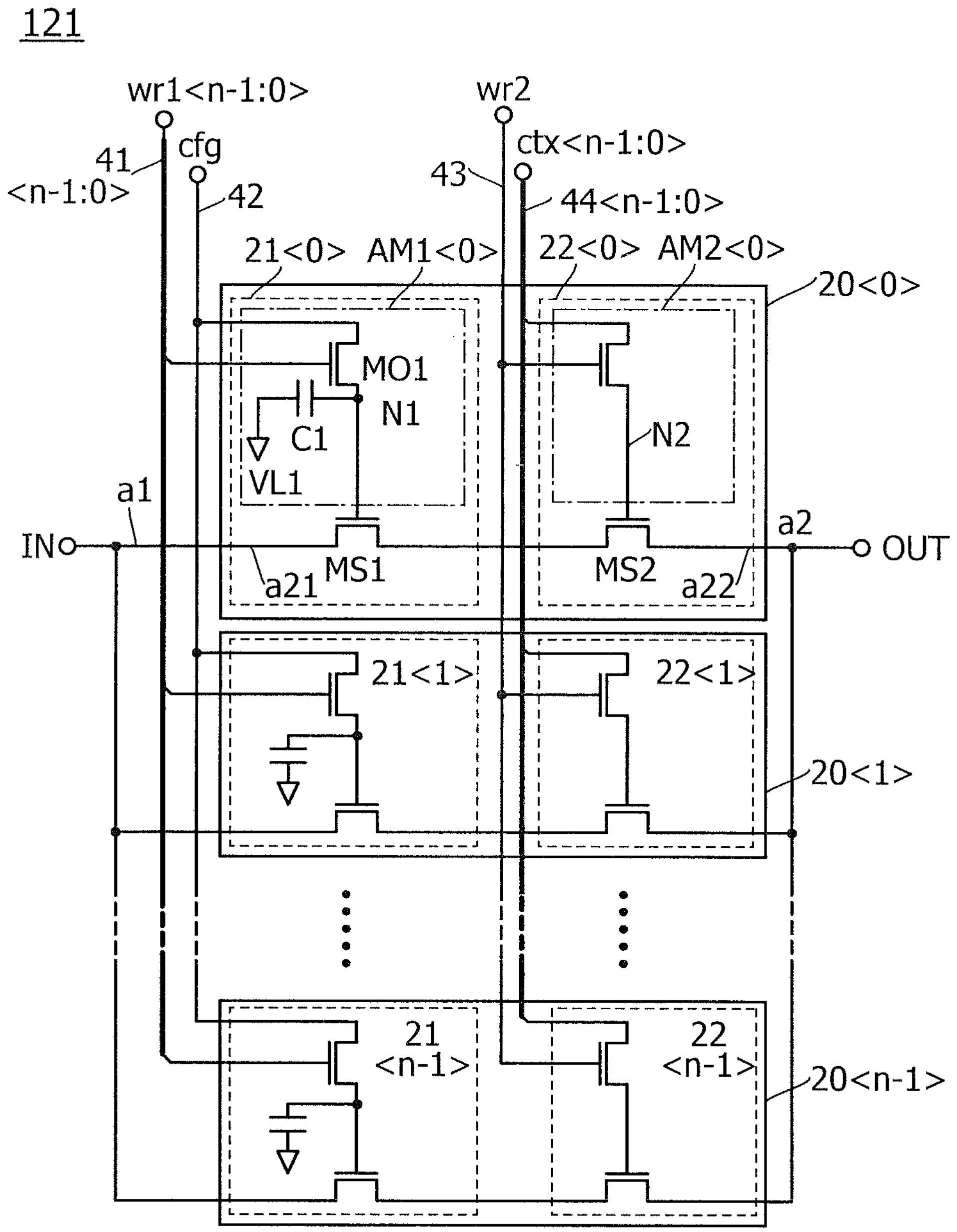
FIG. 9 is a circuit diagram illustrating a structure example of a switch circuit.

A switch circuit 121 illustrated in FIG. 9 includes n circuits 20 (20<n−1:0>). The switch circuit 121 corresponds to a circuit in which the circuit 30 and the transistor MO3 are omitted from the memory circuit 15, and is a switch circuit conformable to multi-context. "H" is written to the circuit AM2 in one of the circuits 20<n−1:0>, for example, to the circuit AM2<k>, thereby turning on the transistor MS2<k>. A connection state between the input node and the output node depends on the on/off state of the transistor MS1<k>. The on/off state of the transistor MS1<k> is determined by configuration data retained in the circuit AM1<k>. Note that k is an integer of 0 or more and n−1 or less.

When context switching is not to be performed, the switch circuit 121 is composed of one circuit 21.

Figure 10:
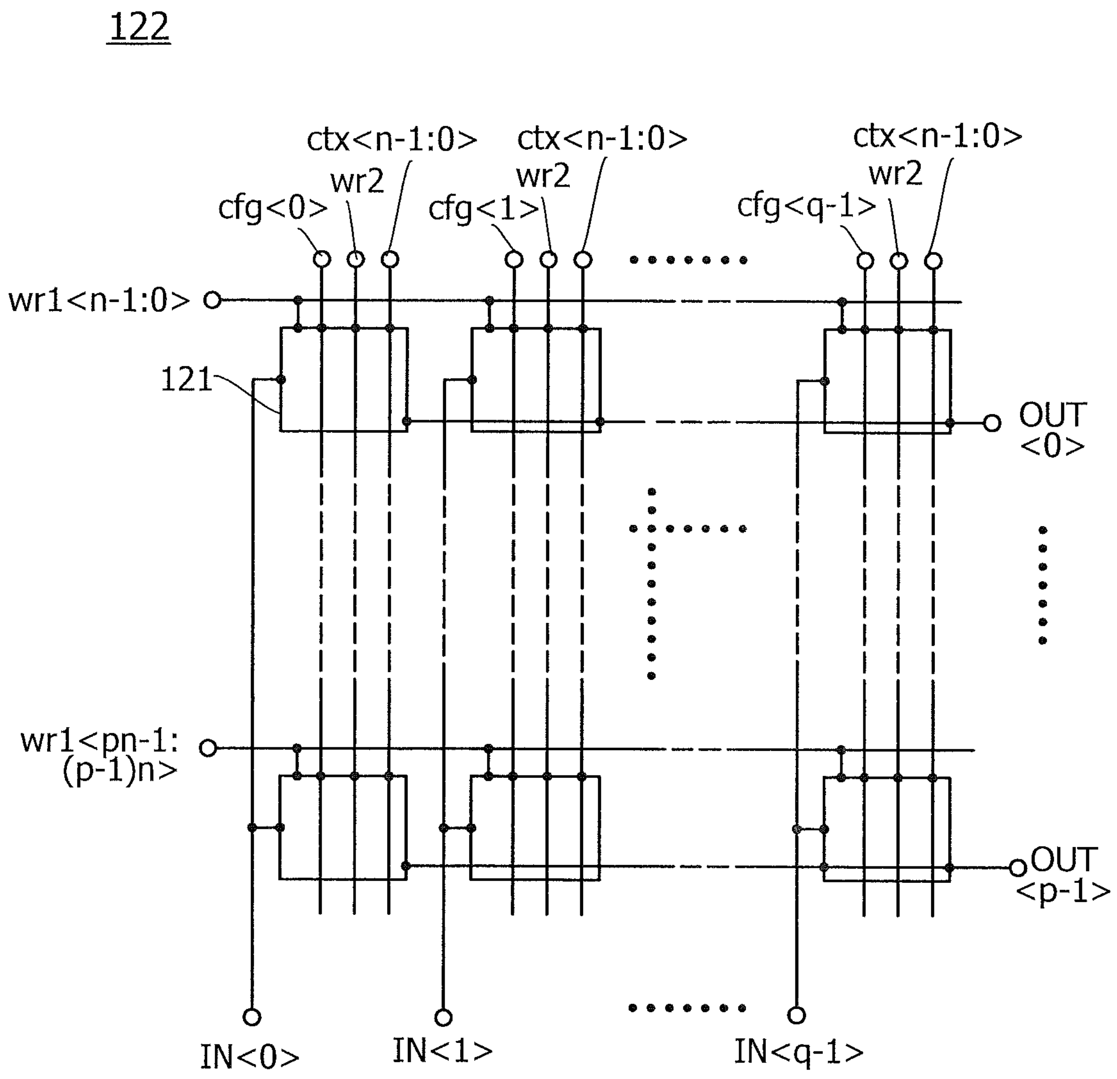
FIG. 10 is a block diagram illustrating a structure example of a switch circuit.

A switch circuit 122 illustrated in FIG. 10 includes a plurality of switch circuits 121. The switch circuits 121 are arranged in an array of p rows and q columns (p and q are each an integer greater than 1). Electrical continuity between an input node IN<j> and output nodes OUT<p−1:0> is set by configuration data retained in p switch circuits 121 of the j-th column.

<<PLD Structure Example>>

Figure 11:
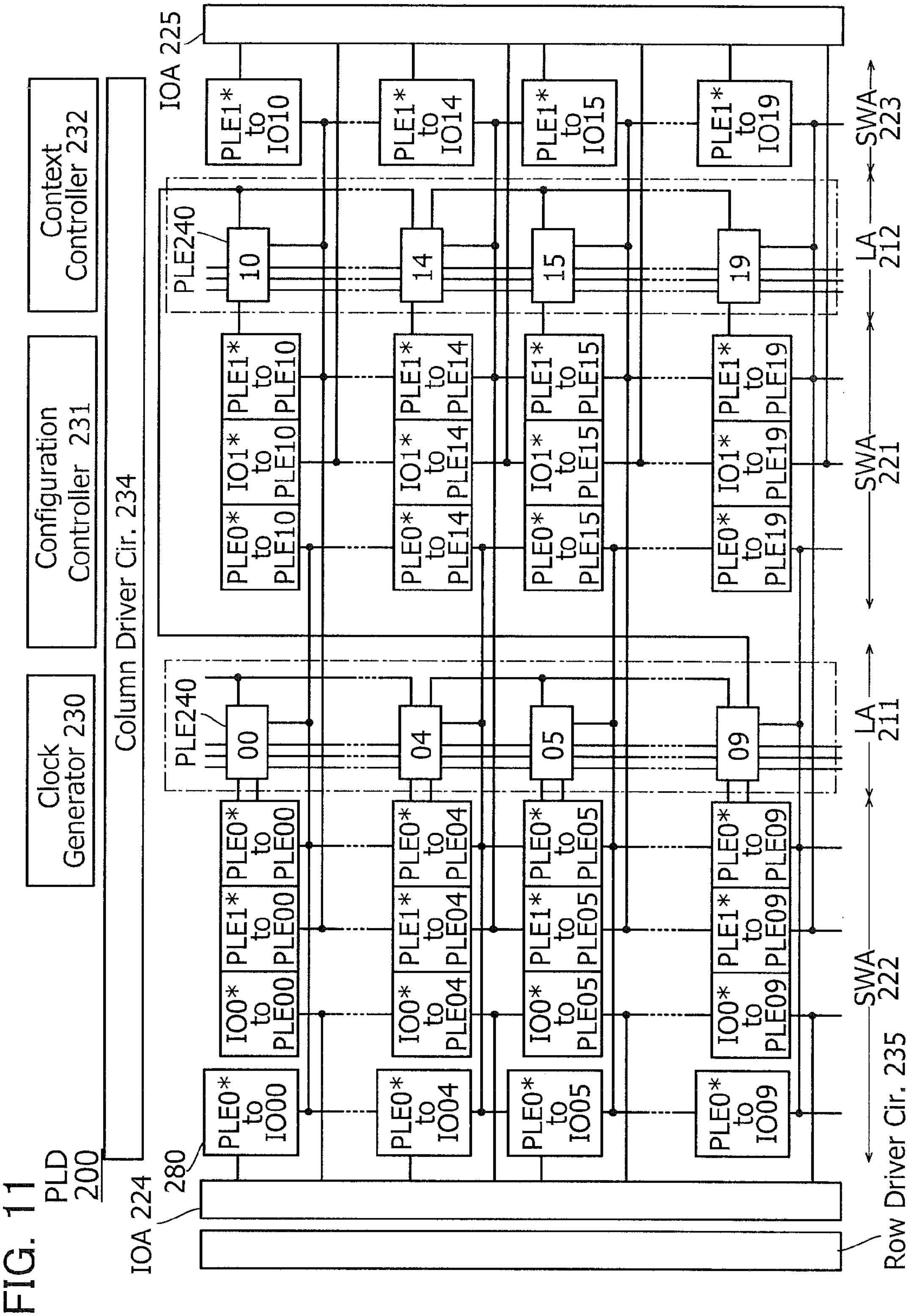
FIG. 11 is a block diagram illustrating a structure example of a PLD.

FIG. 11 illustrates an example of a multi-context PLD. A PLD 200 illustrated in FIG. 11 includes a logic unit, an input/output unit, and peripheral circuits. The logic unit includes logic arrays (LAs) 211 and 212 and switch arrays (SWAs) 221 to 223. The input/output unit includes input/output arrays (IOAs) 224 and 225. The peripheral circuits include functional circuits for driving the logic unit and the input/output unit. For example, the peripheral circuits include a clock generator 230, a configuration controller 231, a context controller 232, a column driver circuit 234, and a row driver circuit 235.

The LAs 211 and 212 each include a plurality of programmable logic elements (PLEs) 240. In the example of FIG. 11, the LA 211 includes 10 PLEs 240 (PLE_00 to PLE_09), and the LA 212 includes 10 PLEs 240 (PLE_10 to PLE_19). The IOAs 224 and 225 have a function of controlling input and output of signals between external terminals of the PLD 200 and the LAs 211 and 212.

The IOAs 224 and 225 each include a plurality of input/output circuits (IOs). In the example of FIG. 11, the IOA 224 includes 10 input/output circuits (IO_00 to IO_09), and the IOA 225 includes 10 input/output circuits (IO_10 to IO_19). IO_00 to IO_19 are electrically connected to different external terminals.

The SWAs 221 to 223 each include a plurality of PRSs 280. The PRS 280 has a structure similar to that of the switch circuit 122 in FIG. 10. An expression written in a block representing the PRS 280 represents a function of the PRS 280. For example, the PRS 280 expressed as "PLE0* to IO00" is a routing switch between the output nodes of PLE_00 to PLE_09 and the input node of IO_00, and determines electrical connection between PLE_00 to PLE_09 and IO_00 on the basis of configuration data and context data.

The clock generator 230 has a function of generating one or more clock signals used in the PLD 200, from a clock signal input from the outside. The column driver circuit 234 has a function of generating the signal cfg. The row driver circuit 235 has a function of generating the signal wr1. The configuration controller 231 has a function of controlling the column driver circuit 234 and the row driver circuit 235. The context controller 232 has a function of controlling writing and rewriting of context data. The context controller 232 has a function of generating the signals wr2 to wr4 and the signal ctx.

<<PLE Structure Example>>

Figure 12:
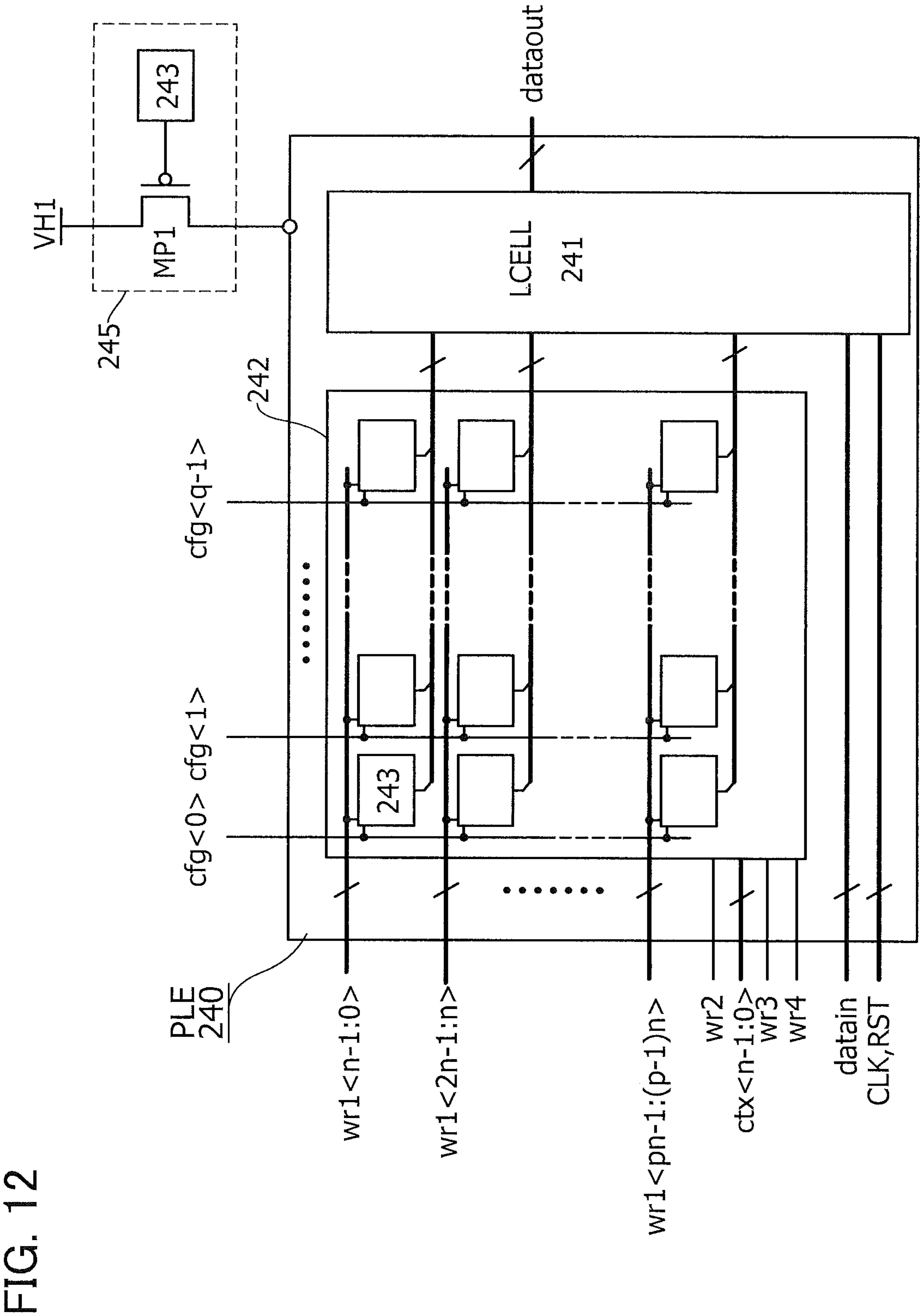
FIG. 12 is a block diagram illustrating a structure example of a PLE.

FIG. 12 illustrates a structure example of the PLE 240. The PLE 240 is a programmable logic circuit that includes a logic cell (LCELL) 241 and a configuration memory unit 242. A function of the LCELL 241 is determined by configuration data that is output from the configuration memory unit 242. The LCELL 241 has a function of generating a signal dataout that depends on the logic of a data signal datain. Control signals such as a clock signal CLK and a reset signal RESET are input to the LCELL 241.

The configuration memory unit 242 includes a plurality of memory circuits 243. VH1 is input to the PLE 240 through a PPS 245. The PPS 245 includes the transistor MP1 and the memory circuit 243. Providing the PPS 245 for every PLE 240 in such a manner enables fine-grained power gating.

The memory circuit 243 has a structure similar to that of the memory circuit 15 (FIG. 6). The memory circuit 243 is provided with the circuits 20 corresponding to the number of contexts. Alternatively, the memory circuit 243 can have a structure where the transistor MO3 is omitted from the memory circuit 15.

In the configuration memory unit 242, the memory circuits 243 are arranged in an array of p rows and q columns (p and q are each an integer greater than 1). Signals wr1<jn−1:(j−1)n> and a signal cfg<k−1> are input to the memory circuits 243 in the j-th row and the k-th column. Here, j is an integer of 1 to p, and k is an integer of 1 to q. The signals wr2 to wr4 and the signals ctx<n−1:0> are input in common to all the memory circuits 243 in the PLEs 240 and the memory circuit 243 in the PPS 245.

The memory circuit 243 in the PPS 245 and the memory circuit 243 provided in the configuration memory unit 242 may have the same structure.

<<LCELL Structure Example>>

Figure 13:
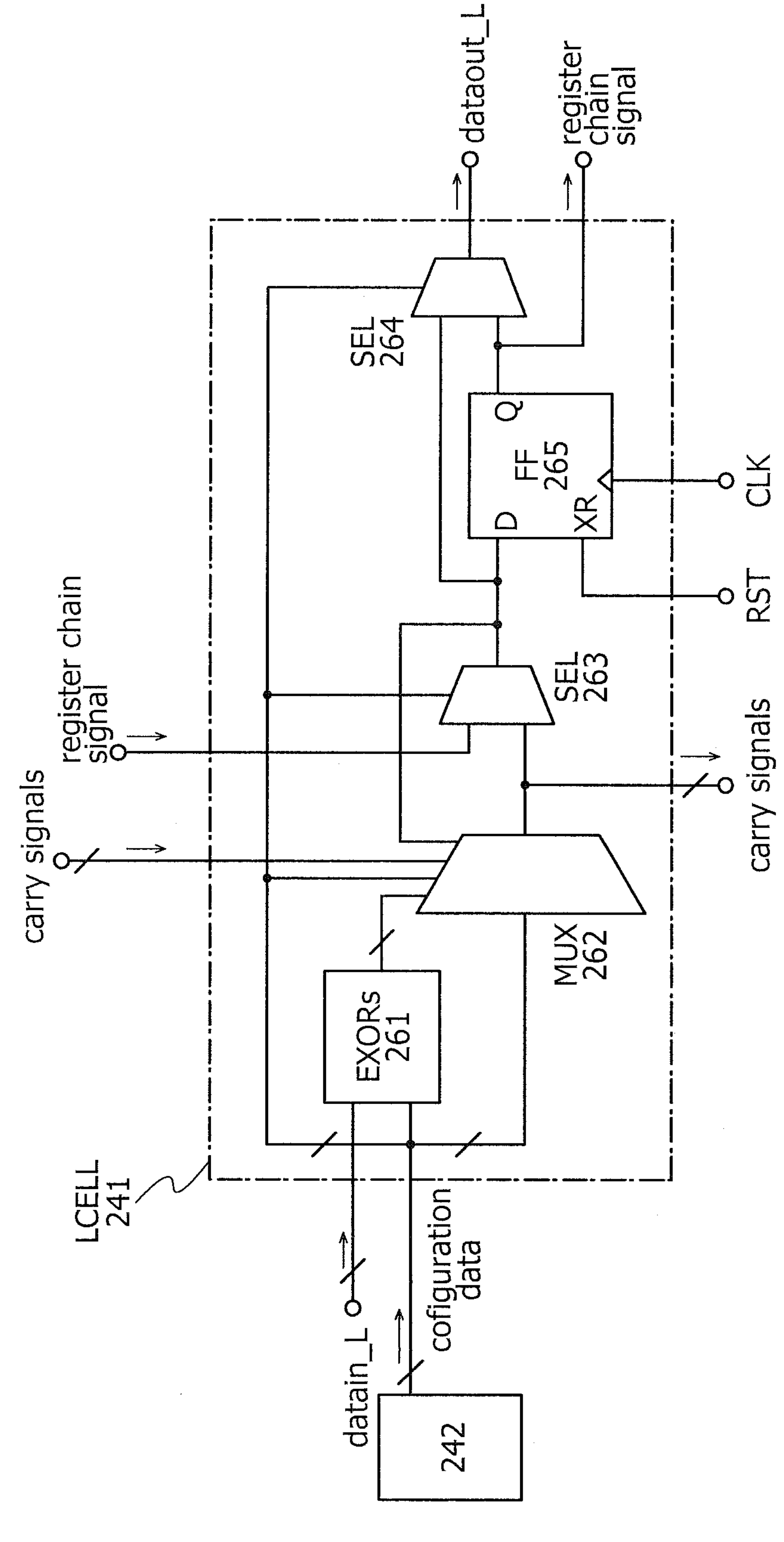
FIG. 13 is a circuit diagram illustrating a structure example of a logic cell (LCELL) in a PLE.

FIG. 13 illustrates a structure example of the LCELL 241. The LCELL 241 in FIG. 13 includes a plurality of logic circuits. For example, the LCELL 241 includes an exclusive OR circuit group (EXORs) 261, a multiplexer (MUX) 262, selectors (SELs) 263 and 264, and a flip-flop circuit (FF) 265. The FF 265 is a circuit functioning as a register. The FF 265 includes a terminal D to which data is input, a terminal XR to which the reset signal RESET is input, a terminal to which the clock signal CLK is input, and a terminal Q from which data is output. Logic functions of the combinational circuits (262 to 264) in the LCELL 241 are changed in accordance with configuration data output from the configuration memory unit 242.

A data signal datain_L is input to the LCELL 241 through the PRS 280. A data signal dataout_L is input to another PRS 280. To form a carry chain with a plurality of LCELLs 241, carry signals are transmitted between the adjacent LCELLs 241. To form a register chain with a plurality of LCELLs 241, register chain signals are transmitted between the adjacent LCELLs 241.

A PLD where a circuit configuration can be flexibly changed so that the PLD is driven at low voltage based on energy harvesting in a standby state and performs high-performance operation in signal processing is expected to be a preferable device for sensor networks.

In the PLD of this embodiment, the configuration can be changed at low energy and high speed by fine-grained power gating, normally-off driving, and context switching. Thus, a device in which the PLD of this embodiment, a wireless communication device, and a sensor are used in combination is highly preferable for a sensor network device. The present inventors fabricated an FPGA to demonstrate the effectiveness mentioned above. The evaluation results will be shown in Example 1.

<<Examples of Manufacturing Method and Structure of Electronic Component>>

Figure 14A:
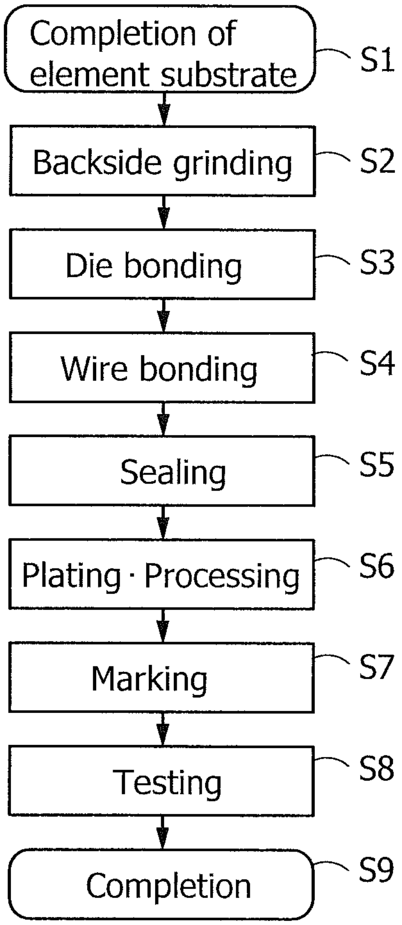
FIG. 14A is a flow chart showing an example of a method for manufacturing an electronic component.

Here, an electronic component and electronic devices including the electronic component will be described as examples of a semiconductor device. FIG. 14A is a flow chart showing an example of a method for manufacturing an electronic component. Note that an electronic component is also referred to as a semiconductor package, an IC package, or a package. For the electronic component, there are various standards and names corresponding to the direction or the shape of terminals; hence, one example of the electronic component will be described in this embodiment.

A semiconductor device including a transistor is completed by integrating detachable components on a printed circuit board through the assembly process (post-process). The post-process can be completed through steps shown in FIG. 14A. Specifically, after an element substrate obtained in the wafer process is completed (Step S1), the substrate is divided into a plurality of chips in a dicing step. Before the substrate is divided into the plurality of chips, the substrate is thinned to reduce warpage or the like of the substrate in the wafer process and to reduce the size of the electronic component (Step S2).

Then, the chip is picked up to be mounted on and bonded to a lead frame in a die bonding step (Step S3). In the die bonding step, the chip and the lead frame are bonded by a method appropriate for a product and may be bonded with a resin or a tape, for example. In the die bonding step, the chip is mounted on an interposer to be bonded. In a wire bonding step, a lead of the lead frame is electrically connected to an electrode on the chip with a metal fine line (wire) (Step S4). As a metal wire, a silver wire or a gold wire can be used. Either ball bonding or wedge bonding can be used as wire bonding.

A wire-bonded chip is subjected to a molding step of sealing the chip with an epoxy resin or the like (Step S5). The lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability. Printing process (marking) is performed on a surface of the package (Step S7). Through an inspection step (Step S8), the electronic component is completed (Step S9). Integrating the above-described semiconductor device achieves a small electronic component with low power consumption.

Figure 14B:
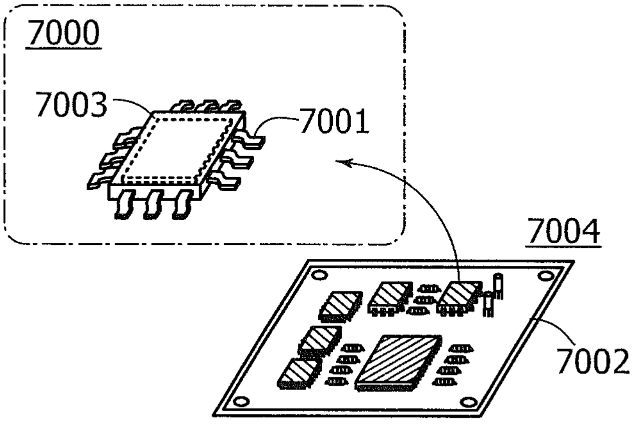
FIG. 14B is a schematic perspective view illustrating a structure example of an electronic component.

FIG. 14B is a schematic perspective view of an electronic component. FIG. 14B shows an example of a quad flat package (QFP). An electronic component 7000 illustrated in FIG. 14B includes a lead 7001 and a circuit portion 7003. The circuit portion 7003 is provided with the PLD of this embodiment, for example. The electronic component 7000 is mounted on a printed circuit board 7002, for example. A combination of electronic components 7000 electrically connected to each other over the printed circuit board 7002 can be equipped in an electronic device. A completed circuit board 7004 is provided in an electronic device or the like.

The PLD of this embodiment itself, or a central processing unit (CPU), a microcontroller unit (MCU), a sensor device, or the like provided with the PLD can be used as a processor for executing various kinds of processing. An electronic component can be formed as a system-on-a-chip (SOC or SoC) in which the PLD and another circuit are mounted on one semiconductor chip (IC chip). In the case where the PLD is included in a sensor device, the sensor device is configured so that one PLD processes data detected by a plurality of sensors, whereby the electronic component can be reduced in size and can have multiple functions. Since the semiconductor device of this embodiment is low in power consumption, the power consumption of the electronic component including the semiconductor device can also be reduced.

The electronic component of this embodiment can be used for electronic devices in a wide variety of fields, such as digital signal processing, software-defined radio systems, avionic systems (electronic devices used in aircraft, e.g., communication systems, navigation systems, autopilot systems, and flight management systems), ASIC (application specific integrated circuit) prototyping, medical image processing, voice recognition, encryption, bioinformatics, emulators for mechanical systems, and radio telescopes in radio astronomy. According to this embodiment, it is possible to reduce the size and power consumption of an electronic device.

Examples of electronic devices include display devices, personal computers, and image reproducing devices provided with recording media (devices that read image data of recording media such as digital versatile discs (DVDs) and have displays for displaying images). Other examples are portable phones, game machines including portable game machines, portable information appliances, e-book readers, cameras such as video cameras and digital still cameras, goggle-type displays (head mounted displays), navigation systems, audio reproducing devices (e.g., car audio systems and digital audio players), copiers, facsimiles, printers, and multifunction printers. FIGS. 15A to 15F illustrate specific examples of these electronic devices.

Figure 15A:
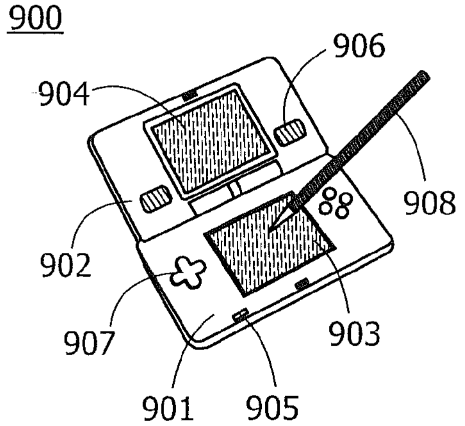
FIGS. 15A to 15F each illustrate an example of the structure of an electronic device.

A portable game machine 900 illustrated in FIG. 15A includes a housing 901, a housing 902, a display portion 903, a display portion 904, a microphone 905, a speaker 906, an operation key 907, a stylus 908, and the like.

Figure 15B:
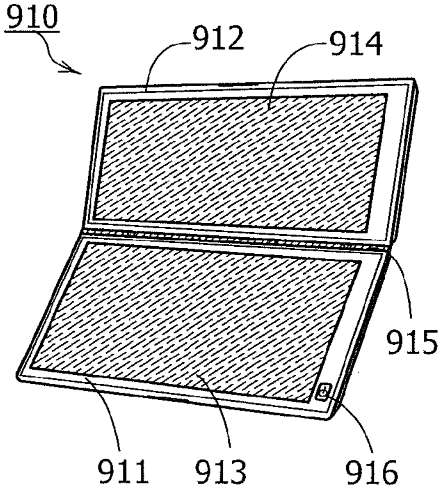

A portable information appliance 910 illustrated in FIG. 15B includes a housing 911, a housing 912, a display portion 913, a display portion 914, a joint 915, an operation key 916, and the like. The display portion 913 is provided in the housing 911, and the display portion 914 is provided in the housing 912. The housings 911 and 912 are connected to each other with the joint 915, and an angle between the housings 911 and 912 can be changed with the joint 915. Accordingly, the change in the direction of an image displayed on the display portion 913 or switching between display and non-display may be performed by changing the angle between the housings 911 and 912 connected with the joint 915. A display device with a touch panel may be used as the display portion 913 and/or the display portion 914.

Figure 15C:
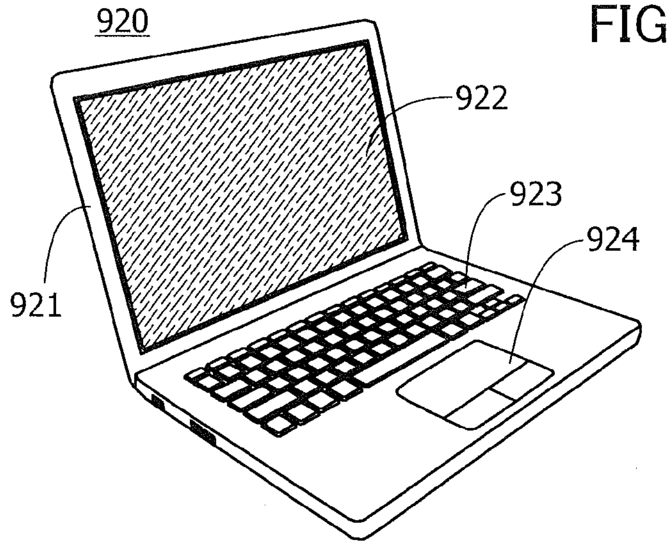

A personal computer 920 illustrated in FIG. 15C includes a housing 921, a display portion 922, a keyboard 923, a pointing device 924, and the like.

Figure 15D:
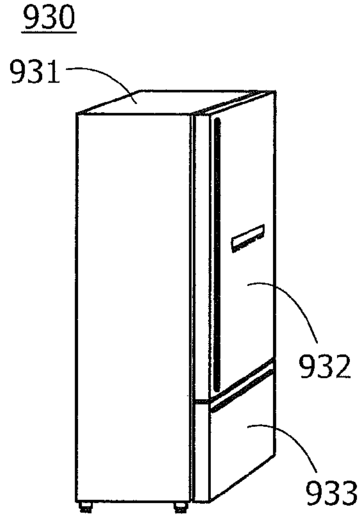

FIG. 15D illustrates an electric refrigerator-freezer as an example of a household appliance. An electric refrigerator-freezer 930 includes a housing 931, a refrigerator door 932, a freezer door 933, and the like.

Figure 15E:
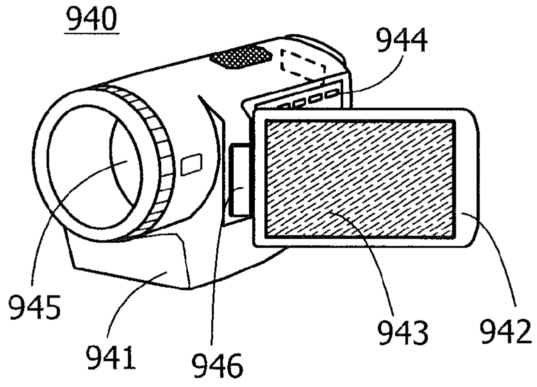

A video camera 940 illustrated in FIG. 15E includes a housing 941, a housing 942, a display portion 943, an operation key 944, a lens 945, a joint 946, and the like. The operation key 944 and the lens 945 are provided in the housing 941, and the display portion 943 is provided in the housing 942. The housing 941 and the housing 942 are connected to each other with the joint 946, and an angle between the housing 941 and the housing 942 can be changed with the joint 946. The change in the direction of an image displayed on the display portion 943 or switching between display and non-display of an image may be performed by changing the angle between the housings 941 and 942.

Figure 15F:
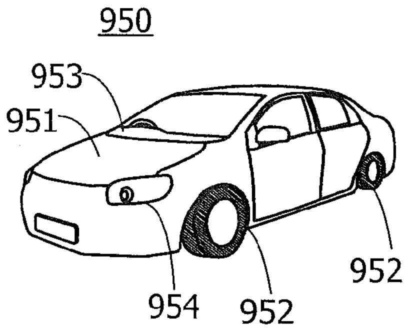

A motor vehicle 950 illustrated in FIG. 15F includes a car body 951, wheels 952, a dashboard 953, lights 954, and the like. The motor vehicle 950 may be engine-powered, or may be an electric vehicle or a hybrid vehicle.

Embodiment 2

In this embodiment, an OS transistor and a semiconductor device including an OS transistor will be described.

<<OS Transistor Structure Example 1>>

Figure 16A:
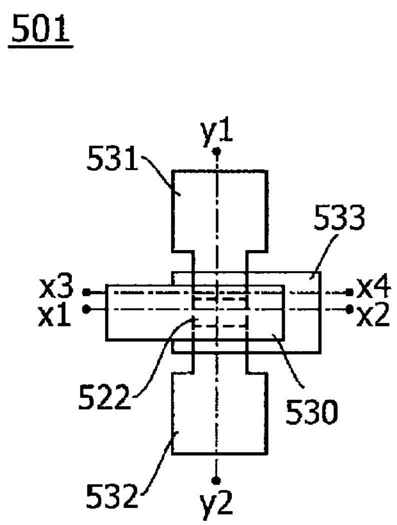
FIGS. 16A to 16D are a top view and cross-sectional views along line y1-y2, line x1-x2, and line x3-x4 for illustrating a structure example of an OS transistor.
Figure 16B:
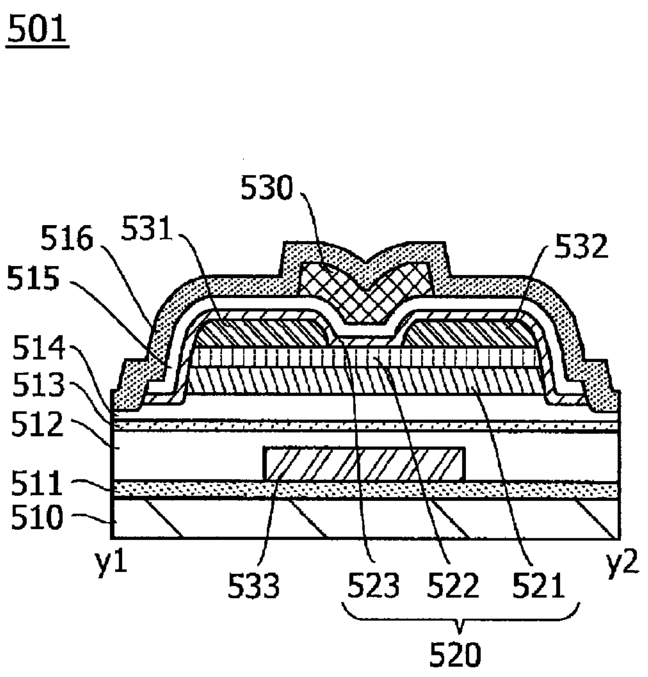
Figure 16C:
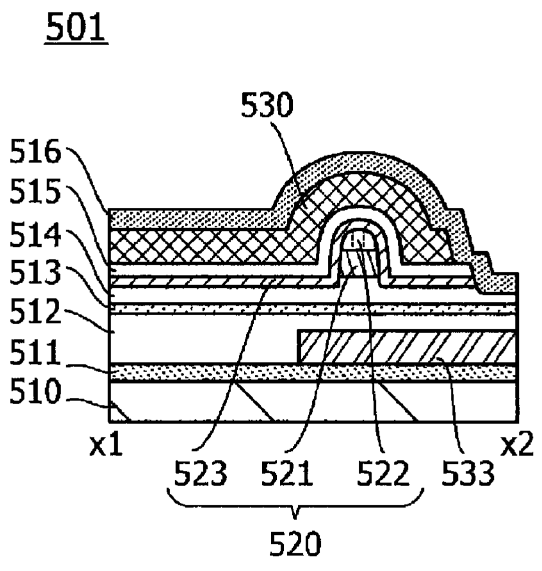
Figure 16D:
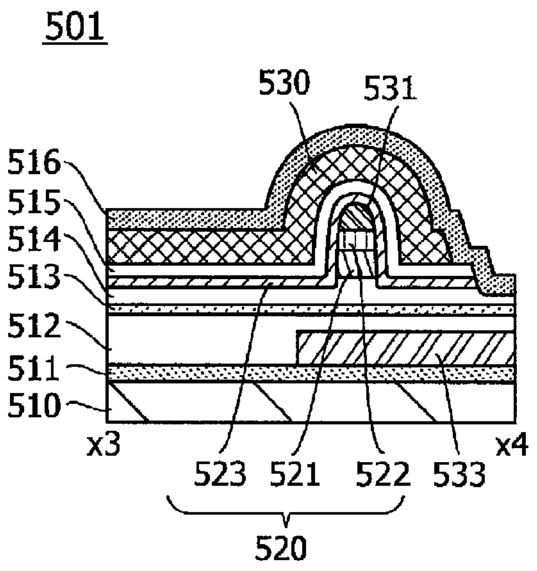

FIGS. 16A to 16D illustrate an example of the structure of an OS transistor. FIG. 16A is a top view illustrating a structure example of the OS transistor. FIG. 16B is a cross-sectional view taken along the line y1-y2. FIG. 16C is a cross-sectional view taken along the line x1-x2. FIG. 16D is a cross-sectional view taken along the line x3-x4. Here, in some cases, the direction of the line y1-y2 is referred to as a channel length direction, and the direction of the line x1-x2 is referred to as a channel width direction. Accordingly, FIG. 16B illustrates a cross-sectional structure of the OS transistor in the channel length direction, and FIGS. 16C and 16D each illustrate a cross-sectional structure of the OS transistor in the channel width direction. Note that FIG. 16A does not illustrate some components to clarify the device structure.

An OS transistor 501 is formed on an insulating surface, here, over an insulating layer 511. The insulating layer 511 is formed on a surface of a substrate 510. The OS transistor 501 is covered with an insulating layer 516. Note that the insulating layer 516 may be regarded as a component of the OS transistor 501. The OS transistor 501 includes an insulating layer 512, an insulating layer 513, an insulating layer 514, an insulating layer 515, semiconductor layers 521 to 523, a conductive layer 530, a conductive layer 531, a conductive layer 532, and a conductive layer 533. Here, the semiconductor layers 521 to 523 are collectively referred to as a semiconductor region 520.

The conductive layer 530 functions as a gate electrode. The conductive layer 533 functions as a backgate electrode. The conductive layers 531 and 532 function as a source electrode and a drain electrode. The insulating layer 511 has a function of electrically isolating the substrate 510 and the conductive layer 533 from each other. The insulating layer 515 serves as a gate insulating layer. The insulating layers 513 and 514 serve as a gate insulating layer closer to a back channel.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. That is, the channel length of one transistor is not limited to one value in some cases. Therefore, in this specification and the like, the channel length is any one of lengths, the maximum length, the minimum length, or the average length in a region where a channel is formed.

The channel width refers to, for example, the length of a portion where a source and a drain face each other in a region where a semiconductor (or a portion where a current flows in a semiconductor when a transistor is on) and a gate electrode overlap with each other or in a region where a channel is formed. In one transistor, channel widths in all regions do not necessarily have the same value. That is, the channel width of one transistor is not fixed to one value in some cases. Therefore, in this specification and the like, the channel width is any one of widths, the maximum width, the minimum width, or the average width in a region where a channel is formed.

Note that in some transistor structures, a channel width in a region where a channel is actually formed (hereinafter referred to as effective channel width) is different from a channel width shown in a top view of a transistor (hereinafter referred to as apparent channel width). For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

An effective channel width is sometimes difficult to measure particularly in a transistor having a three-dimensional structure. For example, estimation of an effective channel width from a design value requires an assumption that the shape of a semiconductor region is known. Thus, when the shape of a semiconductor region is not known accurately, it is difficult to measure an effective channel width accurately.

In view of this, in a top view of a transistor in this specification, an apparent channel width that is the length of a portion where a source and a drain face each other in a region where a semiconductor region and a gate electrode overlap with each other is referred to as a surrounded channel width (SCW) in some cases. Furthermore, in this specification, the term "channel width" may denote a surrounded channel width or an apparent channel width, or may denote an effective channel width. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one when an effective channel width is used for the calculation is obtained in some cases.

As illustrated in FIGS. 16B and 16C, the semiconductor region 520 includes a portion where the semiconductor layer 521, the semiconductor layer 522, and the semiconductor layer 523 are stacked in this order. The insulating layer 515 covers this stacked portion. The conductive layer 530 overlaps the stacked portion with the insulating layer 513 positioned therebetween. The conductive layers 531 and 532 are provided over the stack of the semiconductor layers 521 and 522 and are in contact with a top surface of the stack and a side surface of the stack in the channel length direction. The stack including the semiconductor layers 521 and 522 and the conductive layers 531 and 532 is formed through an etching step using one mask.

The semiconductor layer 523 is formed to cover the semiconductor layers 521 and 522 and the conductive layers 531 and 532. The insulating layer 515 covers the semiconductor layer 523. Here, the insulating layer 515 and the semiconductor layer 523 are etched using one mask.

The conductive layer 530 is formed so as to surround the portion where the semiconductor layers 521 to 523 are stacked, with the insulating layer 515 placed between the conductive layer 530 and the portion, when seen in the cross section in the channel width direction (see FIG. 16C). Thus, a gate electric field in the vertical direction and a gate electric field in the lateral direction are applied to this stacked portion. The gate electric field of the OS transistor 501 refers to an electric field generated by voltage applied to the conductive layer 530 (gate electrode layer). The whole stacked portion of the semiconductor layers 521 to 523 can be electrically surrounded by the gate electric fields, so that a channel is sometimes formed in the whole semiconductor layer 522 (bulk). Consequently, high on-state current of the OS transistor 501 can be achieved. A device structure of a transistor in which a semiconductor layer where a channel is formed is electrically surrounded by gate electric fields as in the OS transistor 501 can be referred to as a surrounded channel (s-channel) structure. The OS transistor 501 with the s-channel structure can have a high on-state current and high frequency characteristics, specifically high cutoff frequency.

The s-channel structure contributes to high on-state current and thus is suitable for a semiconductor device that requires a miniaturized transistor, such as LSI, and for a transistor with high operating frequency. A semiconductor device including a transistor with the s-channel structure can operate at high frequency.

A miniaturized OS transistor can provide a highly integrated or small semiconductor device. An OS transistor preferably has, for example, a region where the channel length is preferably greater than or equal to 10 nm and less than 1 m, more preferably greater than or equal to 10 nm and less than 100 nm, still more preferably greater than or equal to 10 nm and less than 70 nm, yet still more preferably greater than or equal to 10 nm and less than 60 nm, and yet still more preferably greater than or equal to 10 nm and less than 30 nm. In addition, an OS transistor preferably has, for example, a region where the channel width is preferably greater than or equal to 10 nm and less than 1 μm, more preferably greater than or equal to 10 nm and less than 100 nm, still more preferably greater than or equal to 10 nm and less than 70 nm, yet still more preferably greater than or equal to 10 nm and less than 60 nm, and yet still more preferably greater than or equal to 10 nm and less than 30 nm.

Since an oxide semiconductor has lower thermal conductivity than silicon, heat is likely to remain in the semiconductor region 520 in the OS transistor 501. When the conductive layers 531 and 532 are provided to overlap with the conductive layer 530 with the semiconductor layer 523 and the insulating layer 515 placed therebetween as illustrated in FIGS. 16B and 16D, the conductive layers 531 and 532 can be provided with a function of releasing heat generated in the semiconductor region 520 (particularly the semiconductor layer 522).

<Insulating Layer>

Each of the insulating layers 511 to 516 is formed using an insulating film having a single-layer structure or a multi-layer structure. Examples of materials for the insulating film include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

Note that in this specification and the like, oxynitride refers to a compound that contains more oxygen than nitrogen, and nitride oxide refers to a compound that contains more nitrogen than oxygen. In this specification and the like, oxide used as an insulating material includes, in its category, oxide with a nitrogen content of less than 1 atomic %.

Since the insulating layers 514 and 515 are in contact with the semiconductor region 520, they preferably contain oxide, more preferably contain an oxide material from which part of oxygen is released by heating. The insulating layers 514 and 515 preferably contain oxide containing oxygen more than that in the stoichiometric composition. By heating, part of oxygen is released from an oxide film containing oxygen more than that in the stoichiometric composition. Oxygen released from the insulating layers 514 and 515 is supplied to the semiconductor region 520, which is an oxide semiconductor, thus, oxygen vacancies in the oxide semiconductor can be reduced. Consequently, changes in electrical characteristics of the transistor can be reduced and the reliability of the transistor can be increased.

The oxide film containing oxygen more than that in the stoichiometric composition is an oxide film in which the amount of released oxygen converted into oxygen atoms is greater than or equal to $1.0\times10^{18}$ atoms/cm$^3$, preferably greater than or equal to $3.0\times10^{2}$ atoms/cm$^3$ in thermal desorption spectroscopy (TDS) analysis, for example. Note that the temperature of the film surface in the TDS analysis ranges preferably from 100° C. to 700° C. or from 100° C. to 500° C.

The insulating layer 513 has a passivation function of preventing oxygen contained in the insulating layer 514 from decreasing by bonding to metal contained in the conductive film 533. The insulating layer 516 has a passivation function of preventing oxygen contained in the insulating layer 515.

The insulating layers 511, 513, and 516 preferably have a function of blocking oxygen, hydrogen, water, an alkali metal, an alkaline earth metal, and the like. The insulating layers 511, 513, and 516 can prevent outward diffusion of oxygen from the semiconductor region 520 and entry of hydrogen, water, or the like into the semiconductor region 520 from the outside. To provide such functions, at least one insulating film made of silicon nitride, silicon nitride oxide, aluminum nitride, aluminum nitride oxide, aluminum oxide, aluminum oxynitride, gallium oxide, gallium oxynitride, yttrium oxide, yttrium oxynitride, hafnium oxide, or hafnium oxynitride, for example, is formed as each of the insulating layers 511, 513, and 516.

<Conductive Layer>

The conductive layers 530 to 533 preferably have a single-layer structure or a multi-layer structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr); an alloy of such a low-resistance material; or a compound containing such a material as its main component. It is particularly preferable to use a high-melting-point material that has both heat resistance and conductivity, such as tungsten or molybdenum. Moreover, the conductive layers 530 to 533 are preferably formed using a low-resistance conductive material such as aluminum or copper. Furthermore, the conductive layers 530 to 533 are preferably formed using a Cu—Mn alloy, in which case manganese oxide formed at the interface with an insulator containing oxygen has a function of preventing Cu diffusion.

The conductive layers 531 and 532 in the OS transistor 501 are formed from a hard mask used for forming the stack of the semiconductor layers 521 and 522. Therefore, the conductive layers 531 and 532 do not have regions in contact with the side surfaces of the semiconductor layers 521 and 522. For example, the semiconductor layers 521 and 522 and the conductive layers 531 and 532 can be formed through the following steps. A two-layer oxide semiconductor film to be the semiconductor layers 521 and 522 is formed. A single-layer or multi-layer conductive film is formed over the oxide semiconductor film. This conductive film is etched to form a hard mask. Using the hard mask, the two-layer oxide semiconductor film is etched to form the stack of the semiconductor layers 521 and 522. Then, the hard mask is etched to form the conductive layer 531 and the conductive layer 532.

<Semiconductor Layer>

The semiconductor layer 522 is an oxide semiconductor containing indium (In), for example. The semiconductor layer 522 has high carrier mobility (electron mobility) when containing indium, for example. Moreover, the semiconductor layer 522 preferably contains an element M. The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), and the like. Note that two or more of the above elements may be used in combination as the element M. The element M is an element having high bonding energy with oxygen, for example. The element M is an element whose bonding energy with oxygen is higher than that of indium, for example. The element M is an element that can increase the energy gap of the oxide semiconductor, for example. Furthermore, the semiconductor layer 522 preferably contains zinc (Zn). When containing zinc, the oxide semiconductor is easily to be crystallized in some cases.

Note that the semiconductor layer 522 is not limited to the oxide semiconductor containing indium. The semiconductor layer 522 may be, for example, an oxide semiconductor that does not contain indium and contains zinc, an oxide semiconductor that does not contain indium and contains gallium, or an oxide semiconductor that does not contain indium and contains tin (e.g., zinc tin oxide or gallium tin oxide). For the semiconductor layer 522, oxide with a wide energy gap is used, for example. The energy gap of the semiconductor layer 522 ranges, for example, from 2.5 eV to 4.2 eV, preferably from 2.8 eV to 3.8 eV, more preferably from 3 eV to 3.5 eV. The semiconductor region 520 or at least the semiconductor layer 522 is preferably formed using a CAAC-OS that will be described in Embodiment 3.

For example, each of the semiconductor layers 521 and 523 is an oxide semiconductor that contains at least one element or two or more elements contained in the semiconductor layer 522, other than oxygen. When the semiconductor layers 521 and 523 contain at least one element or two or more elements (other than oxygen) contained in the semiconductor layer 522, interface states are less likely to be generated at the interface between the semiconductor layers 521 and 522 and the interface between the semiconductor layers 522 and 523.

Given that the semiconductor layer 521 is an In-M-Zn oxide and the total amount of In and M is 100 atomic %, it is preferred that In be less than 50 atomic % and M be greater than 50 atomic %, and more preferred that In be less than 25 atomic % and M be greater than 75 atomic %. When the semiconductor layer 521 is formed by a sputtering method, a sputtering target that satisfies the above composition, for example, a sputtering target containing In, M, and Zn at an atomic ratio of 1:3:2 is preferably used.

Given that the semiconductor layer 522 is an In-M-Zn oxide and the total amount of In and M is 100 atomic %, it is preferred that In be greater than 25 atomic % and M be less than 75 atomic %, and more preferred that In be greater than 34 atomic % and M be less than 66 atomic %. When the semiconductor layer 522 is formed by a sputtering method, a sputtering target that satisfies the above composition, for example, a sputtering target containing In, M, and Zn at an atomic ratio of 1:1:1, 1:1:1.2, 2:1:3, 3:1:2, or 4:2:4.1 is preferably used. In particular, when a sputtering target containing In, Ga, and Zn at an atomic ratio of 4:2:4.1 is used, the semiconductor layer 522 may contain In, Ga, and Zn at an atomic ratio of around 4:2:3.

Given that the semiconductor layer 523 is an In-M-Zn oxide and the total amount of In and M is 100 atomic %, it is preferred that In be less than 50 atomic % and M be greater than 50 atomic %, and more preferred that In be less than 25 atomic % and M be greater than 75 atomic %. Note that the semiconductor layer 523 may be an oxide that is the same type as that of the semiconductor layer 521. Note that the semiconductor layer 521 and/or the semiconductor layer 523 do/does not necessarily contain indium in some cases. For example, the semiconductor layer 521 and/or the semiconductor layer 523 may be a gallium oxide.

(Energy Band Structure)

Figure 17A:
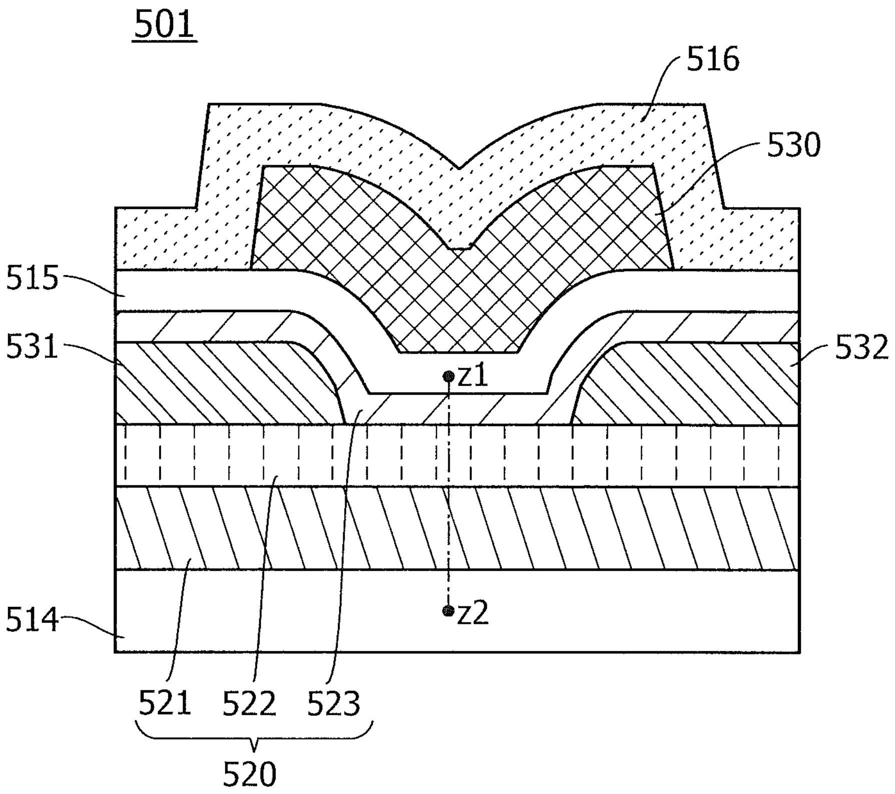
FIG. 17A is a partial enlarged view of FIG. 16B.
Figure 17B:
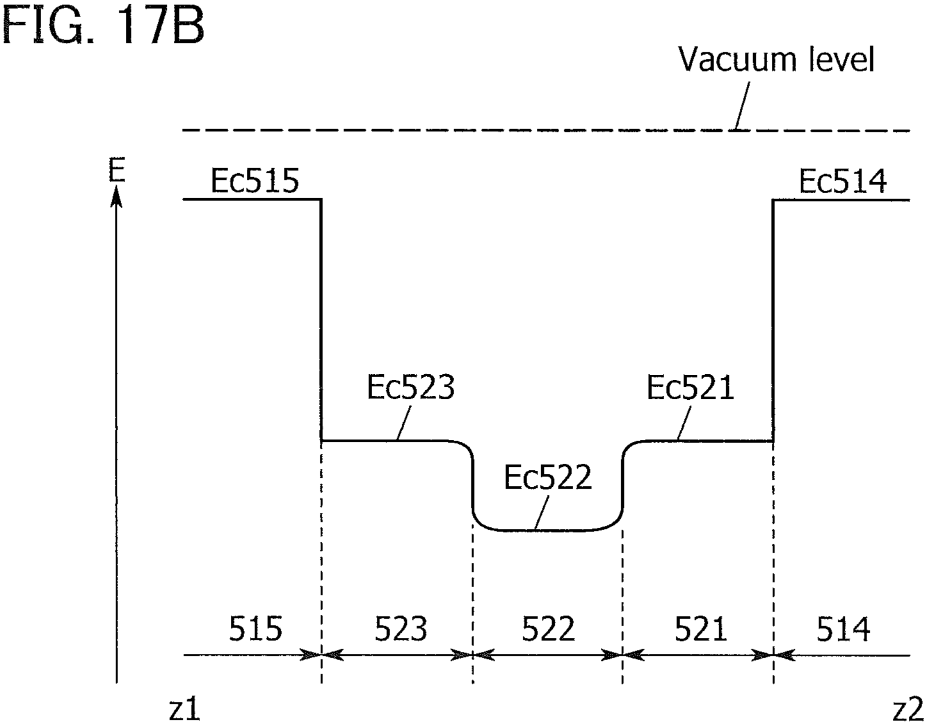
FIG. 17B is an energy band diagram of an OS transistor.

The function and effect of the semiconductor region 520 in which the semiconductor layers 521, 522, and 523 are stacked will be described with reference to FIGS. 17A and 17B. FIG. 17A is a partial enlarged view of FIG. 16B and shows an enlarged active layer (channel portion) of the OS transistor 501. FIG. 17B shows an energy band diagram of the active layer of the OS transistor 501, which is indicated by the dashed-dotted line z1-z2 in FIG. 17A.

In FIG. 17B, Ec514, Ec521, Ec522, Ec523, and Ec515 represent the energy of the conduction band minimum of the insulating layer 514, the semiconductor layer 521, the semiconductor layer 522, the semiconductor layer 523, and the insulating layer 515, respectively.

Here, a difference in energy between the vacuum level and the conduction band minimum (the difference is also referred to as "electron affinity") corresponds to a value obtained by subtracting an energy gap from a difference in energy between the vacuum level and the valence band maximum (the difference is also referred to as "ionization potential"). Note that the energy gap can be measured using a spectroscopic ellipsometer. The energy difference between the vacuum level and the valence band maximum can be measured using an ultraviolet photoelectron spectroscopy (UPS) device.

Since the insulating layers 514 and 515 are insulators, Ec514 and Ec515 are closer to the vacuum level than Ec521, Ec522, and Ec523 (i.e., the insulating layers 514 and 515 have a smaller electron affinity than the semiconductor layers 521, 522, and 523).

For the semiconductor layer 522, an oxide with a larger electron affinity than the semiconductor layers 521 and 523 is used. For example, the semiconductor layer 522 is formed using an oxide with higher electron affinity than those of the semiconductor layers 521 and 523 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV. Note that the electron affinity refers to an energy difference between the vacuum level and the conduction band minimum.

Since indium gallium oxide has a small electron affinity and a high oxygen-blocking property, the semiconductor layer 523 preferably contains indium gallium oxide. The gallium atomic ratio [Ga/(In+Ga)] is, for example, higher than or equal to 70%, preferably higher than or equal to 80%, more preferably higher than or equal to 90%. At this time, when a gate voltage is applied, a channel is formed in the semiconductor layer 522 having the highest electron affinity among the semiconductor layers 521, 522, and 523.

Here, a mixed region of the semiconductor layers 521 and 522 might exist between the semiconductor layers 521 and 522. A mixed region of the semiconductor layers 522 and 523 might exist between the semiconductor layers 522 and 523. The mixed region has a lower density of interface states. For that reason, the stack including the semiconductor layers 521, 522, and 523 has a band structure where energy at each interface and in the vicinity of the interface is changed continuously (continuous junction).

At this time, electrons move mainly in the semiconductor layer 522, not in the semiconductor layers 521 and 523. As described above, when the interface state density at the interface between the semiconductor layers 521 and 522 and the interface state density at the interface between the semiconductor layers 522 and 523 are decreased, electron movement in the semiconductor layer 522 is less likely to be inhibited and the on-sate current of the transistor can be increased.

As factors of inhibiting electron movement are decreased, the on-state current of the transistor can be increased. For example, when there is no factor of inhibiting electron movement, electrons are assumed to be moved efficiently. Electron movement is inhibited, for example, when physical unevenness in a channel formation region is large or when the density of defect states is high in a channel formation region.

To increase the on-state current of the OS transistor 501, for example, the root mean square (RMS) roughness in a measurement area of 1 μm×1 μm of a top surface or a bottom surface (a formation surface, here, a top surface of the semiconductor layer 521) of the semiconductor layer 522 is less than 1 nm, preferably less than 0.6 nm, more preferably less than 0.5 nm, still more preferably less than 0.4 nm. The average surface roughness (also referred to as Ra) in the measurement area of 1 μm×1 μm is less than 1 nm, preferably less than 0.6 nm, more preferably less than 0.5 nm, still more preferably less than 0.4 nm. The maximum difference (P−V) in the measurement area of 1 μm×1 μm is less than 10 nm, preferably less than 9 nm, more preferably less than 8 nm, still more preferably less than 7 nm. RMS roughness, Ra, and P−V can be measured using a scanning probe microscope.

For example, when the semiconductor layer 522 contains oxygen vacancies (also denoted by $V_O$), donor levels are sometimes formed by entry of hydrogen into sites of oxygen vacancies. A state in which hydrogen enters sites of oxygen vacancies may be denoted by $V_OH$ in the following description. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the semiconductor layer 522, the on-state current of the transistor can be increased in some cases.

For example, the hydrogen concentration measured by secondary ion mass spectrometry (SIMS) at a certain depth of the semiconductor layer 522 or in a certain region of the semiconductor layer 522 is higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$.

To decrease oxygen vacancies in the semiconductor layer 522, for example, there is a method in which excess oxygen in the insulating layer 515 is moved to the semiconductor layer 522 through the semiconductor layer 521. In this case, the semiconductor layer 521 is preferably a layer having an oxygen-transmitting property (a layer through which oxygen passes or is transmitted).

In the case where the OS transistor 501 has the s-channel structure, a channel is formed in the entire semiconductor layer 522. Therefore, as the semiconductor layer 522 is thicker, the size of the channel region is increased. In other words, the thicker the semiconductor layer 522 is, the higher the on-state current of the OS transistor 501 is.

The thickness of the semiconductor layer 523 is preferably as small as possible to increase the on-state current of the OS transistor 501. For example, the semiconductor layer 523 has a region with a thickness of less than 10 nm, preferably less than or equal to 5 nm, more preferably less than or equal to 3 nm. Meanwhile, the semiconductor layer 523 has a function of blocking entry of elements other than oxygen (such as hydrogen and silicon) included in the adjacent insulator into the semiconductor layer 522 where a channel is formed. Thus, the semiconductor layer 523 preferably has a certain thickness. For example, the semiconductor layer 523 has a region with a thickness of greater than or equal to 0.3 nm, preferably greater than or equal to 1 nm, more preferably greater than or equal to 2 nm. The semiconductor layer 523 preferably has an oxygen-blocking property to suppress outward diffusion of oxygen released from the insulating layer 515 and the like.

To increase the reliability of the OS transistor 501, it is preferred that the semiconductor layer 521 be thick and the semiconductor layer 523 be thin. For example, the semiconductor layer 521 has a region with a thickness of greater than or equal to 10 nm, preferably greater than or equal to 20 nm, more preferably greater than or equal to 40 nm, still more preferably greater than or equal to 60 nm. The thick semiconductor layer 521 can increase the distance from the interface between the semiconductor layer 521 and the adjacent insulator to the semiconductor layer 522 where a channel is formed. However, to prevent the decrease in productivity of a semiconductor device, the semiconductor layer 521 has a region with a thickness of, for example, less than or equal to 200 nm, preferably less than or equal to 120 nm, more preferably less than or equal to 80 nm.

Reducing the impurity concentration of the semiconductor region 520 to make the semiconductor layer 522 intrinsic or substantially intrinsic is effective in providing the OS transistor 501 with stable electrical characteristics. Note that in this specification and the like, the carrier density of a substantially intrinsic oxide semiconductor film is higher than or equal to $1\times10^{-9}/cm^3$ and lower than $8\times10^{11}/cm^3$, preferably lower than $1\times10^{11}/cm^3$, more preferably lower than $1\times10^{10}/cm^3$.

In the oxide semiconductor, hydrogen, nitrogen, carbon, silicon, and metal elements that are not main components are impurities. For example, hydrogen and nitrogen form donor levels to increase the carrier density, and silicon forms impurity levels in the oxide semiconductor. The impurity level becomes a trap, which might deteriorate the electric characteristics of the transistor. It is therefore preferable to reduce the concentration of the impurities in the semiconductor layers 521, 522, and 523 and at interfaces between the oxide semiconductor layers.

For example, the semiconductor layers 521 and 522 have a region in which the silicon concentration is higher than or equal to $1\times10^{16}$ atoms/$cm^3$ and lower than $1\times10^{19}$ atoms/$cm^3$. The silicon concentration is preferably higher than or equal to $1\times10^{16}$ atoms/$cm^3$ and lower than $5\times10^{18}$ atoms/$cm^3$, more preferably higher than or equal to $1\times10^{16}$ atoms/$cm^3$ and lower than $2\times10^{18}$ atoms/$cm^3$. The semiconductor layers 522 and 523 have a region in which the silicon concentration is higher than or equal to $1\times10^{16}$ atoms/$cm^3$ and lower than $1\times10^{19}$ atoms/$cm^3$. The silicon concentration is preferably higher than or equal to $1\times10^{16}$ atoms/$cm^3$ and lower than $5\times10^{18}$ atoms/$cm^3$, more preferably higher than or equal to $1\times10^{16}$ atoms/$cm^3$ and lower than $2\times10^{18}$ atoms/$cm^3$. The silicon concentration can be measured by SIMS, for example.

It is preferable to reduce the hydrogen concentration of the semiconductor layer 521 and 523 in order to reduce the hydrogen concentration of the semiconductor layer 522. The semiconductor layers 521 and 523 have a region with a hydrogen concentration in the range of $1\times10^{16}$ atoms/$cm^3$ to $2\times10^{2}$ atoms/$cm^3$. The hydrogen concentration is preferably higher than or equal to $1\times10^{16}$ atoms/$cm^3$ and lower than or equal to $5\times10^{19}$ atoms/$cm^3$, more preferably higher than or equal to $1\times10^{16}$ atoms/$cm^3$ and lower than or equal to $1\times10^{19}$ atoms/$cm^3$, still more preferably higher than or equal to $1\times10^{16}$ atoms/$cm^3$ and lower than or equal to $5\times10^{18}$ atoms/$cm^3$. The hydrogen concentration can be measured by SIMS, for example.

It is preferable to reduce the nitrogen concentration of the semiconductor layer 521 and 523 in order to reduce the nitrogen concentration of the semiconductor layer 522. The semiconductor layers 521 and 523 have a region with a nitrogen concentration in the range of $1\times10^{16}$ atoms/$cm^3$ to $5\times10^{19}$ atoms/$cm^3$. The nitrogen concentration is preferably higher than or equal to $1\times10^{16}$ atoms/$cm^3$ and lower than or equal to $5\times10^{18}$ atoms/$cm^3$, more preferably higher than or equal to $1\times10^{16}$ atoms/$cm^3$ and lower than or equal to $1\times10^{18}$ atoms/$cm^3$, still more preferably higher than or equal to $1\times10^{16}$ atoms/$cm^3$ and lower than or equal to $5\times10^{17}$ atoms/$cm^3$. The nitrogen concentration can be measured by SIMS.

A transistor in which a highly purified oxide semiconductor is used for a channel formation region as described above has an extremely low off-state current. When a voltage between a source and a drain is set at about 0.1 V, 5 V, or 10 V, for example, the off-state current standardized on the channel width of the transistor can be as low as several yoctoamperes per micrometer to several zeptoamperes per micrometer.

FIGS. 16A to 16D show the example in which the semiconductor region 520 has a three-layer structure; however, one embodiment of the present invention is not limited to this. For example, the semiconductor region 520 may have a two-layer structure without the semiconductor layer 521 or the semiconductor layer 523. Alternatively, the semiconductor region 520 can have a four-layer structure in which a semiconductor layer similar to the semiconductor layers 521 to 523 is provided over or below the semiconductor layer 521 or over or below the semiconductor layer 523. Further alternatively, the semiconductor region 520 can have an n-layer structure (n is an integer of 5 or more) in which semiconductor layers similar to the semiconductor layers 521 to 523 are provided at two or more of the following positions: over the semiconductor layer 521, below the semiconductor layer 521, over the semiconductor layer 523, and below the semiconductor layer 523.

When the OS transistor 501 has no backgate electrode, it is not necessary to provide the conductive layer 533. In this case, a structure may be employed in which the insulating layers 512 and 513 are not provided and the insulating layer 514 is formed over the insulating layer 511.

<Charge Trap Layer>

The threshold voltage of a Si transistor can be easily controlled by channel doping, whereas it is difficult to change the threshold voltage of an OS transistor effectively by channel doping. The threshold voltage of an OS transistor can be changed by electron injection into a charge trap layer. For example, electron injection into a charge trap layer may be performed using the tunnel effect. By application of positive voltage to the conductive layer 533, tunnel electrons are injected into a charge trap layer.

In the OS transistor 501, a charge trap layer can be provided in the insulating layer 515. When the backgate (conductive layer 533) is provided, a charge trap layer is preferably provided in the insulating layer 512 or the insulating layer 513. Alternatively, the insulating layer 513 itself may be formed as a charge trap layer. For example, the insulating layer 513 made of hafnium oxide, aluminum oxide, tantalum oxide, aluminum silicate, or the like can serve as a charge trap layer.

<Substrate>

As the substrate 510, an insulator substrate, a semiconductor substrate, or a conductor substrate can be used, for example. Examples of the insulator substrate are a glass substrate, a quartz substrate, a sapphire substrate, a stabilized zirconia substrate (e.g., an yttria-stabilized zirconia substrate), and a resin substrate. Examples of the semiconductor substrate are a single material semiconductor substrate made of silicon, germanium, or the like and a compound semiconductor substrate made of silicon carbide, silicon germanium, gallium arsenide, indium phosphide, zinc oxide, or gallium oxide. The semiconductor substrate may be a bulk semiconductor substrate or may be a silicon on insulator (SOI) substrate, where a semiconductor substrate is provided with a semiconductor layer via an insulating region. Examples of the conductor substrate are a graphite substrate, a metal substrate, an alloy substrate, a conductive resin substrate, a substrate containing metal nitride, and a substrate containing metal oxide. Other examples of usable substrates are an insulator substrate provided with a conductor or a semiconductor, a semiconductor substrate provided with a conductor or an insulator, and a conductor substrate provided with a semiconductor or an insulator. Alternatively, any of the above substrates provided with an element may be used. Examples of the element provided over the substrate are a capacitor, a resistor, a switching element, a light-emitting element, and a memory element.

The substrate 510 may be a flexible substrate. As a method for providing a transistor over a flexible substrate, there is a method in which the transistor is formed over a non-flexible substrate (e.g., a semiconductor substrate) and then the transistor is separated and transferred to the substrate 510 that is a flexible substrate. In this case, a separation layer is preferably provided between the non-flexible substrate and the transistor. As the substrate 510, a sheet, a film, or a foil containing a fiber may be used. The substrate 510 may have elasticity. The substrate 510 may have a property of returning to its original shape when bending or pulling is stopped. Alternatively, the substrate 510 may have a property of not returning to its original shape. The thickness of the substrate 510 ranges, for example, from 5 μm to 700 μm, preferably from 10 μm to 500 μm, more preferably from 15 μm to 300 μm. When the substrate 510 has a small thickness, the weight of the semiconductor device can be reduced. With a small thickness, the substrate 510, even it is made of a material such as glass, may have elasticity or a property of returning to its original shape when bending or pulling is stopped. Thus, an impact applied to the semiconductor device over the substrate 510, which is caused by dropping or the like, can be reduced. That is, a robust semiconductor device can be provided.

For the flexible substrate 510, metal, an alloy, resin, glass, or fiber thereof can be used, for example. The coefficient of linear expansion of the flexible substrate is preferably as low as possible because deformation due to an environment is suppressed. The flexible substrate is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used for the flexible substrate because of its low coefficient of linear expansion.

<<OS Transistor Structure Example 2>>

Figure 18A:
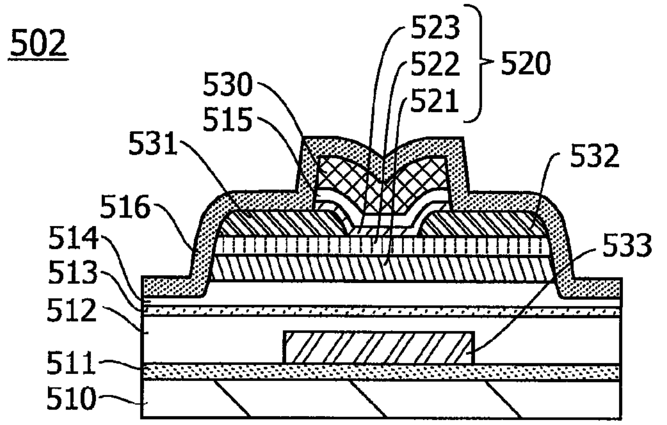
FIGS. 18A to 18C are cross-sectional views each illustrating a structure example of an OS transistor.

In the OS transistor 501, the semiconductor layer 523 and the insulating layer 515 can be etched using the conductive layer 530 as a mask. FIG. 18A illustrates a structure example of an OS transistor manufactured through such a step. In an OS transistor 502 in FIG. 18A, end portions of the semiconductor layer 523 and the insulating layer 515 are substantially aligned with an end portion of the conductive layer 530. The semiconductor layer 523 and the insulating layer 515 are provided only below the conductive layer 530.

<<OS Transistor Structure Example 3>>

Figure 18B:
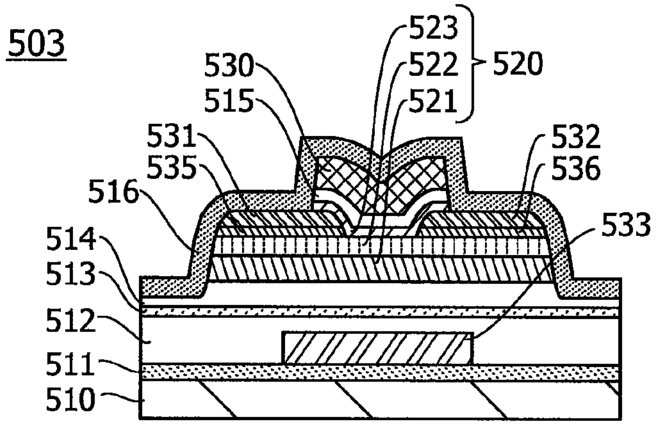

An OS transistor 503 in FIG. 18B has a device structure in which conductive layers 535 and 536 are added to the OS transistor 502. A pair of electrodes functioning as a source electrode and a drain electrode is formed using a stack of the conductive layers 531 and 535 and a stack of the conductive layers 532 and 536.

The conductive layers 535 and 536 are formed using a single-layer or multi-layer conductor. For example, it is possible to use a conductor containing at least one of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. The conductor may be an alloy or a compound, and for example, a conductor containing aluminum, a conductor containing copper and titanium, a conductor containing copper and manganese, a conductor containing indium, tin, and oxygen, or a conductor containing titanium and nitrogen may be used.

The conductive layers 535 and 536 may have a property of transmitting visible light. Alternatively, the conductive layers 535 and 536 may have a property of not transmitting visible light, ultraviolet light, infrared light, or X-rays by reflecting or absorbing it. In some cases, such a property can suppress a change in electrical characteristics of the OS transistor 503 due to stray light.

The conductive layers 535 and 536 may preferably be formed using a layer that does not form a Schottky barrier with the semiconductor layer 522 or the like. Accordingly, the on-state characteristics of the OS transistor 503 can be improved.

The conductive layers 535 and 536 preferably have higher resistance than the conductive layers 531 and 532 according to circumstances. The conductive layers 535 and 536 preferably have lower resistance than the channel (specifically, the semiconductor layer 522) of the OS transistor 503 according to circumstances. For example, the conductive layers 535 and 536 may have a resistivity of higher than or equal to 0.1 Ωcm and lower than or equal to 100 Ωcm, higher than or equal to 0.5 Ωcm and lower than or equal to 50 Ωcm, or higher than or equal to 1 Ωcm and lower than or equal to 10 Ωcm. The conductive layers 535 and 536 having a resistivity within the above range can reduce electric field concentration in a boundary portion between the channel and the drain. Therefore, a change in electrical characteristics of the OS transistor 503 can be suppressed. In addition, a punch-through current generated by an electric field from the drain can be reduced. Thus, a transistor with a small channel length can have favorable saturation characteristics. Note that in a circuit configuration where the source and the drain do not interchange, only one of the conductive layers 535 and 536 (e.g., the layer on the drain side) is preferably provided according to circumstances.

<<OS Transistor Structure Example 4>>

Figure 18C:
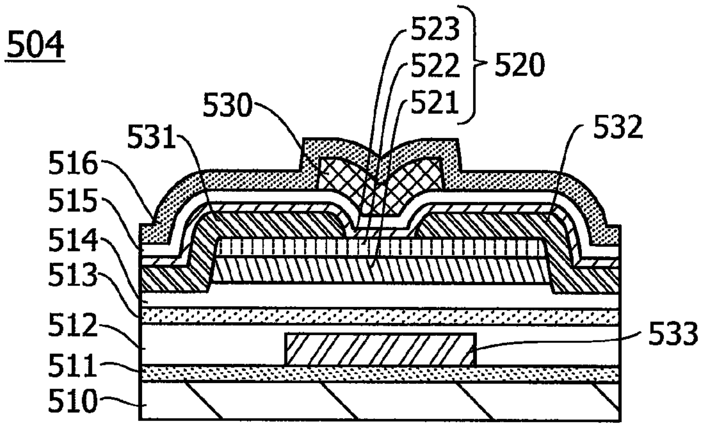

In the OS transistor 501 in FIGS. 16A to 16D, the conductive layers 531 and 532 may be in contact with side surfaces of the semiconductor layers 521 and 522. FIG. 18C illustrates such a structure example. In an OS transistor 504 in FIG. 18C, the conductive layers 531 and 532 are in contact with side surfaces of the semiconductor layers 521 and 522.

In the process of manufacturing the semiconductor device, the insulators, the conductors, and the semiconductors can be formed by a sputtering method, a chemical vapor deposition (CVD) method, a molecular beam epitaxy (MBE) method, an atomic layer deposition (ALD) method, a pulsed laser deposition (PLD) method, or the like. A CVD method includes a thermal CVD method, a metal organic CVD (MOCVD) method, and a plasma-enhanced CVD (PECVD) method. For example, it is preferred that an insulating film be formed by a CVD method, more preferably a PECVD method because coverage can be improved. In the case of using a CVD method, it is preferable to use a thermal CVD method, an MOCVD method, or an ALD method in order to reduce plasma damage. In the case of using a sputtering method, a facing-target sputtering device, a parallel plate sputtering device, or the like may be employed. For example, the semiconductor layer 522 in the semiconductor region 520 is preferably formed by a facing-target sputtering device.

<<PLD Structure Example>>

Figure 19:
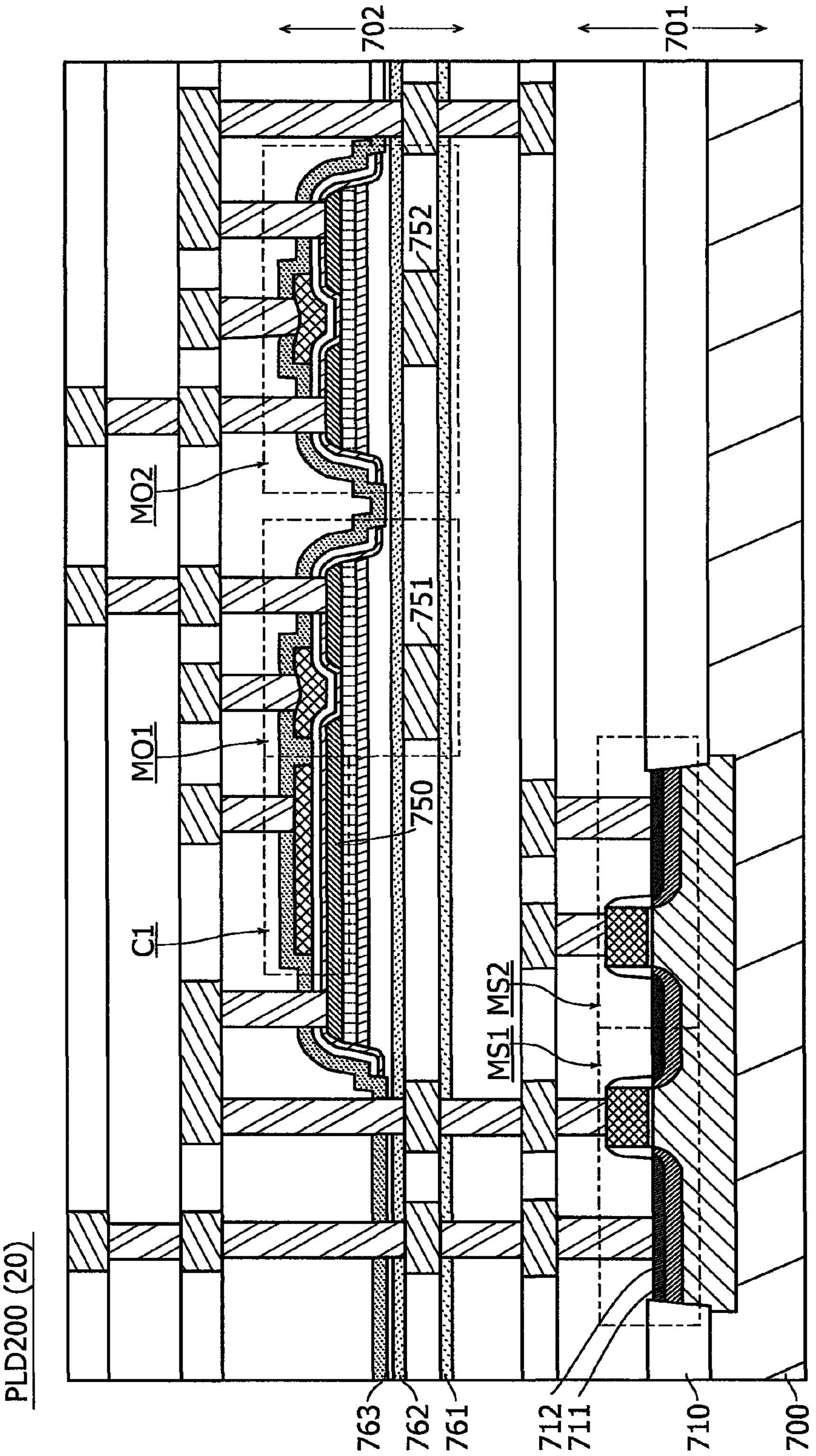
FIG. 19 is a cross-sectional view illustrating a structure example of a PLD.

An OS transistor can be stacked over an element layer in which a Si transistor and the like are formed. For example, the PLD 200 (FIG. 11) in Embodiment 1 can have a structure where a Si transistor and an OS transistor are stacked. FIG. 19 is a cross-sectional view showing the structure of the PLD 200. FIG. 19 illustrates the circuit 20 as a representative example. In FIG. 19, a region without a reference numeral or hatching is formed of an insulator, and a region with hatching and without a reference numeral is formed of a conductor.

The PLD 200 is formed on a single crystal silicon wafer 700. Element layers 701 and 702 are formed on a single crystal silicon wafer 700. The element layer 701 is a layer where Si transistors are formed. The element layer 702 is a layer where OS transistors and a capacitor are formed. In the example of FIG. 19, the transistors MS1 and MS2 are formed in the element layer 701, and the transistors MO1 and MO2 and the capacitor C1 are formed in the element layer 702.

In FIG. 19, a region without a reference numeral or hatching is formed of an insulator. A region with hatching and without a reference numeral is formed of a conductor and constitutes a wiring or an electrode. The elements formed in the element layers 701 and 702 are electrically connected by conductors so that the circuit structure shown in FIG. 3 is obtained.

A reference numeral 710 denotes an insulator for element isolation; 711 and 712, n-type impurity regions; 751 and 752, conductive layers serving as backgates of the transistors MO1 and MO2; 761 to 763, insulating layers.

The transistors MO1 and MO2 have the same device structure as the OS transistor 502 (FIG. 18A). The capacitor C1 is formed in the same process as the transistors MO1 and MO2. One electrode of the capacitor C1 is made of a conductive layer 750 of the transistor MO1, and the other electrode thereof is made of a conductive layer also used to form the gate electrode of the transistor MO1. Although not illustrated, the transistor MO3 is also formed in the element layer 702 like the transistor MO2.

Figure 20:
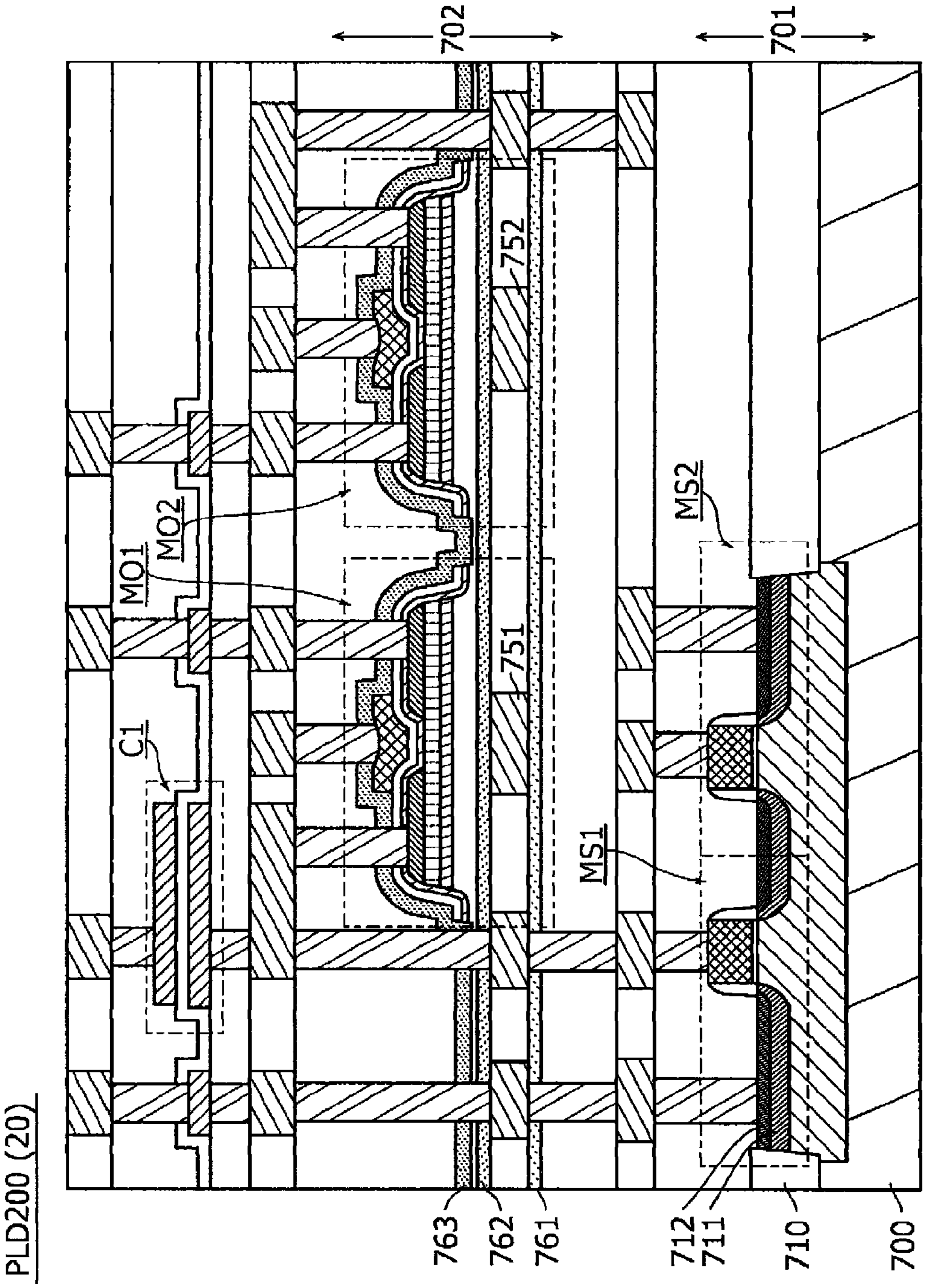
FIG. 20 is a cross-sectional view illustrating a structure example of a PLD.

When the capacitor C1 is formed in an element layer where the transistors MO1 and M02 are not formed, the area of the circuit 20 can be reduced while the retention time at the node N1 is maintained. FIG. 20 illustrates an example of such a structure. In the example of FIG. 20, the capacitor C1 is stacked over the element layer 702.

Figure 21A:
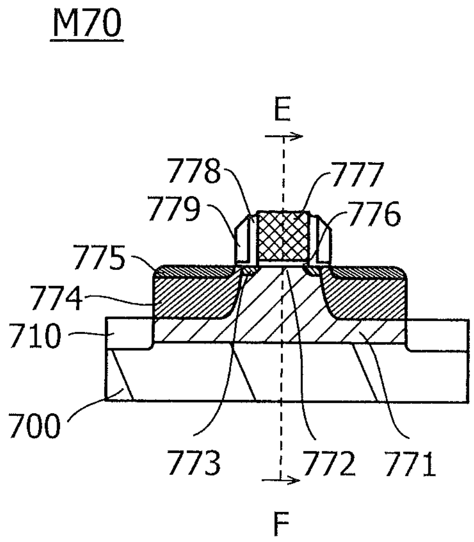
FIGS. 21A and 21B are cross-sectional views illustrating a structure example of a transistor.
Figure 21B:
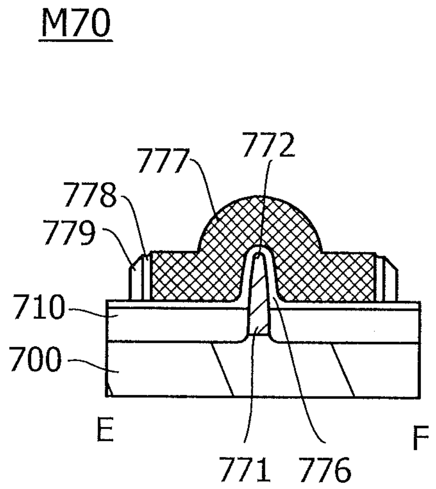

Although FIG. 19 and FIG. 20 show the examples where planar transistors are formed in the element layer 701, a transistor with a three-dimensional structure (e.g., a FIN transistor or a tri-gate transistor) may be formed. FIGS. 21A and 21B illustrate an example of a FIN transistor. FIG. 21A is a cross-sectional view of the transistor in the channel length direction. FIG. 21B is a cross-sectional view along the line E-F in FIG. 21A.

In a transistor M70 in FIGS. 21A and 21B, an active layer (also referred to as channel formation region) 772 has a projected portion, and a gate insulating layer 776 and a gate electrode 777 are provided along side surfaces and a top surface of the active layer 772. A reference numeral 771 denotes a well; 773, a low-concentration impurity region; 774, a high-concentration impurity region; 775, a conductive region; 778 and 779, sidewall insulating layers. Although FIGS. 21A and 21B show the case where the single crystal silicon wafer 700 is processed to form a projected portion, a semiconductor layer with a projected portion may be formed by processing of an SOI substrate.

Embodiment 3

<Structure of Oxide Semiconductor>

In this embodiment, a structure of an oxide semiconductor will be described below.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. Meanwhile, a structure that does not have long-range ordering but might have ordering in a range from an atom to the nearest neighbor atoms or to the second-nearest neighbor atom may be called an amorphous structure.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

A CAAC-OS is an oxide semiconductor having a plurality of c-axis-aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

The CAAC-OS observed with a TEM is described below. According to the high-resolution TEM image of the CAAC-OS observed in a direction substantially parallel to a sample surface, metal atoms are arranged in a layered manner in the pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

The high-resolution TEM image indicates that the CAAC-OS has a characteristic atomic arrangement, and that the size of one pellet is 1 nm or greater or 3 nm or greater and the size of a space caused by tilt of pellets is approximately 0.8 nm. Therefore, the pellet can be referred to as a nanocrystal (nc). Furthermore, the CAAC-OS can be referred to as an oxide semiconductor including c-axis-aligned nanocrystals (CANC).

A Cs-corrected high-resolution TEM image of a plane of the CAAC-OS observed from a direction substantially perpendicular to the sample surface shows that metal atoms are arranged in a triangular, quadrangular, or hexagonal configuration in a pellet. However, there is no regularity of arrangement of metal atoms between different pellets.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle (2θ) of around 31°. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear at 2θ of around 36°, in addition to the peak at 2θ of around 31°. The peak at 2θ of around 36° indicates that a crystal having no c-axis alignment is included in part of the CAAC-OS. It is preferred that in the CAAC-OS analyzed by an out-of-plane method, a peak appear at 2θ of around 31° and that a peak not appear at 2θ of around 36°.

On the other hand, in structural analysis of the CAAC-OS by an in-plane method in which an X-ray is incident on a sample in a direction substantially perpendicular to the c-axis, a peak appears at 2θ of around 56°. This peak is derived from the (110) plane of the $InGaZnO_4$ crystal. When the CAAC-OS is subjected to analysis (φ scan) with 2θ fixed at around 56° and with the sample rotated using a normal vector of the sample surface as an axis (φ axis), a peak is not clearly observed. In contrast, when a single crystal oxide semiconductor of $InGaZnO_4$ is subjected to φ scan with 2θ fixed at around 56°, six peaks that are derived from crystal planes equivalent to the (110) plane are observed. Accordingly, the structural analysis using XRD shows that a-axes and b-axes are irregularly oriented in the CAAC-OS.

Next, a CAAC-OS analyzed by electron diffraction is described. For example, when an electron beam with a probe diameter of 300 nm is incident on a CAAC-OS including an $InGaZnO_4$ crystal in the direction parallel to the sample surface, a diffraction pattern (also referred to as a selected-area transmission electron diffraction pattern) can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, a ring-like diffraction pattern is observed when an electron beam with a probe diameter of 300 nm is incident on the same sample in a direction perpendicular to the sample surface. Thus, the electron diffraction also indicates that the a-axes and b-axes of the pellets included in the CAAC-OS do not have regular alignment.

As described above, the CAAC-OS is an oxide semiconductor with high crystallinity. Entry of impurities, formation of defects, or the like might decrease the crystallinity of an oxide semiconductor. This means that the CAAC-OS has negligible amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, further preferably lower than $1\times10^{10}/cm^3$ and higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

An nc-OS has a region in which a crystal part is observed and a region in which a crystal part is not clearly observed in a high-resolution TEM image. In most cases, the size of a crystal part included in the nc-OS ranges from 1 nm to 10 nm or from 1 nm to 3 nm. An oxide semiconductor including a crystal part whose size is greater than 10 nm and less than or equal to 100 nm can be referred to as a microcrystalline oxide semiconductor. In a high-resolution TEM image of the nc-OS film, for example, a grain boundary is not clearly observed in some cases. Note that there is a possibility that the origin of the nanocrystal is the same as that of a pellet in a CAAC-OS; therefore, a crystal part of the nc-OS may be referred to as a pellet in the following description.

In the nc-OS, a microscopic region (e.g., a region with a size in the range of 1 nm and 10 nm, in particular, a region in the range of 1 nm and 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor by some analysis methods. For example, when the nc-OS is analyzed by an out-of-plane method using an X-ray beam having a diameter larger than the size of a pellet, a peak that shows a crystal plane is not detected. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases, or a plurality of spots are shown in a ring-like region in some cases.

Since there is no regularity of crystal orientation between the pellets (nanocrystals) as mentioned above, the nc-OS can also be referred to as an oxide semiconductor including random-aligned nanocrystals (RANC) or an oxide semiconductor including non-aligned nanocrystals (NANC).

The nc-OS is an oxide semiconductor having more regularity than an amorphous oxide semiconductor. Thus, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<A-Like OS>

An a-like OS has a structure between those of the nc-OS and an amorphous oxide semiconductor. In a high-resolution TEM image of the a-like OS, a void may be observed. Furthermore, in the high-resolution TEM image, there are a region where a crystal part is clearly observed and a region where a crystal part is not observed. The a-like OS has an unstable structure because it contains a void. Growth of the crystal part in the a-like OS may be induced by electron irradiation. In contrast, in the nc-OS and the CAAC-OS, growth of the crystal part is hardly induced by electron irradiation. That is, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor having a density of lower than 78% of the density of the single crystal oxide semiconductor layer.

For example, in the case of an oxide semiconductor having an atomic ratio of In:Ga:Zn=1:1:1, the density of single crystal $InGaZnO_4$ with a rhombohedral crystal structure is 6.357 g/cm$^3$. Accordingly, the density of an a-like OS having an atomic ratio of In:Ga:Zn=1:1:1 is higher than or equal to 5.0 g/cm$^3$ and lower than 5.9 g/cm$^3$. For example, the density of an nc-OS and a CAAC-OS each having an atomic ratio of In:Ga:Zn=1:1: is higher than or equal to 5.9 g/cm$^3$ and lower than 6.3 g/cm$^3$.

Note that single crystals with the same composition do not exist in some cases. In that case, single crystals with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked film including at least two films of an amorphous oxide semiconductor, an a-like OS, an nc-OS, and a CAAC-OS, for example.

Example 1

Embodiment 1 discloses overdriving utilizing the fact that an OS transistor can form a floating node achieving an ideal charge retention function. The present inventors designed and fabricated an FPGA using OS transistors (OS FPGA). This example will show that an OS FPGA is suitable for subthreshold voltage driving.

<<I. Introduction>>

Systems providing a large number of sensor devices have been suggested as sensor networks. Devices for such a system are expected to perform ultralow-voltage and ultralow-power operation in a standby state with the use of energy harvesting from natural resources in order to eliminate the need for maintenance such as battery replacement and to enhance maintainability.

Various ASICs using special standard cells and libraries based on a special design policy have been proposed as devices for ultralow-voltage operation. An ASIC designed to be driven at ultralow voltage and ultralow power has a hardware configuration specialized for a particular application; thus, when being used as a sensor network device, the ASIC cannot be used for applications other than the intended one. Moreover, there is a demand for various kinds of devices that enables operations unique to a sensor network, i.e., ultralow-voltage and ultralow-power operation in a standby state and high-performance operation in signal processing. Consequently, an FPGA, in which the circuit configuration can be flexibly changed to accommodate various processing requests, is considered an optimal device for building sensor networks (Non-Patent Document 1).

However, an FPGA cannot be driven at ultralow voltage by using only a design scheme similar to that of an ASIC. For example, it is necessary to eliminate a threshold voltage (Vth) drop and static leakage current due to a low $I_{on}/I_{off}$ ratio (a low ratio of on-state current to off-state current) in a pass transistor in a routing switch; they cause the decrease in signal potential, leading to incorrect data transfer (Non-Patent Document 4). To operate an FPGA at ultralow voltage, it was suggested to use a tri-state buffer as a routing switch instead of a pass transistor to prevent a Vth drop of the signal potential; however, this method has the problem of increased circuit area and power consumption. In addition, it was proposed to use a transistor with high threshold voltage to lower $I_{off}$ for the sake of decreasing static leakage current due to a low $I_{on}/I_{off}$ ratio (Non-Patent Document 4);

however, since $I_{on}$ is also decreased, circuit optimization for achieving ultralow-voltage operation is difficult. Consequently, further improvements are required to achieve ultralow-voltage driving.

Example 1 proposes an OS FPGA appropriate for subthreshold operation, particularly a method for achieving ultralow-voltage driving with overdriving using OS transistors. To use a floating node with an ideal charge retention function achieved by an OS transistor, OS transistors are used in nonvolatile configuration memory, a programmable routing switch (PRS) that controls connection between PLEs, and a programmable power switch (PPS) that performs fine-grained power gating.

In the PRS, a gate of an n-channel Si transistor (nch-Si transistor) serving as a pass transistor, which suffers from a Vth drop, is set as a floating gate, and overdriving to increase the potential of the floating gate is performed. In the PPS, a gate of a p-channel Si transistor (pch-Si transistor) controlling supply of a high power supply potential to the PLE is set as a floating gate, and overdriving to decrease the potential of the floating gate is performed. Thus, the PRS and the PPS can be driven with a high $I_{on}/I_{off}$ ratio and are expected to operate stably at ultralow voltage. In this structure, the supply of an overdrive potential is not constantly required because the overdrive potential is retained by the floating gate using an OS transistor with an ultralow leakage current as a write control transistor; thus, the power necessary to retain the potential of the floating gate is minimized. In PPS overdriving, a negative overdrive potential can be generated at the floating gate without a negative power source, leading to a simpler circuit structure and lower power consumption.

The outline of Example 1 is as follows. Section II considers design issues for subthreshold operation and explains the method and features of overdriving of the proposed PRS and PPS disclosed in this example. Section II shows the system structure and operation of the OS FPGA of this example. Section IV provides evaluation results of functions of the fabricated OS FPGA chip and examines these results. Section V concludes Example 1.

<<II. Low-Voltage Design of OS FPGA>>

This section will explain low-voltage design of an OS FPGA.

<II-A. OS FPGA Design Issues>

Figure 22:
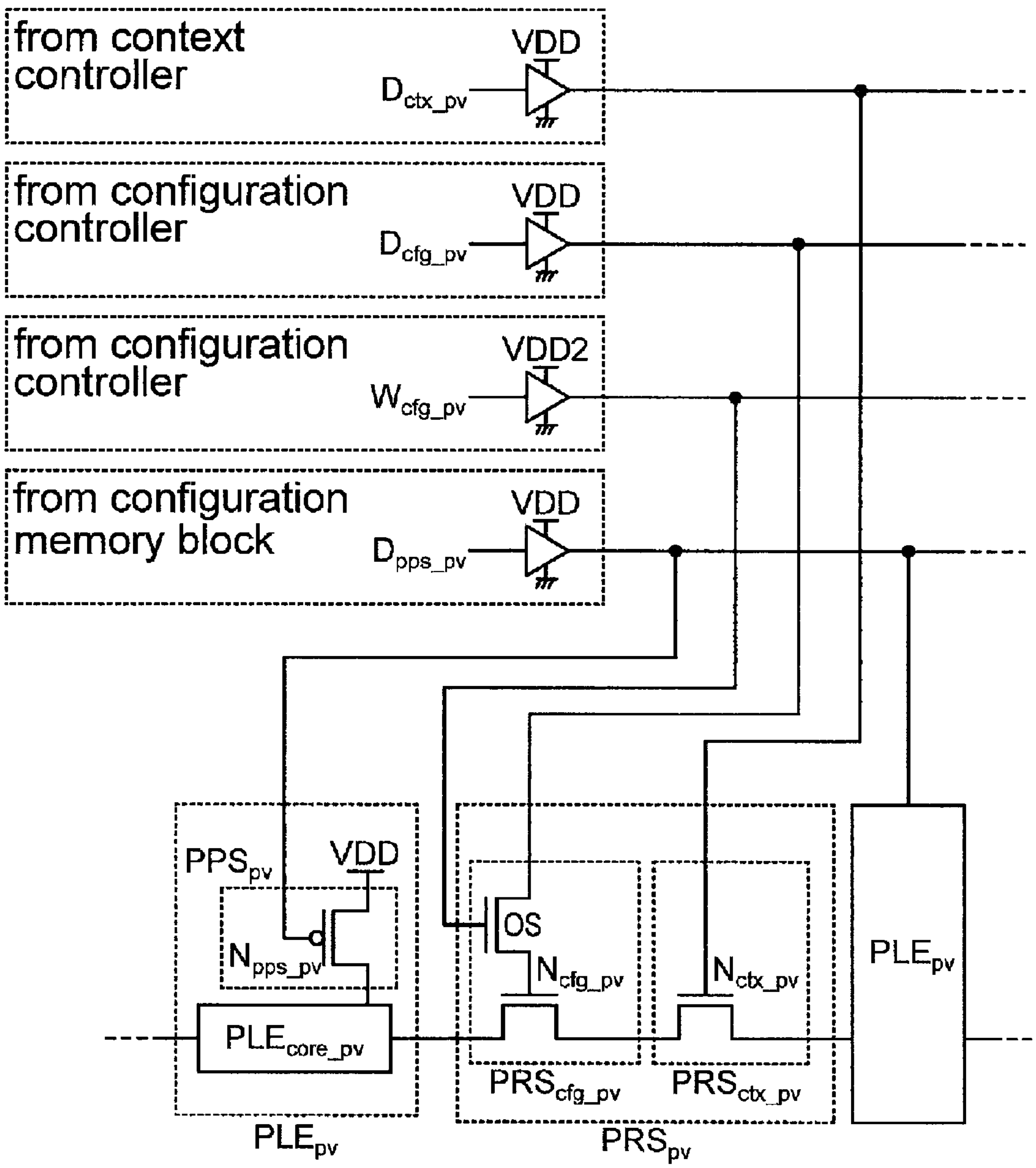
FIG. 22 is a circuit diagram illustrating main components of the previous OS FPGA.

First, design issues for subthreshold operation will be described with an OS FPGA (hereinafter referred to as the previous OS FPGA) that the present inventors designed prior to the OS FPGA proposed in Example 1 (hereinafter referred to as the present OS FPGA) as a basis. FIG. 22 illustrates the circuit structure of the previous OS FPGA, focusing on a programmable routing switch and a programmable power switch.

Note that in drawings used in Example 1, a transistor with the term "OS" is an OS transistor and a transistor without the term "OS" is a Si transistor. In Example 1, an oxide semiconductor used in an OS transistor is CAAC In—Ga—Zn oxide. Here, such an OS transistor containing In—Ga—Zn oxide is referred to as an IGZO transistor.

The previous OS FPGA illustrated in FIG. 22 includes a programmable logic element ($PLE_{pv}$), a routing switch ($PRS_{pv}$) including an nch-Si transistor, a context controller, and a configuration controller.

$PRS_{pv}$ includes two programmable routing switches ($PRS_{cfg\_pv}$, $PRS_{ctx\_pv}$) and achieves a multi-context function by including $PRS_{ctx\_pv}$. $PRS_{cfg\_pv}$ includes an OS transistor, an nch-Si transistor, and a node $N_{cfg\_pv}$ and is controlled with the potential of the node $N_{cfg\_pv}$. The node $N_{cfg\_pv}$ is a node for retaining configuration data ($D_{cfg\_pv}$). The OS transistor is controlled with a write signal ($W_{cfg\_pv}$). $PRS_{ctx\_pv}$ includes an nch-Si transistor and a node $N_{ctx\_pv}$ and is controlled with the potential of the node $N_{ctx\_pv}$. The node $N_{ctx\_pv}$ is a node for retaining configuration data ($D_{ctx\_pv}$).

$PLE_{pv}$ includes a PLE core ($PLE_{core\_pv}$) and a programmable power switch ($PPS_{pv}$). A fine-grained power gating function is achieved by controlling $PPS_{pv}$. The power supply voltage of $PLE_{core\_pv}$ is VDD. $PPS_{pv}$ includes a pch-Si transistor and a node $N_{pps\_pv}$ and is controlled with the potential of the node $N_{pps\_pv}$. The node $N_{pps\_pv}$ is a node for retaining PPS data ($D_{pps\_pv}$).

Various control signals for $PRS_{pv}$ are generated in the configuration controller and the context controller. A control signal for $PPS_{pv}$ is supplied from a configuration memory block. The power supply voltage of these circuits is VDD. Moreover, buffers for these control signals are provided. The power supply voltage of the buffers for $D_{ctx\_pv}$, $D_{cfg\_pv}$, and $D_{pps\_pv}$ is VDD. The power supply voltage of the buffer for $W_{cfg\_pv}$ is VDD2 that is higher than VDD. This is because a threshold voltage of the OS transistor is higher than that of the nch-Si transistor.

Design policies (Non-Patent Documents 5 and 6) applicable to general subthreshold operation, including for ASICs, especially limitation of the number of transistor stacks, are employed for our PLE design. Here, the maximum number of transistor stacks is limited to two (Non-Patent Document 5). In the previous design, a standard cell library including NOT, 2-input NAND, 2-input NOR, and a register configured with these gate circuits was employed.

As problems specific to an FPGA, there is a need for countermeasures against a Vth drop and static leakage current due to the low $I_{on}/I_{off}$ ratio of a pass transistor in the PRS (PRS issue). In the previous OS FPGA, a Vth drop in $PRS_{pv}$ can be suppressed by boosting with capacitive coupling between an input signal line and the node $N_{cfg\_pv}$ in $PRS_{cfg\_pv}$. However, the boosting effect is insufficient because the amplitude of the input signal decreases in subthreshold operation; therefore, further countermeasures are necessary. Mechanisms for correct signal transmission are also required for $PRS_{ctx\_pv}$.

Furthermore, in order to maintain the key technologies for decreasing power consumption in the previous OS FPGA, such as a fine-grained power gating function, a context switch function, and a shadow register (SR), the following issues must be resolved even in subthreshold operation.

First, the addition of a PPS required for fine-grained power gating results in a substantial increase in the number of transistor stacks, meaning that there must be some mechanism to maintain $I_{on}$ (PPS issue). Second, to obtain a fast context switch (FCS) function, mechanisms to avoid a Vth drop of the signal potential in routing switches like the PRS are necessary (FCS issue). Third, to obtain a function of the shadow register (SR), it is necessary to resolve both the issue of a Vth drop in the retention potential of a storage transistor and the issue of an $I_{on}$ reduction of a load transistor (SR issue).

<II-B. Overdrive Architecture>

Overdriving is employed to solve the PRS and PPS issues described in Section II-A. In the structure of FIG. 22, overdriving can be executed by writing positively overdriven high-potential configuration data to $PRS_{cfg\_pv}$, a positively overdriven high-potential context selection signal to $N_{ctx\_pv}$ of $PRS_{ctx\_pv}$, and a negatively overdriven low-potential signal to $N_{pps\_pv}$ of $PPS_{pv}$. This scheme requires a high potential circuit for generating a context selection signal and also a circuit for generating a negative-potential signal. This leads to the inevitable decrease in the energy efficiency of voltage conversion and increase in power consumption.

In view of the above, to solve the PRS and PPS issues, Example 1 employs overdriving with a floating node that has an ideal charge retention function produced using an OS transistor. In the driving method of this example, the gates to be overdriven in the PRS and PPS are set as floating gates, and circuits for generating a high-potential signal are active only when data at the gates are to be updated. The gate and the OS transistor form nonvolatile analog memory that requires ultralow power for retaining overdrive voltage, which is effective in employing the driving method.

Figure 23:
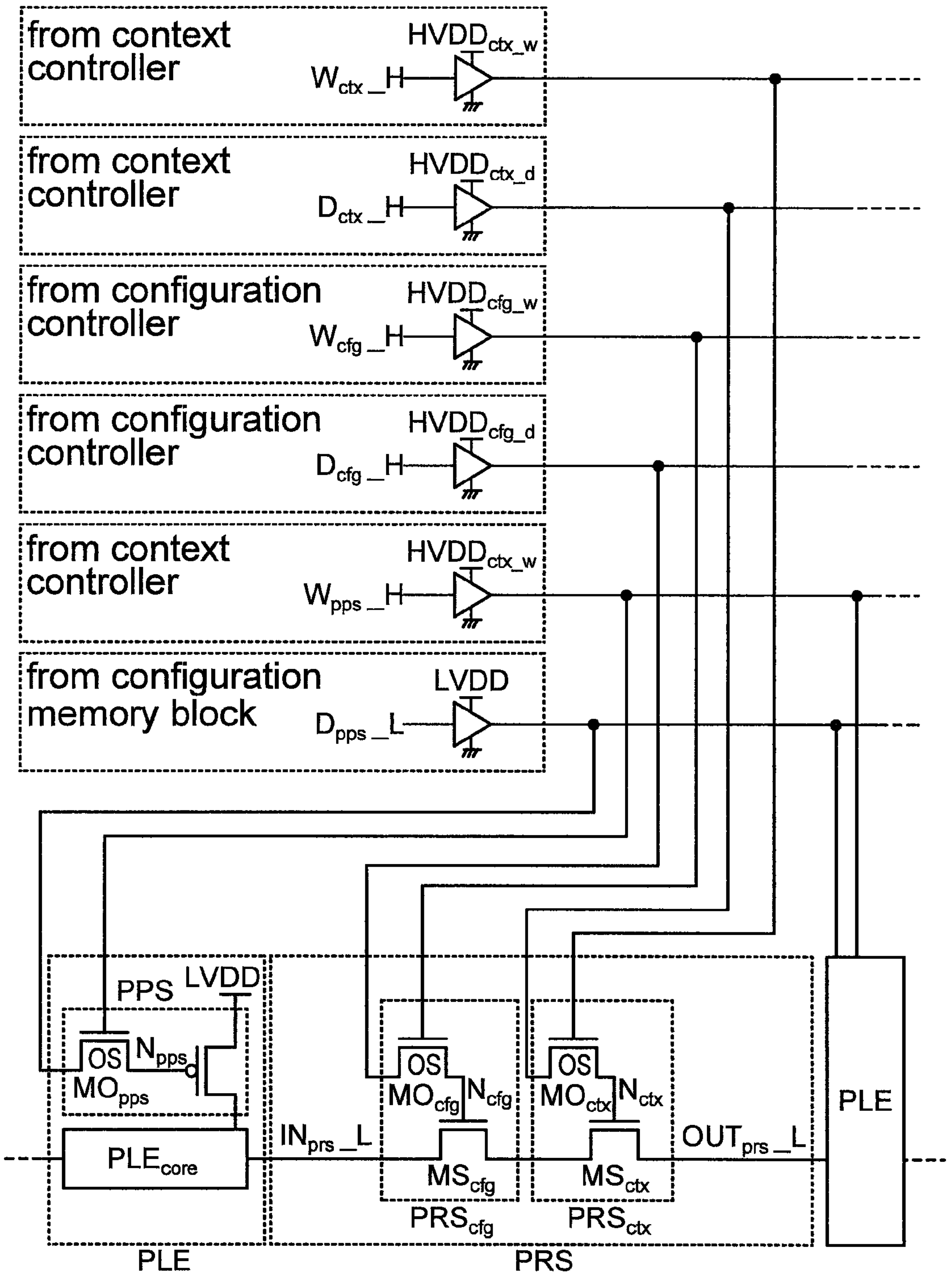
FIG. 23 is a circuit diagram illustrating main components of the present OS FPGA.

FIG. 23 illustrates main components of the OS FPGA of this example. The present OS FPGA in FIG. 23 includes a PLE, a PRS, a context controller, a configuration controller, and a configuration memory block. The PLE includes a PLE core ($PLE_{core}$) and a PPS. The PRS includes $PRS_{cfg}$ and $PRS_{ctx}$. $IN_{prs}$_L and $OUT_{prs}$_L are an input node and an output node of the PRS. $PRS_{cfg}$, $PRS_{ctx}$, and the PPS correspond to a configuration memory, context memory, and memory for storing PPS data (PPS memory), respectively.

$PRS_{cfg}$ includes an OS transistor ($MO_{cfg}$), a pass transistor ($MS_{cfg}$) with high Vth, and a node ($N_{cfg}$). A write signal ($W_{cfg}$_H) and configuration data ($D_{cfg}$_H) are input to $MO_{cfg}$ from the configuration controller. $PRS_{ctx}$ includes an OS transistor ($MO_{ctx}$), a pass transistor ($MS_{ctx}$) with high Vth, and a node ($N_{ctx}$). A write signal ($W_{ctx}$_H) and context data ($D_{ctx}$_H) are input to $MO_{ctx}$ from the context controller. $D_{cfg}$_H is written to $N_{cfg}$, and $D_{ctx}$_H is written to $N_{ctx}$. The conduction state of the PRS is controlled with the potentials of $D_{cfg}$_H and $D_{ctx}$_H.

LVDD is the power supply voltage of $PLE_{core}$. The PPS includes a pch-Si transistor, an OS transistor ($MO_{pps}$), and a node ($N_{pps}$) and controls LVDD supply to $PLE_{core}$. The pch-Si transistor is a power switch and its on/off state is controlled with PPS data ($D_{pps}$_L) supplied to $N_{pps}$. $D_{pps}$_L is input to the PPS from the configuration memory block.

The present OS FPGA includes three power domains: an input/output (IO) domain, an HVDD domain, and an LVDD domain. Note that "_H" and "_L" that are put at the end of reference signs mean that elements belong to the HVDD domain and LVDD domain or signals are generated in the HVDD domain and LVDD domain.

The present OS FPGA is provided with buffers for data signals and buffers for write signals. These buffers operate with the power supply voltages of the corresponding circuits. The power supply voltage of the configuration controller is $HVDD_{cfg}$ ($HVDD_{cfg\_w}$ for a write signal, $HVDD_{cfg\_d}$ for a data signal). The power supply voltage of the context controller is $HVDD_{ctx}$ ($HVDD_{ctx\_w}$ for a write signal, $HVDD_{ctx\_d}$ for a data signal). $HVDD_{cfg}$ and $HVDD_{ctx}$ are higher than LVDD. The power supply voltages for data signals ($HVDD_{cfg\_d}$, $HVDD_{ctx\_d}$) are set higher than LVDD in consideration of overdrive voltage, and the power supply voltages for write signals ($HVDD_{cfg\_w}$, $HVDD_{ctx\_w}$) are set higher than the power supply voltages for data signals in consideration of Vth of $MO_{cfg}$ and $MO_{ctx}$. Thus, variations in write potentials can be suppressed. Both the FCS issue and the SR issue are resolved by PRS and PPS overdriving. The detailed operations of the PRS and PPS in Example 1 are shown below.

(PRS Overdriving)

Figure 24:
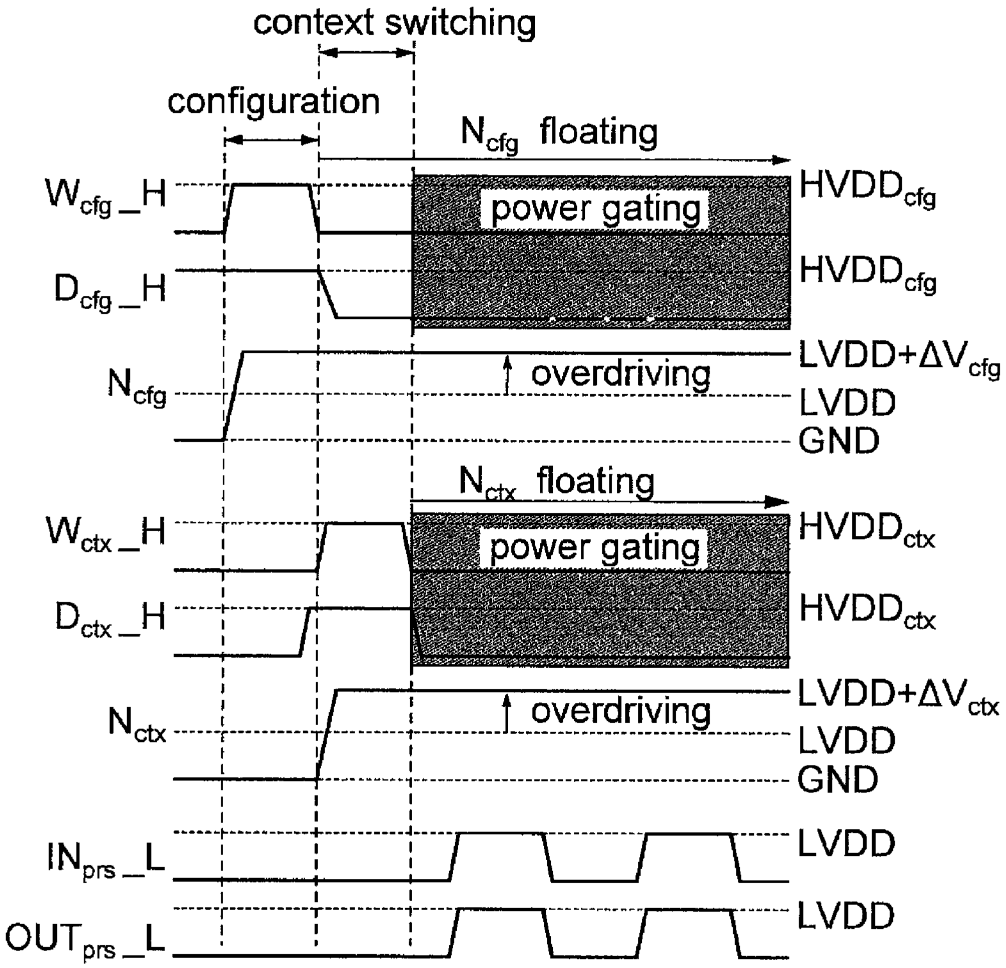
FIG. 24 is a timing chart showing overdriving of a programmable routing switch (PRS)

FIG. 24 is a timing chart for PRS overdriving. Configuration operation is executed by writing configuration data ($D_{cfg}$_H) to a configuration memory ($PRS_{cfg}$) during configuration ($W_{cfg}$_H="H"). The potential of $N_{cfg}$ becomes LVDD+$\Delta V_{cfg}$ or GND, where $\Delta V_{cfg}$ is an overdrive voltage for the configuration memory ($PRS_{cfg}$). The configuration memory performs only a simple operation of writing a potential to a capacitor, and thus has a wide operating margin for rewrite and data retention and easily operates in a correct manner at ultralow voltage unlike SRAM.

At the completion of configuration and during context switching, $W_{ctx}$_H is set to "H" so that context data ($D_{ctx}$_H) is written to a context memory ($PRS_{ctx}$). The potential of $N_{ctx}$ becomes LVDD+$\Delta V_{ctx}$ or LVDD, where $\Delta V_{ctx}$ is an overdrive voltage for the context memory ($PRS_{ctx}$). The conduction state of the PRS is determined in accordance with configuration data of a selected context.

When $MO_{cfg}$ is turned off ($W_{cfg}$_H="L") after configuration data is written to the configuration memory, $N_{cfg}$ becomes a floating node and retains high-potential data (LVDD+$\Delta V_{cfg}$/GND). The same applies to the context memory; when $MO_{ctx}$ is turned off ($W_{ctx}$_H="L"), $N_{ctx}$ becomes a floating node and retains high-potential data (LVDD+$\Delta V_{ctx}$/GND). Since the leakage current of $MO_{cfg}$ and $MO_{ctx}$ is extremely low, $N_{cfg}$ and $N_{ctx}$ can be ideal floating nodes with little change in potential; thus, the configuration memory and context memory operate as non-volatile analog memory.

To turn on $MS_{cfg}$, the high voltage LVDD+$\Delta V_{cfg}$ is input to the $MS_{cfg}$ gate, whereby $MS_{cfg}$ is overdriven. The same applies to $MS_{ctx}$; $MS_{ctx}$ is overdriven when LVDD+$\Delta V_{ctx}$ is input to its gate. The overdriving keeps the $I_{on}/I_{off}$ ratio of the pass transistors ($MS_{cfg}$, $MS_{ctx}$) high, so that the potential of an output signal ($OUT_{prs}$_L) of the PRS does not decrease.

Since the configuration memory and context memory are regarded as nonvolatile analog memory, power required for data retention (i.e., for retaining the overdrive voltage at the floating gate) is low. In the configuration memory, by setting $W_{cfg}$_H and $D_{cfg}$_H low, $MO_{cfg}$ is turned off and $N_{cfg}$ is made floating. Meanwhile, in the context memory, by setting $W_{ctx}$_H and $D_{ctx}$_H low, $MO_{ctx}$ is turned off and $N_{ctx}$ is made floating. As a result, the power supply voltage is supplied to the configuration controller and context controller only in a period of writing configuration data and context data, and the HVDD domain can be power gated in other periods. Accordingly, power consumption can be effectively reduced.

The signal lines for $W_{cfg}$_H and $W_{ctx}$_H are provided with a pull-down OS transistor that becomes active during power gating. Thus, the potentials of these signal lines are kept at GND during power gating, and the off states of $MO_{cfg}$ and $MO_{ctx}$ are reliably maintained. Because of its ultralow $I_{off}$, the pull-down OS transistor causes a negligibly small effect on these signal lines when it is inactive.

(PPS Overdriving)

Figure 25:
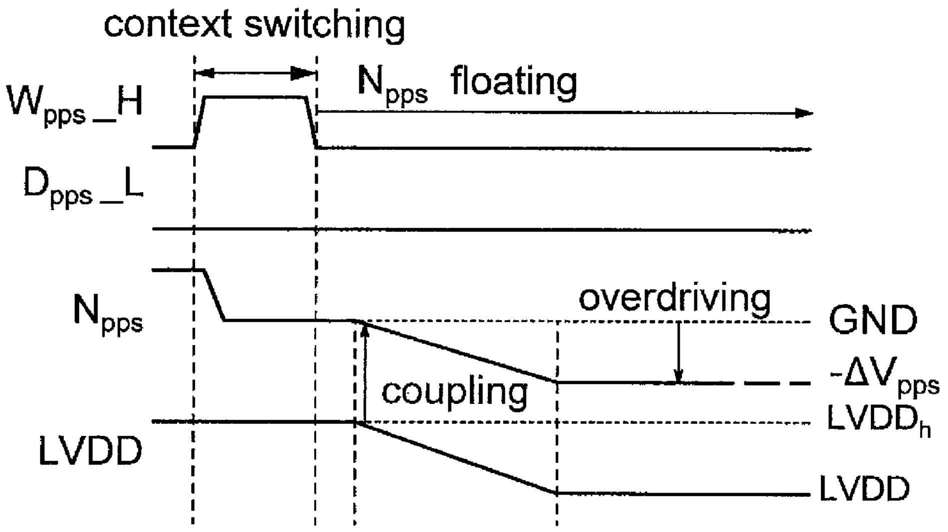
FIG. 25 is a timing chart showing overdriving of a programmable power switch (PPS)

FIG. 25 is a timing chart of PPS overdriving. At the completion of configuration and during context switching, $W_{pps}$_H is set to "H" so that PPS data ($D_{pps}$_L) is written to the PPS. The potential of $N_{pps}$ is LVDD or GND.

When $MO_{pps}$ is turned off by setting $W_{pps}$_H to "L" after the PPS data is written to the PPS, $N_{pps}$ becomes a floating node and retains a potential ($LVDD_h$/GND). FIG. 25 shows an example where the potential of $D_{pps}$_L is GND; that is, the potential of $N_{pps}$ becomes GND. Here, the voltage of the LVDD domain is decreased from the high potential ($LVDD_h$) to the low potential (LVDD), whereby the potential of $N_{pps}$ is decreased by capacitive coupling through parasitic capacitance between $N_{pps}$ (the gate of the pch-Si transistor) and the LVDD power supply node. At the time of decreasing the voltage of the LVDD domain, when the potential of $N_{pps}$ is $LVDD_h$, the pch-Si transistor is off; thus, capacitive coupling between the LVDD power supply node and $N_{pps}$ is small and the potential of $N_{pps}$ is hardly changed. In contrast, when the potential of $N_{pps}$ is GND, the potential of $N_{pps}$ is greatly changed because the capacitive coupling is large.

In other words, the pch-Si transistor in the PPS can be overdriven without providing a power supply circuit for generating negative voltage. When $MO_{pps}$, which is the OS transistor, is turned off by setting $W_{pps\_}H$ to "L" after overdriving, $N_{pps}$, becomes a floating node and can retain data ($LVDD_h$/$-\Delta V_{pps}$, where $\Delta V_{pps}$ is the PPS overdrive voltage).

With the overdriving, the pch-Si transistor maintains a high $I_{on}/I_{off}$ ratio and has favorable switching characteristics. Since the PPS is regarded as nonvolatile analog memory, power required for data retention (i.e., for retaining the overdrive voltage at the floating gate) is low. Furthermore, low power consumption is achieved because the voltage of the LVDD domain is set high (LVDD) only in a period of updating context data and can be set low in other periods.

As seen from the calculation result (FIG. 2B) of the ring oscillator RO5 described in Embodiment 1, the operating performance in low-voltage driving is greatly improved when the gate potential of the pch-Si transistor is changed from 0 V to a slight negative potential. That is, the overdriving disclosed in this specification is advantageous to subthreshold operation.

(Verification of Overdriving)

Effects of the PRS overdriving and PPS overdriving were verified with SPICE simulation. Verification was performed on a seven-stage PRS ring oscillator (RO7$_{prs}$) composed of seven pairs of PLEs and PRSs connected to form a loop without using a PPS, a seven-stage PPS ring oscillator (RO7$_{pps}$) composed of seven PLEs connected to form a loop without using a PRS, and a seven-stage ring oscillator (RO7$_{nor}$) composed of only seven 2-input NORs connected to form a loop. In RO7$_{prs}$ and RO7$_{pps}$, $PLE_{core}$ functions as a 2-input NOR.

Figures 26A, 26B:
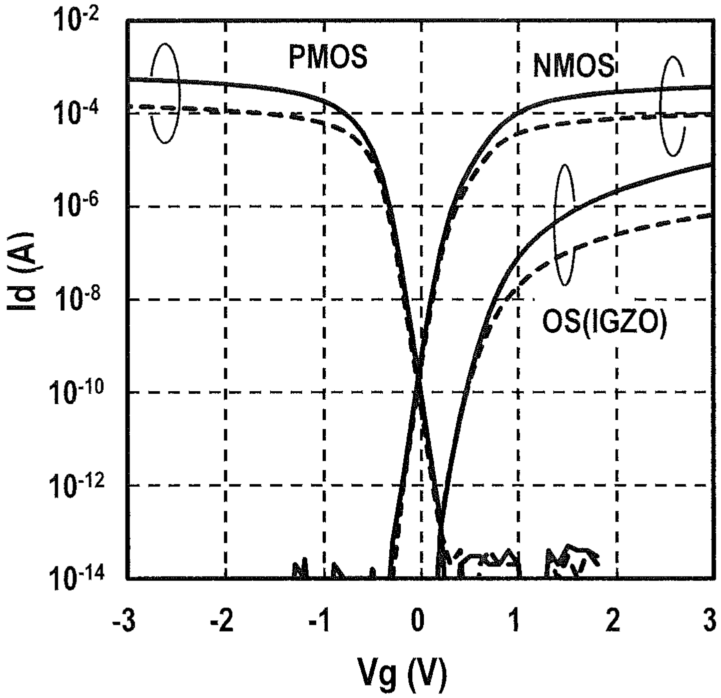
FIG. 26A shows characteristics of an OS transistor and Si transistors.
FIG. 26B shows the specifications of the OS transistor and the Si transistors.

In the calculation, parameters of an IGZO transistor, nch-Si transistor (NMOS), and pch-Si transistor (PMOS) that are based on a 0.8-μm OS/0.18-μm CMOS hybrid process were used. FIG. 26A shows drain current-gate voltage (Id-Vg) characteristics of the IGZO transistor, nch-Si transistor, and pch-Si transistor based on the above process. FIG. 26B shows the specifications of these transistors.

In FIG. 26B, Vd is a drain voltage at the time of measuring the Id-Vg characteristics, and Icut (cutoff current) is Id at Vg of 0 V. Since Icut of the IGZO transistor is less than $1\times10^{-13}$ A, the IGZO transistor is suitable for analog memory, which needs favorable charge retention. A logic circuit, which is required to operate at high speed, is composed of the nch-Si transistor and pch-Si transistor.

Figure 27A:
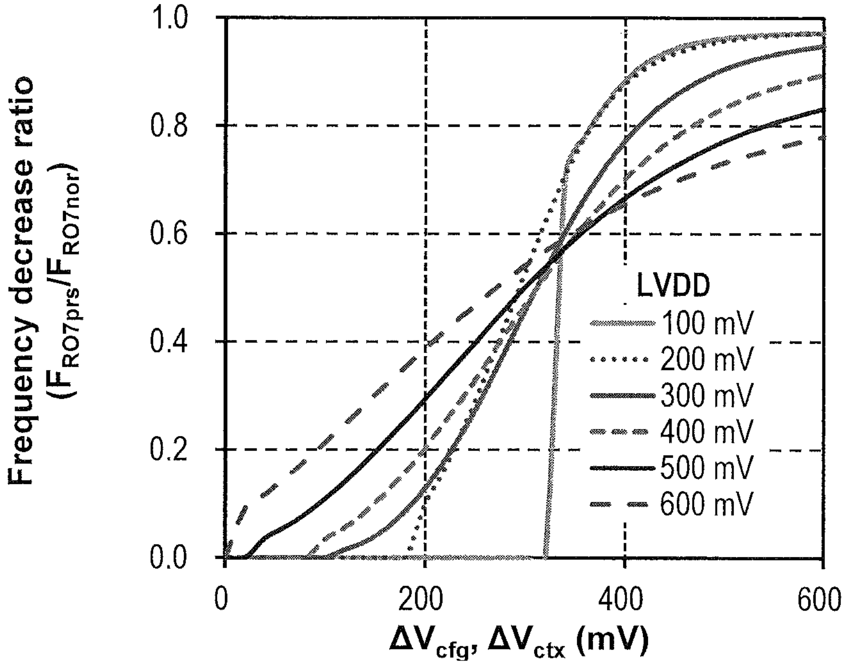
FIGS. 27A and 27B show frequency dependence of a seven-stage ring oscillator, estimated by SPICE simulation.
Figure 27B:
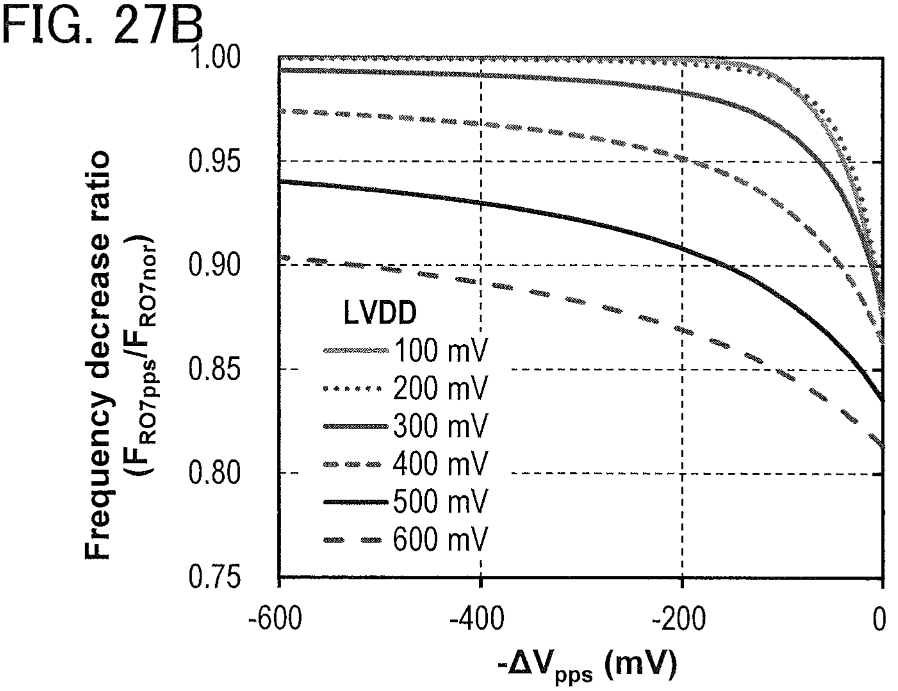

FIG. 27A shows $\Delta V_{cfg}$ and $\Delta V_{ctx}$ dependence of $F_{RO7prs}$ and $F_{RO7nor}$ and FIG. 27B shows $-\Delta V_{pps}$ dependence of $F_{RO7prs}$ and $F_{RO7nor}$; these dependences were estimated by SPICE simulation. $F_{RO7prs}$ is the oscillation frequency of RO7$_{prs}$, $F_{RO7pps}$ is that of RO7$_{pps}$, and $F_{RO7nor}$ is that of RO7$_{nor}$. $F_{RO7prs}/F_{RO7nor}$ and $F_{RO7pps}/F_{RO7nor}$ each represent a frequency decrease ratio. Here, LVDD ranges from 100 mV to 600 mV in increments of 100 mV.

From FIG. 27A, $F_{RO7prs}/F_{RO7nor}$ is dramatically improved at LVDD of 200 mV or lower and $\Delta V_{cfg}$ and $\Delta V_{ctx}$ of 400 mV or higher, and reaches 0.9.

From FIG. 27B, at LVDD of 300 mV or lower, $F_{RO7pps}/F_{RO7nor}$ exceeds 0.9 and the frequency characteristics of RO7$_{pps}$ are improved. In RO7$_{pps}$, the number of transistor stacks is three because of the addition of the PPS. However, even in 200-mV subthreshold operation, PPS $I_{on}$ due to overdriving at $-\Delta V_{pps}$ of −100 mV enables RO7$_{pps}$ to have driving capability equivalent to a CMOS circuit where the number of transistor stacks is two.

This improvement in frequency characteristics is due to the fact that overdriving makes the resistance of each switch negligibly small with respect to gate output delay. Although there is a concern relating to power increase caused by the high potential used for configuration data update, the overhead power is less than or equal to 0.17%, as will be shown in Section IV-B. In other words, the PRS overdriving and PPS overdriving are highly efficient for subthreshold operation.

From these results, LVDD was estimated at 200 mV as an operating voltage that can be easily supplied by energy harvesting, and the present inventors target $\Delta V_{cfg}$ and $\Delta V_{ctx}$ of 400 mV and $-\Delta V_{pps}$ of −100 mV in order to develop a structure where approximately 10% of the frequency decrease due to the effect of the PRS and PPS is permissible.

<<III. Circuit Design of OS FPGA>>

In this section, the present OS FPGA designed based on the aforementioned design policy will be described.

<II-A. Structure of OS FPGA>

Figure 28:
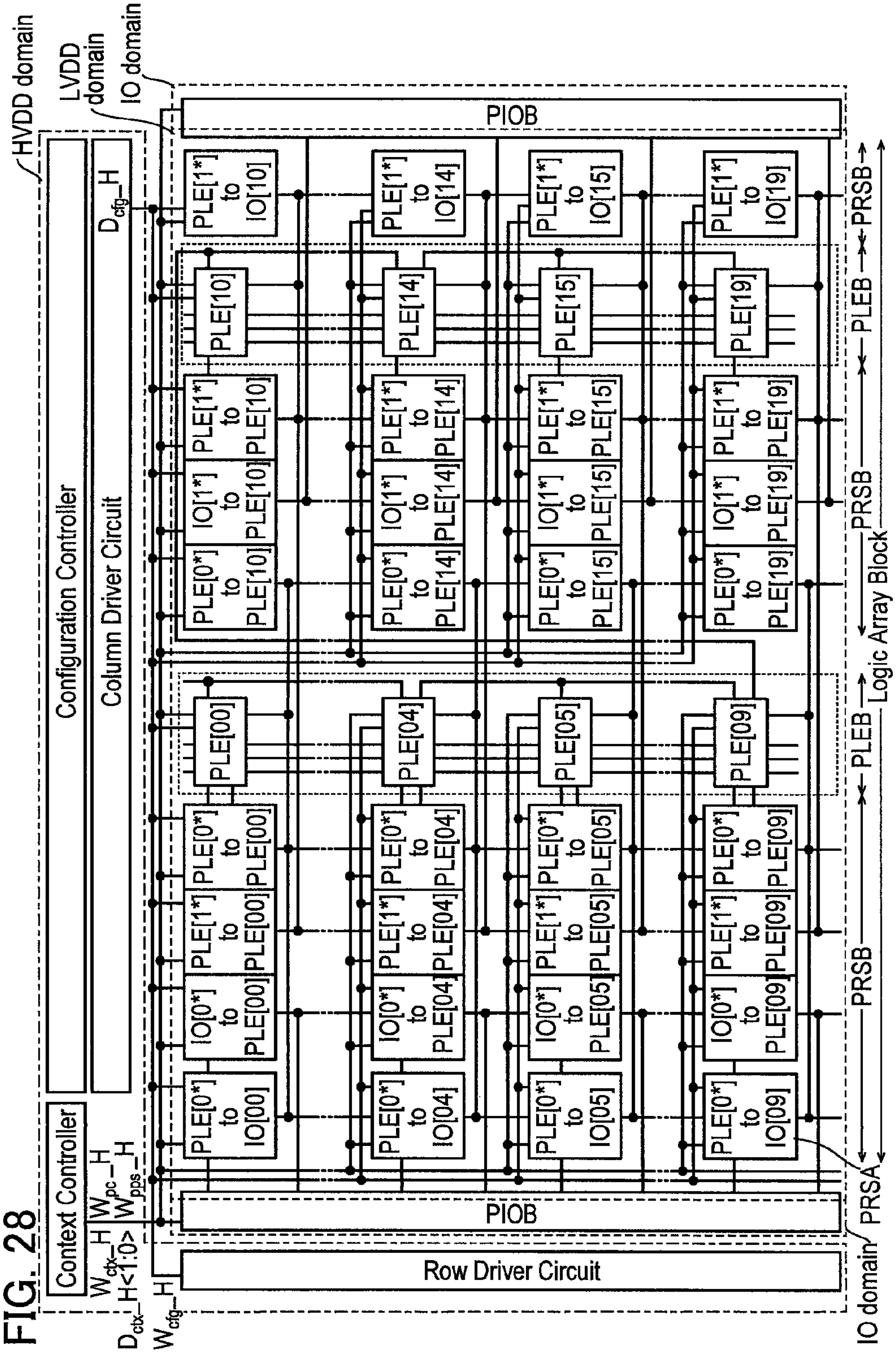
FIG. 28 is a block diagram of the present OS FPGA.

FIG. 28 is a block diagram illustrating a structure of the present OS FPGA. The present OS FPGA conforms to multi-context, and the number of contexts is two.

The IO domain has a high-potential domain of an input/output block (PIOB) including a plurality of programmable IO circuits. The HVDD domain has a configuration controller (including a row driver circuit and a column driver circuit) and a context controller. The LVDD domain has a logic array block and a low-potential region of the PIOB.

The logic array block includes two PLE blocks (PLEBs) and three PRS blocks (PRSBs). Each PLEB includes ten PLEs. Each PRSB includes a plurality of PRS arrays (PRSAs). The PRSA is a routing switch including a plurality of PRSs. An expression written in a block representing the PRSA represents a function of the PRSA. For example, "PLE[0*] to IO[00]" means that the PRSA has a function of controlling electrical continuity between output nodes of PLE[00] to PLE[09] and an input node of an input/output circuit IO[00].

(PRS)

Figure 29:
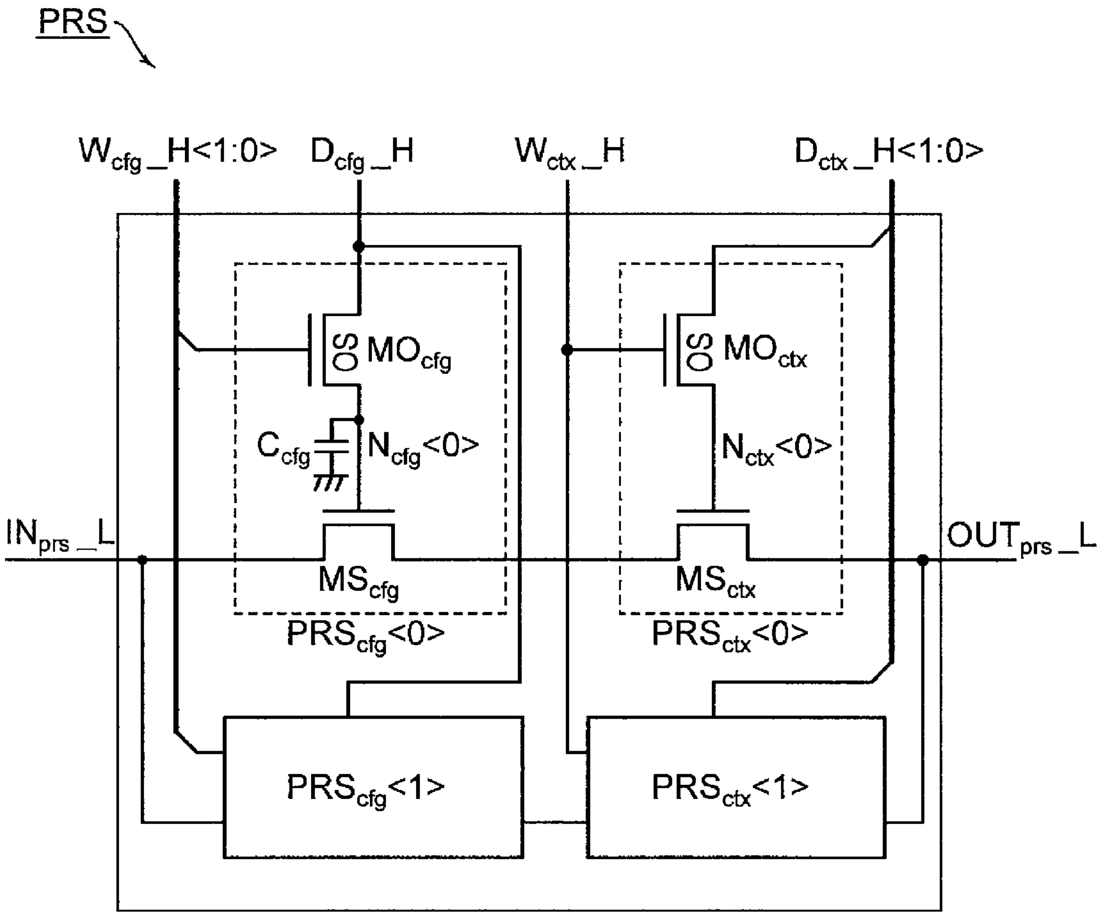
FIG. 29 is a circuit diagram of a PRS in the present OS FPGA.

FIG. 29 is a circuit diagram of the PRS. $PRS_{cfg}$ in FIG. 29 has a structure where a capacitor $C_{cfg}$ is added to $PRS_{cfg}$ in FIG. 23. $PRS_{cfg}$<0> and $PRS_{ctx}$<0> are electrically connected in series to form a pair of routing switches, and $PRS_{cfg}$<1> and $PRS_{ctx}$<1> are electrically connected in series to form another pair of routing switches. These routing switch pairs are electrically connected in parallel between $IN_{prs\_}L$ and $OUT_{prs\_}L$.

(PLE)

Figure 30:
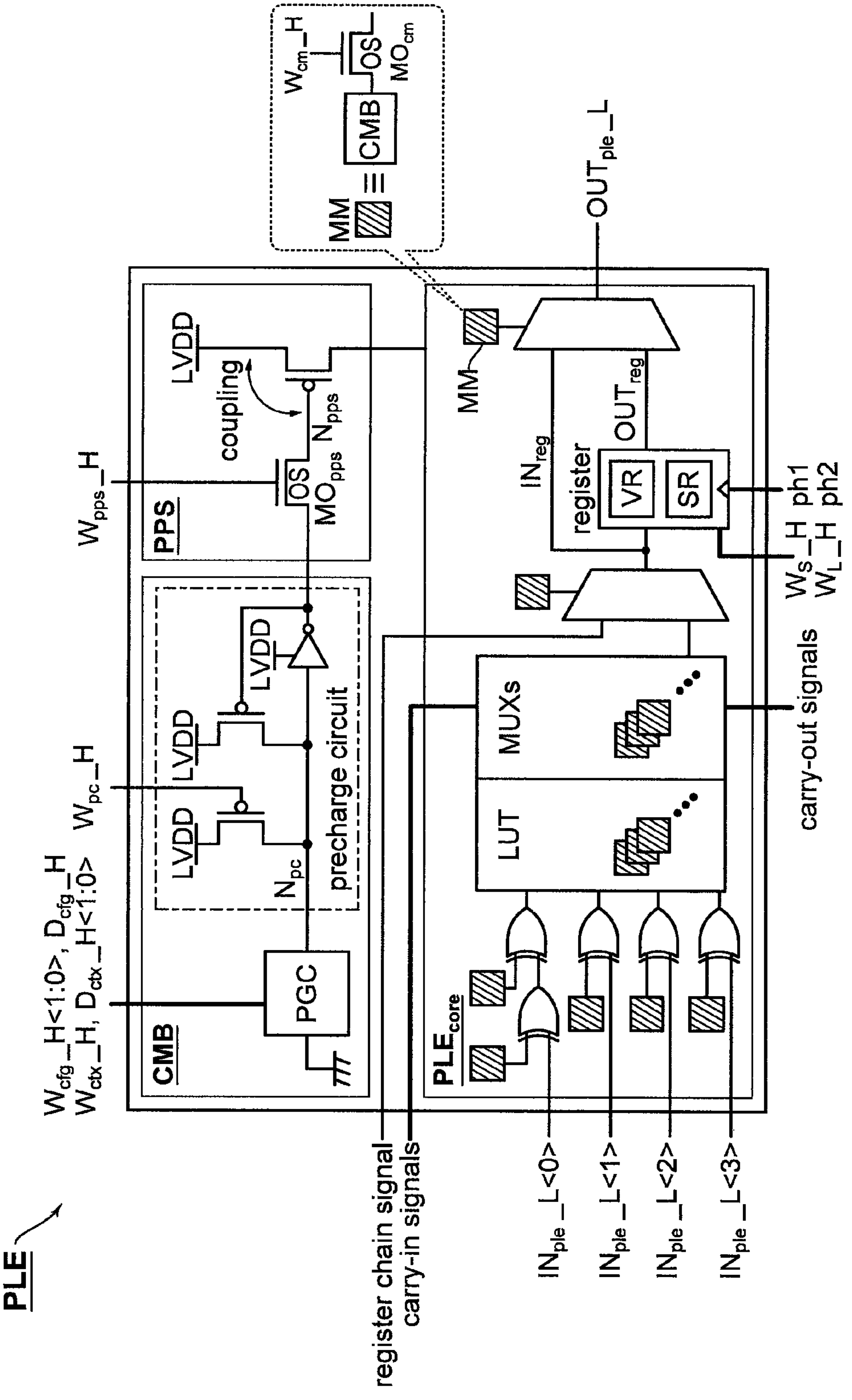
FIG. 30 is a circuit diagram of a PLE in the present OS FPGA.

FIG. 30 illustrates a circuit structure of the PLE. The PLE in FIG. 30 includes the PPS, $PLE_{core}$, and a configuration memory block (CMB). Providing the PPS in the PLE enables fine-grained power gating.

$PLE_{core}$ includes five 2-input EXORs, a LUT, a plurality of MUXs, two SELs, a register, a plurality of memory circuits (MMs), four input nodes ($IN_{ple\_}L$<0> to $IN_{ple\_}L$<3>), and one output node $OUT_{ple\_}L$. The MM is composed of an OS transistor $MO_{cm}$ and the CMB and retains configuration data and context data. $W_{cm\_}H$ is a $MO_{cm}$ control signal.

The register includes a nonvolatile register (VR) and a shadow register (SR) to achieve fine-grained power gating. The SR is a nonvolatile register for backing up data in the VR and includes a storage transistor (OS transistor), a load transistor, and a capacitor. The storage transistor and the capacitor constitute nonvolatile analog memory.

Various control signals are input to the register. A two-phase clock signal of ph1 and ph2, a store signal $W_S$_H, and a load signal $W_L$_H are input to the SR. Note that ph1 and ph2 are generated by a clock generator provided in the present OS FPGA. $W_S$_H controls operation for backing up data to the SR (store operation). $W_S$_H is input from the outside. $W_L$_H controls operation of writing data back from the SR to the VR (load operation). $W_L$_H is generated by a normally-off controller in the HVDD domain.

The storage transistor is overdriven with $W_S$_H to avoid a Vth drop of a backup data potential. Moreover, the load transistor overdriven with $W_L$_H achieves higher $I_{on}$ than an inverter latch for data retention in the VR, resulting in reliable data storage and loading.

(CMB)

The CMB is composed of a precharge circuit and a ground potential supply circuit using a programmable ground connection (PGC). The PGC has the same structure as the PRS in FIG. 29. In the CMB, an input node $IN_{prs}$_L is grounded, and an output node $OUT_{prs}$_L is electrically connected to an input node $N_{pc}$ of the precharge circuit. Compared with the previous PLE memory circuit, the area efficiency of the present CMB is increased because of a smaller number of elements. The precharge circuit is a dynamic logic circuit composed of two pch-Si transistors and one inverter. $W_{pc}$_H is a signal for controlling operation of precharging $N_{pc}$ and is generated by the context controller.

Figure 31:
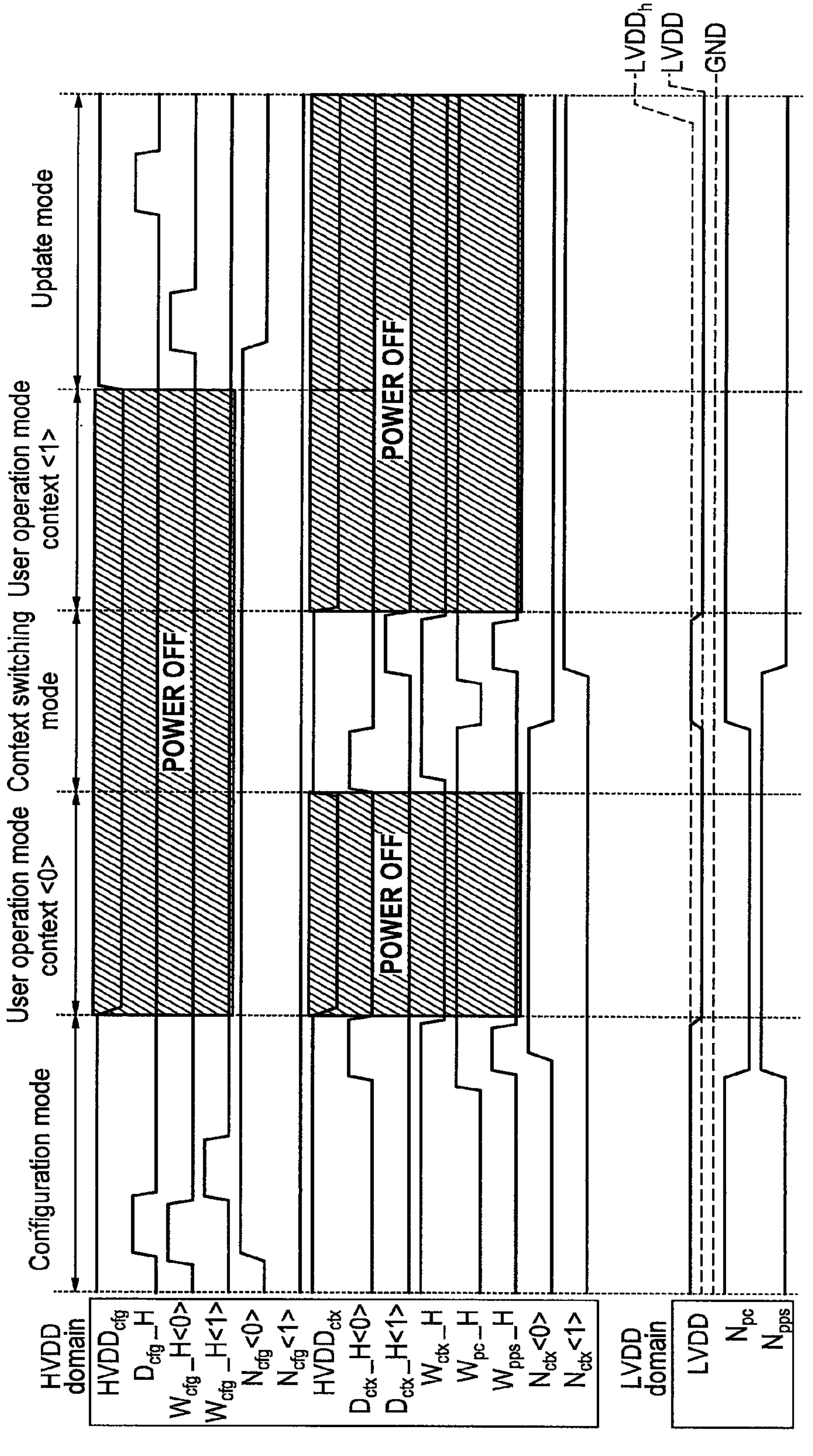
FIG. 31 is a timing chart for a configuration memory block (CMB) in a PLE.

FIG. 31 is a timing chart of the CMB. A period during which $W_{pc}$_H is "H" is a period for precharging the CMB (precharge circuit), and a period during which $W_{pc}$_H is "L" is a period for verifying the CMB (precharge circuit). After the precharge operation, the CMB maintains or discharges the LVDD potential of $N_{pc}$ depending on the configuration data ($D_{cfg}$_H) and a selected context. The CMB updates (refreshes) output data in the context switching operation.

Power is supplied to the entire HVDD domain in the configuration mode, whereas power is supplied only to the context controller in the context switching mode. In a user operation mode, the circuits in the HVDD domain are powered off by power gating because they need not operate.

(LS)

Figure 32:
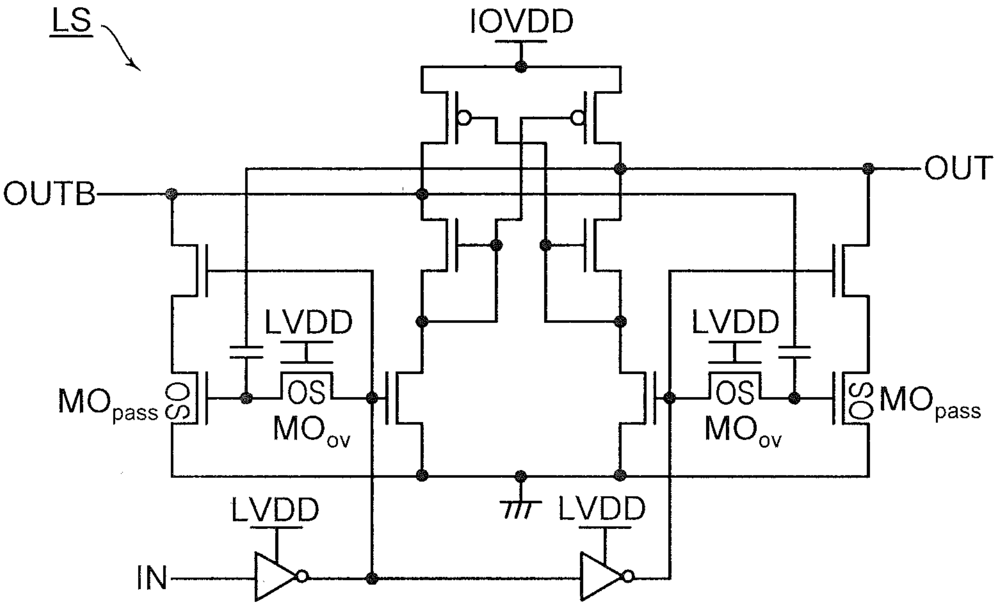
FIG. 32 is a circuit diagram of a level shifter (LS) in the present OS FPGA.

FIG. 32 is a circuit diagram of a level shifter (LS) in the PIOB. The LS boosts a signal from the LVDD potential to the IO domain potential (IOVDD) to facilitate connection between internal domains of the present OS FPGA and an external circuit. The LS is required to have a high voltage boosting factor. Some OS transistors ($MO_{pass}$, $MO_{ov}$) were added on the basis of a known level shifter (Non-Patent Document 7). $MO_{pass}$ and $MO_{ov}$ have an ultralow off-leakage current and have a higher $I_{on}/I_{off}$ ratio than a Si transistor in low-voltage driving. Because of overdriving due to capacitive coupling between a $MO_{pass}$ gate and output nodes (OUT, OUTB) of the LS, static off-leakage current can be decreased without decreasing the LS driving capability. The overdrive voltage is retained by turning off $MO_{ov}$. SPICE simulation with the same parameters (FIGS. 27A and 27B) of Section II-B has proved that the addition of the OS transistors decreases static power consumption of the LS by approximately 30%. Therefore, the LS in this example largely contributes to static leakage power saving.

<III-B. OS FPGA State Transition>

Figures 33A, 33B:
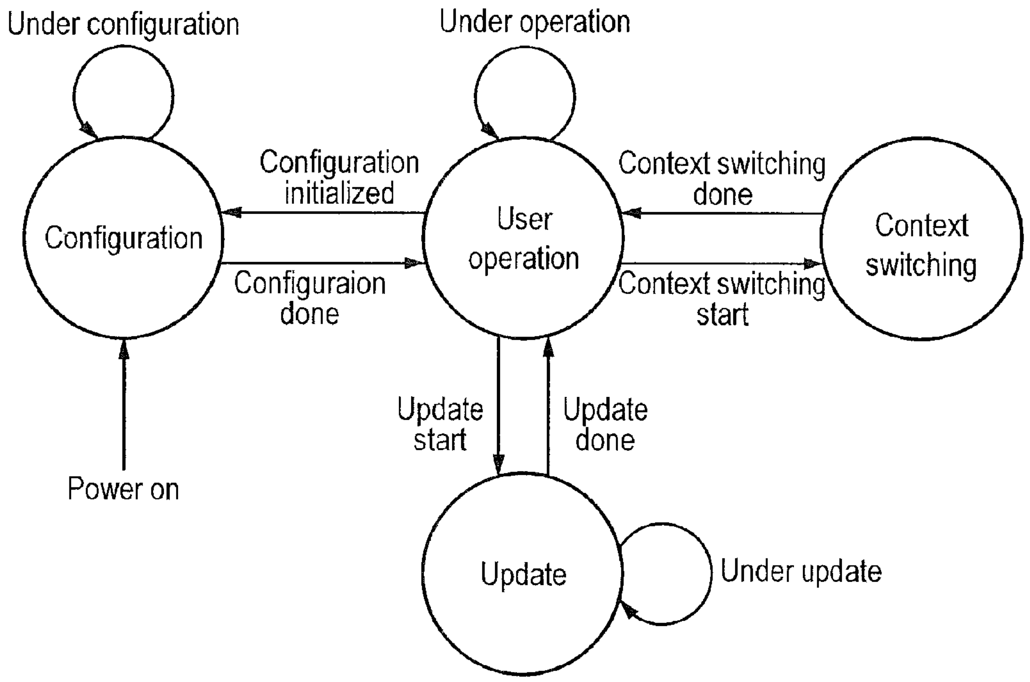
FIG. 33A is a state transition diagram of the present OS FPGA.
FIG. 33B shows a list of operating modes of the present OS FPGA.

FIG. 33A is a state transition diagram of the present OS FPGA. FIG. 33B lists operating modes of the present OS FPGA. The present OS FPGA is transferred between four operating modes: a configuration mode, user operation mode, context switching mode, and update mode. The four operating modes are described in detail below.

In the configuration mode, configuration data is written to all the configuration memories on startup (power on) or at system reset, and power is supplied to all the domains.

In the user operation mode, the operation of a circuit configured with configuration data selected according to a context is executed in a programmable region, and power is supplied only to the LVDD domain. The supply of power ($HVDD_{cfg}$, $HVDD_{ctx}$) to the configuration controller and context controller is stopped by power gating.

In the context switching mode, the circuit operation in the programmable region is stopped, and power ($HVDD_{ctx}$, LVDD) is supplied to the context controller and the LVDD domain. After context data is written to the context memories of the PLE and PRS, supply of power ($HVDD_{ctx}$) to the context controller is stopped again by power gating. Transition from the user operation mode through the context switching mode to the user operation mode again, i.e., context switching is possible within a single clock.

In the update mode, configuration data in the configuration memory is updated according to an unselected context; meanwhile, the circuit operation in the programmable region in the user operation mode continues, and power ($HVDD_{cfg}$, LVDD) is supplied to the configuration controller and the LVDD domain.

In the user operation mode, context switching mode, and update mode, the configuration memories in the PLE and the PRS and the context memory in the PRS can retain data even while the circuits in the HVDD domain are power gated, thus, the circuit configurations are maintained without power being consumed. Supply of power (IOVDD) to the IO domain is only necessary when the domain monitors an internal signal.

<<IV. Prototype Chip>>

Figure 34:
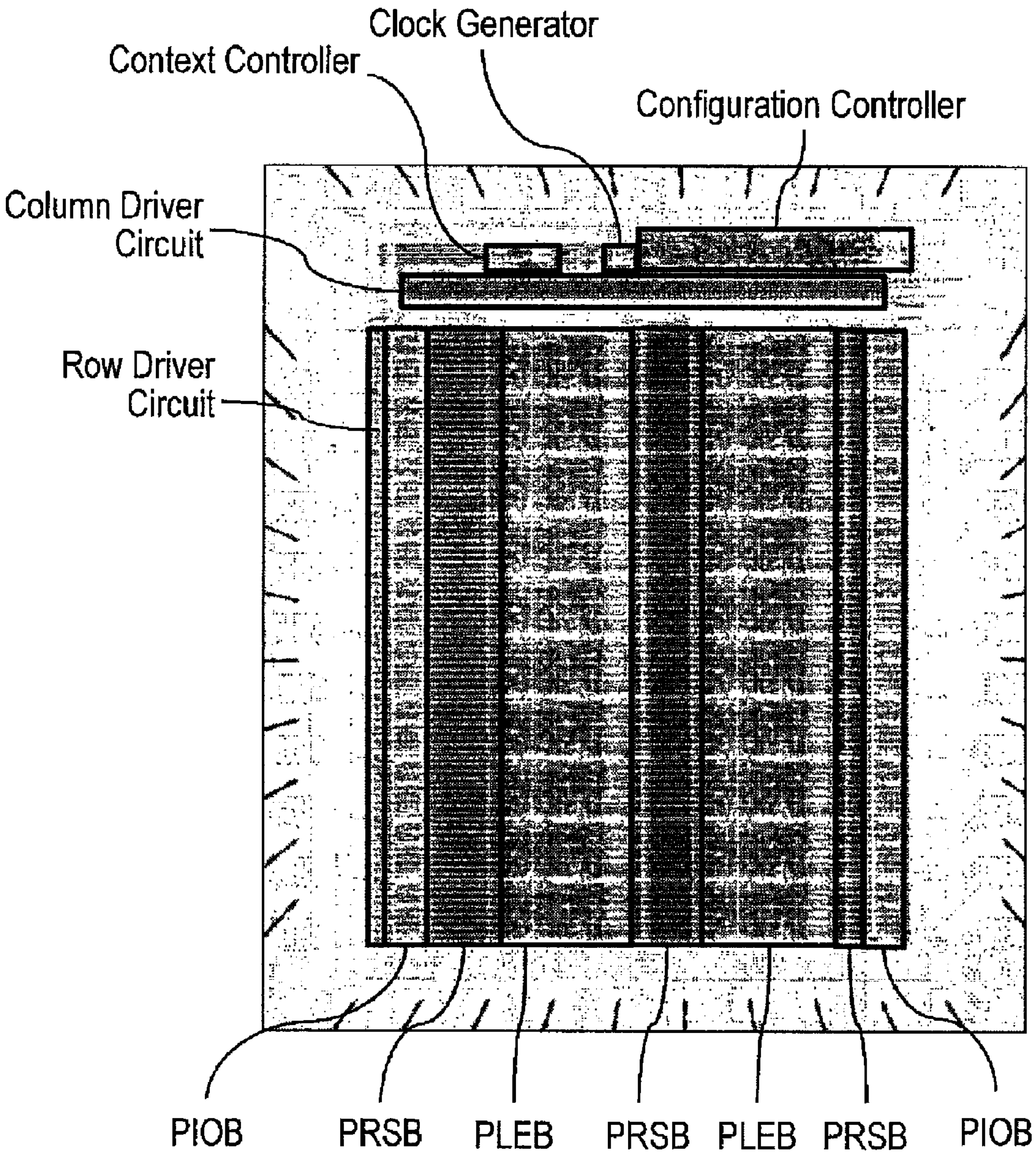
FIG. 34 is a micrograph of the present OS FPGA chip.

An OS FPGA and a PLE test element group (TEG) were fabricated using a 0.8-μm OS/0.18-μm CMOS hybrid process. FIG. 34 shows a micrograph of the present OS FPGA prototype chip.

<IV-A. PLE TEG>

Initially, in order to confirm that the PPS issue, FCS issue, and SR issue are resolved, the operation of the PLE TEG was evaluated to investigate the PPS overdriving effect and context switching operation. Specifically, a 2-context configuration with a 4-input OR/4-input AND configuration was employed to examine transition operation from the user operation mode of context<0> (4-input OR) to the user operation mode of context<1> (4-input AND) through the context switching mode.

Figure 35:
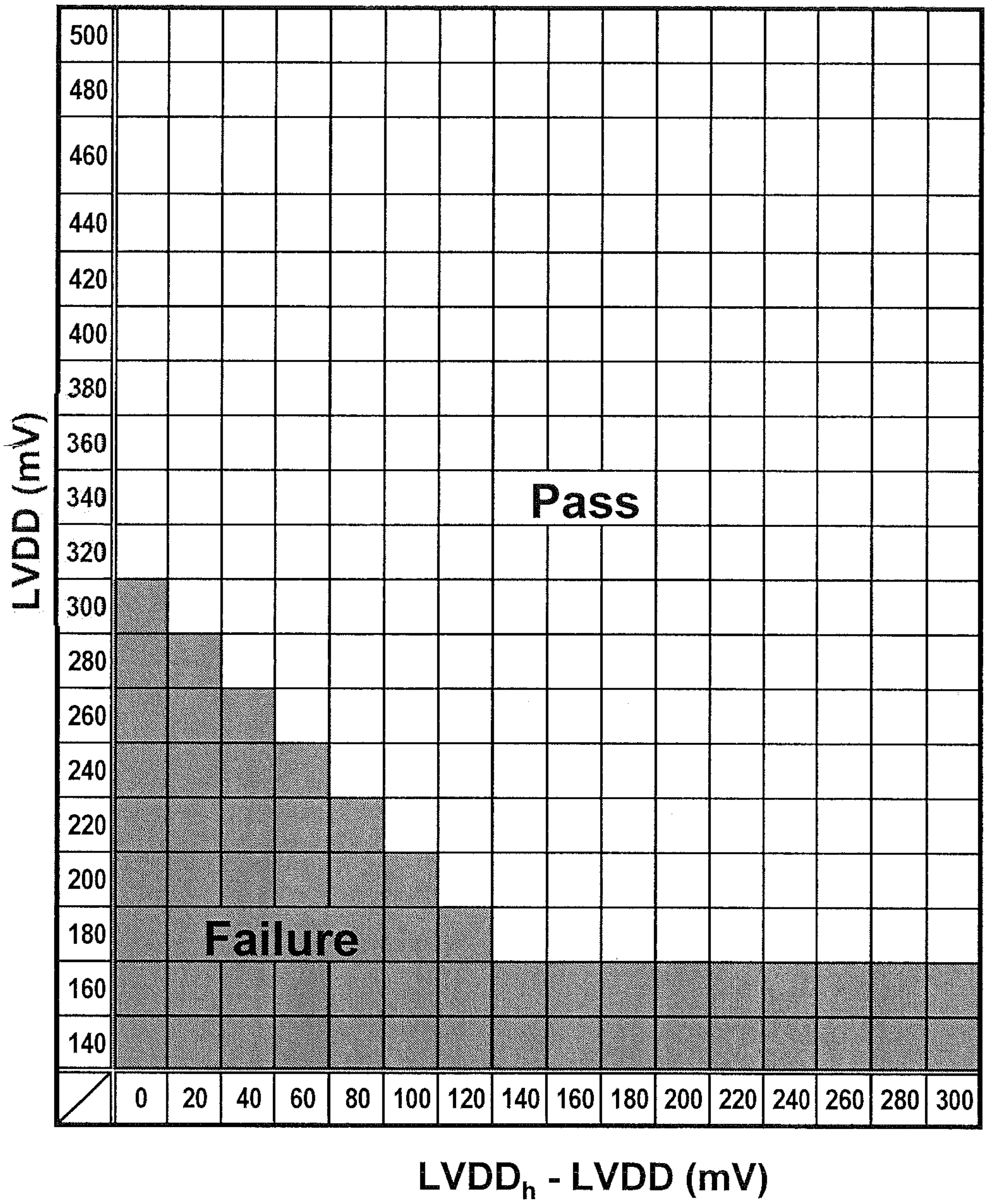
FIG. 35 shows a shmoo plot of a PLE test element group (TEG)

FIG. 35 shows a shmoo plot of $LVDD_h$-LVDD versus LVDD of the PLE TEG with a 4-input OR/4-input AND configuration, used to confirm the intended operation (pass/fail of output signals) in 5-kHz driving. Here, HVDD ($HVDD_{cfg}$, $HVDD_{ctx}$) was 1.1 V. In FIG. 35, the minimum overdrive voltage $LVDD_h$ was 320 mV at a minimum operating voltage LVDD of 180 mV.

Figure 36:
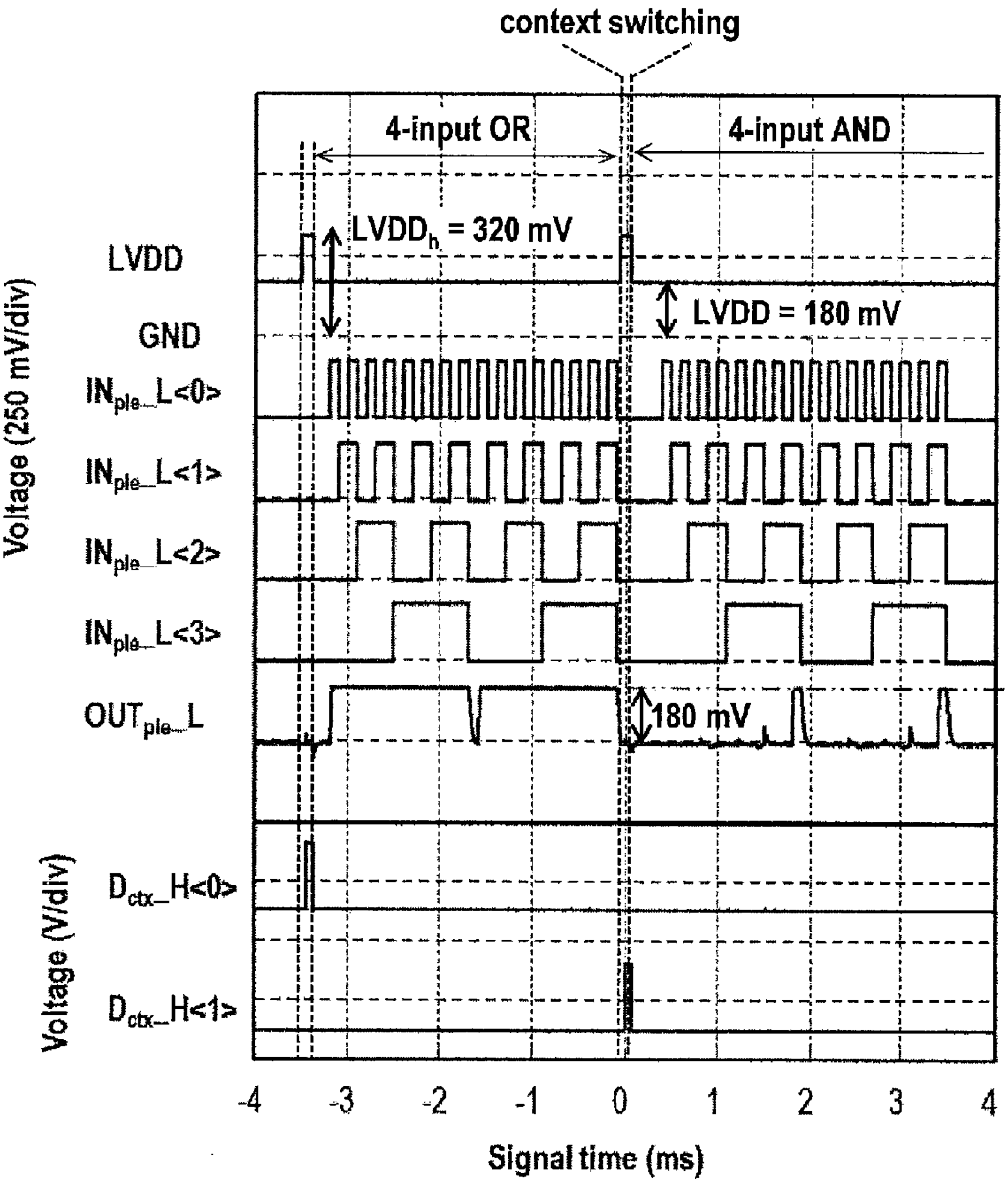
FIG. 36 shows input and output waveforms of a PLE TEG in context switching operation from an OR configuration to an AND configuration.

FIG. 36 illustrates input and output signal waveforms of the PLE TEG at a minimum operating voltage LVDD of 180 mV. FIG. 36 shows that the PLE TEG correctly executes the operation including context switching at a minimum operating voltage LVDD of 180 mV. In contrast, in the case where overdriving is not performed, i.e., the case where $LVDD_h$-LVDD is 0 mV during context switching, the minimum operating voltage LVDD is 320 mV. Since the PLE TEG does not have a PRS, the PPS overdriving contributes to the decrease in the minimum operating voltage from 320 mV to 180 mV.

Figure 37:
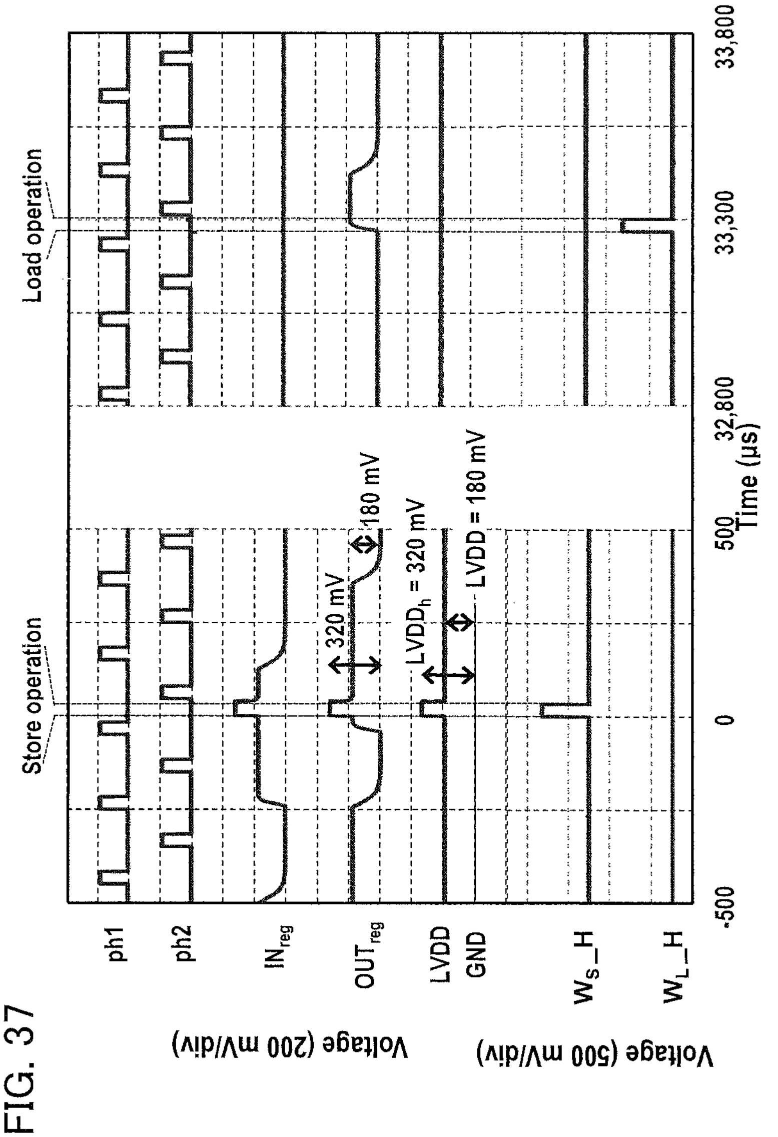
FIG. 37 shows input and output waveforms of a register in a PLE TEG in load/store operation.

The load/store operation between the VR and SR in the PLE was assessed. FIG. 37 illustrates input and output waveforms in 5-kHz driving at LVDD of 180 mV and $LVDD_h$ of 320 mV, which are the minimum operating voltage conditions as described above.

Storage operation ($W_S$_H="H") was performed when $IN_{reg}$ and $OUT_{reg}$ were "H", and then load operation ($W_L$_H="H") was performed when $IN_{reg}$ and $OUT_{reg}$ were "L". The data "H" stored in the SR was loaded by the load operation, whereby transition of the $OUT_{reg}$ potential from "L" to "H" was demonstrated. In addition, before and after the store/load operation, the $IN_{reg}$ potential propagated to the $OUT_{reg}$ potential in synchronization with the two-phase clock signal ph1 and ph2, demonstrating correct operation of the register including the SR. That is, FIG. 37 shows that the PPS issue, FCS issue, and SR issue were resolved.

<IV-B. OS FPGA Chip>

Figure 38:
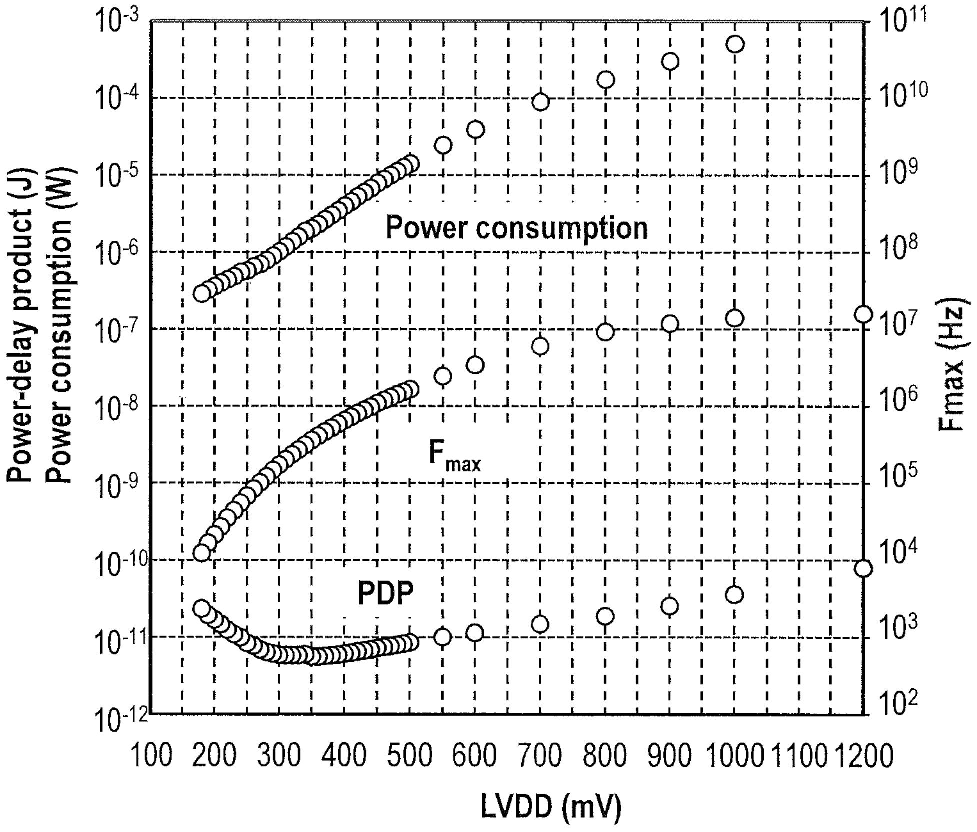
FIG. 38 shows the results of measuring the power consumption, maximum operating frequency, and power-delay product in relation to LVDD of the present OS FPGA with a combinational circuit (ring oscillator) configuration.
Figure 39:
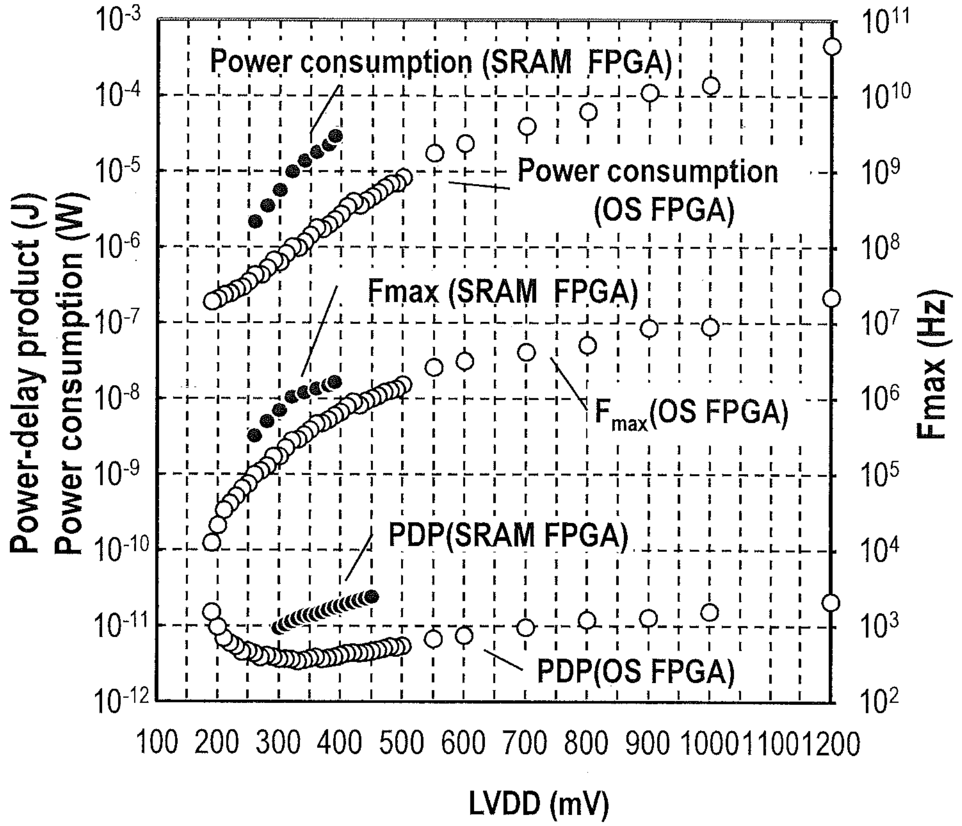
FIG. 39 shows the results of measuring the power consumption, maximum operating frequency, and power-delay product in relation to LVDD of the present OS FPGA and an FPGA of a comparative example, both with a sequential circuit (counter) configuration.

The functions of the CAAC-IGZO FPGA chip were then evaluated, starting with the overdriving effect on configurations of a combinational circuit and a sequential circuit. FIG. 38 shows the LVDD dependence of the maximum operating frequency ($F_{max}$), power consumption, and power-delay product (PDP) of the present OS FPGA in a three-stage ring oscillator (RO3) configuration as an example of the combinational circuit. FIG. 39 shows the LVDD dependence of $F_{max}$, power consumption, and PDP of the present OS FPGA in a 4-bit counter (CNT4) configuration as an example of the sequential circuit.

Here, the power supply voltages were $LVDD_h$ of 1.2 V and HVDD of 2.5 V. An unused PLE is power gated by the PPS. FIG. 39 also shows data on an FPGA having SRAM-based configuration memory (SRAM FPGA) in Non-Patent Document 2; the values extracted from FIG. 8 and FIG. 9 in Non-Patent Document 2 are converted into values corresponding to one CNT4.

With the RO3 configuration, the minimum operating voltage of the present OS FPGA was 180 mV. With the CNT4 configuration at LVDD of 330 mV and $F_{max}$ of 28.6 kHz, the minimum PDP ($PDP_{min}$) was 3.40 pJ. This $PDP_{min}$ was approximately 49% lower than that of the SRAM FPGA (Non-Patent Document 2) with a CNT4 configuration (see Table 1 shown below). $F_{max}$ of the previous OS FPGA (Non-Patent Document 1) was 33.3 kHz at LVDD of 900 mV, whereas $F_{max}$ of the present OS FPGA at the same voltage increased to 8.6 MHz. In other words, the present OS FPGA achieves low-power driving and high-performance processing.

Table 1 shows the specifications of the present OS FPGA and, as comparative examples, the specifications of SRAM FPGAs in Non-Patent Documents 2 and 3 and the previous OS FPGA in Non-Patent Document 1. An OS transistor in the previous OS FPGA is also an IGZO transistor.

TABLE 1

| Specifications | SRAM-based FPGA [2] | SRAM-based FPGA [3] | Previous OS FPGA [1] | Present OS FPGA | |
|---|---|---|---|---|---|
| Process node | 0.18-μm SOI | 0.18-μm CMOS | 0.5-μm SOI + 1.0-μm OS | 0.18-μm SOI + 0.8-μm OS | |
| Chip area | 4.1 mm × 4.4 mm | 22.55 mm² (Active area) | 4.52 mm × 5.52 mm | 4.52 mm × 5.52 mm | |
| Configuration memory | Volatile (SRAM) | Volatile (SRAM) | Nonvolatile (IGZO Tr. + C) | Nonvolatile (IGZO Tr. + C) | |
| Number of PLEs | 148 | 25 (50 LUTs) | 20 | 20 | |
| PRS implementation | Multiplexers | Pass transistor + sense amplifiers | Pass transistor | Pass transistor + IGZO transistor | |
| Routing tracks | 48 | 16 | 32 | 32 | |
| Configuration | 4-bit counter | 3-stage pipelined multiplier | 10-stage shifter | 4-bit counter | |
| Minimum operating voltage ($V_{min}$) | 260 mV | 300 mV | 900 mV | 900 mV ($V_{min}$ of [1]) | 190 mV |
| $F_{max}$ at $V_{min}$ | 332 kHz | — | 33.3 kHz | 8.6 MHz | 12.5 kHz |
| Minimum PDP | 6.72 pJ at $V_{min}$ | 8.7 pJ at 450 mV | 13.5 pJ at $V_{min}$ | 12.9 pJ at $V_{min}$ | 3.40 pJ at 330 mV |

*[1]: Non-Patent Document 1,
[2]: Non-Patent Document 2,
[3]: Non-Patent Document 3

Figure 40:
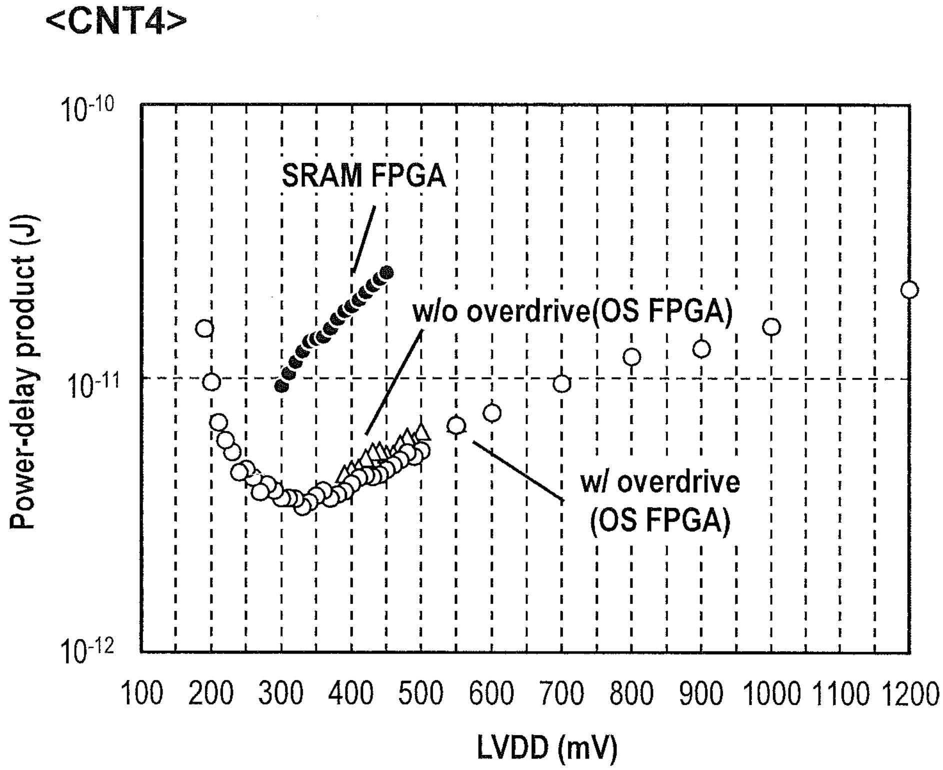
FIG. 40 shows the results of measuring the power-delay product of the present OS FPGA with and without overdriving and the power-delay product of an FPGA of a comparative example.

The PDP of the present OS FPGA with and without PPS overdriving was measured to assess the contribution of the overdriving. FIG. 40 shows the results of measuring the PDP of the present OS FPGA with a CNT4 configuration. LVDD=$LVDD_h$ and HVDD=LVDD+1.2 V when the PPS is not overdriven. Overdriving decreased the minimum operating voltage from 390 mV to 180 mV; accordingly, the minimum PDP was decreased by 24% from 4.48 pJ (at an operating voltage of 390 mV) to 3.40 pJ (at an operating voltage of 330 mV). This is because the $I_{on}/I_{off}$ ratio of the logic circuit was increased by suppressing a Vth drop in the PRS in subthreshold voltage operation and increasing the PPS $I_{on}$. That is, the above results demonstrate that the PRS issue was resolved.

Next, the fine-grained power gating function of the present OS FPGA was assessed. Under the operating condition (330 mV, 28.6 kHz) where the PDP of the CNT4 configuration is the lowest, when the context was switched from context<0> where power is supplied to 16 unused PLEs to context<1> where the unused PLEs are power gated, standby current of the OS FPGA was decreased by 54% (from 9.15 μA to 4.20 μA). In such a manner, fine-grained power gating contributes to the reduction of the standby current also in the subthreshold voltage operation.

Figure 41A:
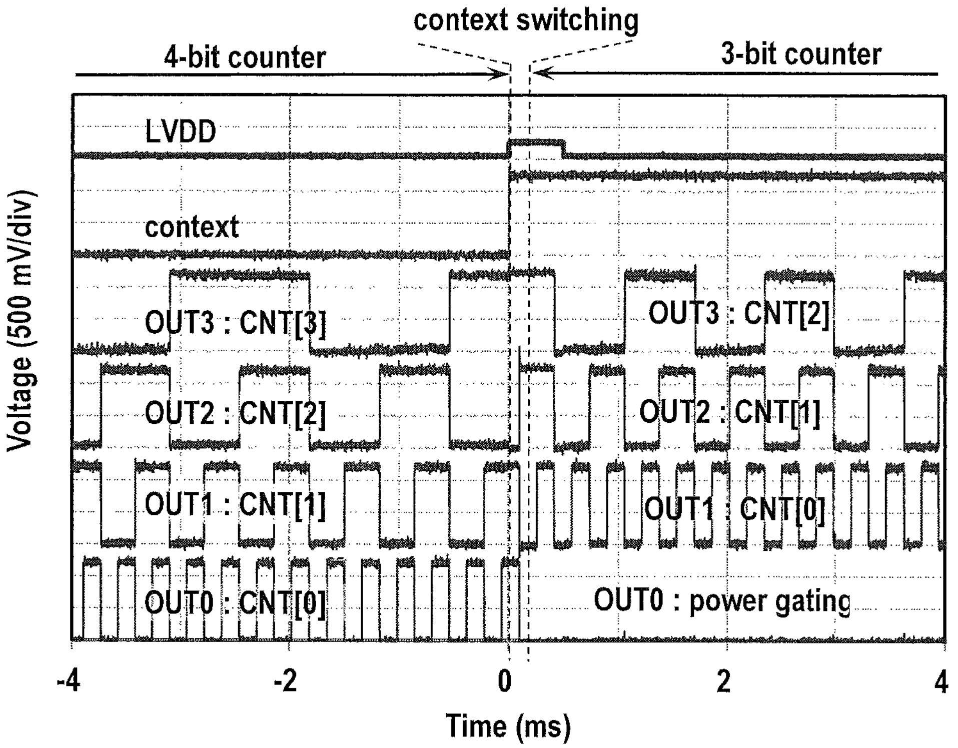
FIG. 41A shows input and output waveforms of the present OS FPGA in context switching from a 4-bit counter configuration to a 3-bit counter configuration.

Whether the present OS FPGA in ultralow-voltage operation performs context switching at high speed and low power was determined. FIG. 41A shows the results of evaluating context switching operation under the condition where the PDP of the CNT4 configuration is the lowest (300 mV, 28.6 kHz). By the context switching, the circuit configuration was switched from CNT4 to a 3-bit counter (CNT3). FIG. 41A shows input and output waveforms of the present OS FPGA chip. Output signals OUT0 to OUT3 of the chip were boosted to 2.5 V by the LS in the PIOB.

The periods of the signals OUT1 to OUT3 for outputting bit signals of the counters were halved after the context switching, demonstrating normal context switching operation from context<0> to context<1>. When context<0> was selected, OUT3 to OUT0 corresponded to 4-bit output signals CNT[3] to CNT[0]. When context<1> was selected, OUT3 to OUT1 corresponded to CNT[2] to CNT[0], and OUT0 became a fixed low potential because the output of an unused PLE that was power gated was supplied.

Figure 41B:
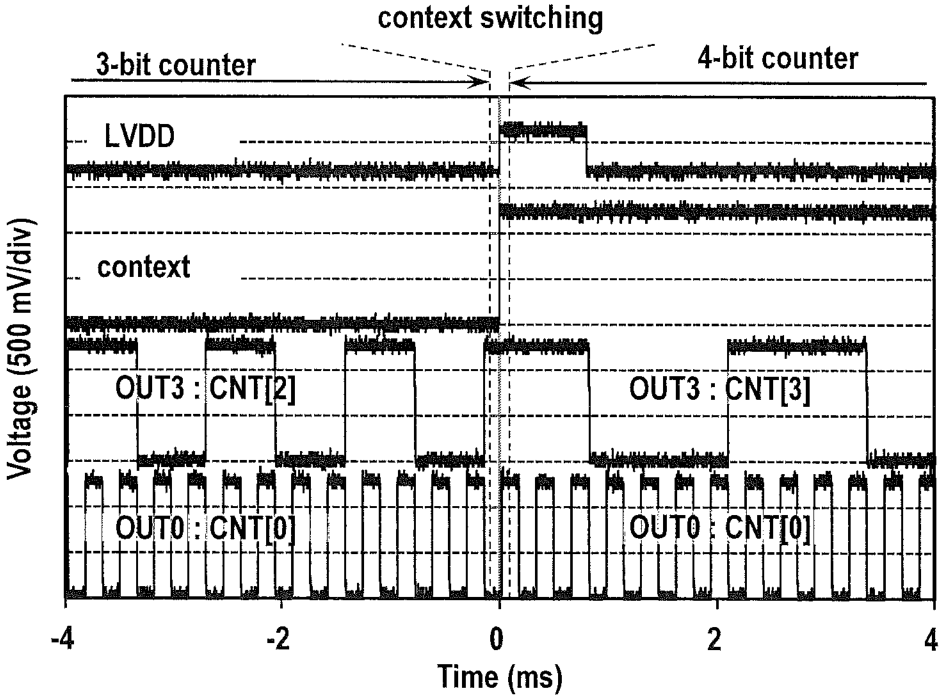
FIG. 41B shows input and output waveforms of the present OS FPGA in context switching from a 3-bit counter configuration to a 4-bit counter configuration.

FIG. 41B shows the results of evaluating context switching operation from the CNT3 configuration to the CNT4 configuration under the operating condition in FIG. 41A. FIG. 41B demonstrates that context switching operation from the CNT3 configuration to the CNT4 configuration is performed correctly within a single clock. In FIG. 41B, OUT3 and OUT0 correspond to CNT[2] and CNT[0], respectively, when context<0> is selected; OUT3 and OUT0 correspond to CNT[3] and CNT[0], respectively, when context<1> is selected.

Energy necessary for context switching under the condition in FIG. 41A was evaluated with SPICE simulation. Through SPICE simulation, the energy required for context switching of the present OS FPGA is estimated at 6.42 nJ, and the average powers with the CNT3 and CNT4 configurations are estimated at 3.86 μW and 4.46 μW, respectively. If contexts switch once every second, the power is less than or equal to 0.17% of that in normal operation; thus, the overhead power is extremely low even when LVDD is boosted in configuration data update.

Figure 42:
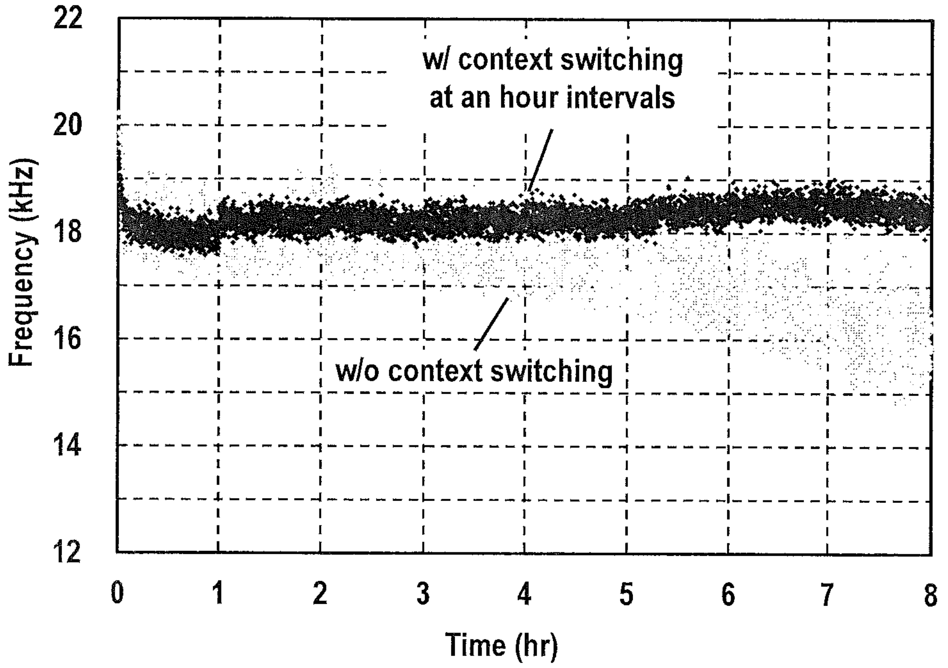
FIG. 42 shows a temporal change in oscillation frequency of the present OS FPGA with a three-stage ring oscillator configuration.

To assess the duration of the overdriving effect, a temporal change in the oscillation frequency of the present OS FPGA in the RO3 configuration was measured. FIG. 42 shows the measurement results at LVDD of 180 mV. $LVDD_h$ was 1200 mV during context switching. Without context switching operation, the oscillation frequency decreased only by 4.5% in four hours. One refresh operation per hour enables the overdriving effect to be maintained with a reduction in oscillation frequency by 1% or less.

(Temperature Dependence)

Figure 43:
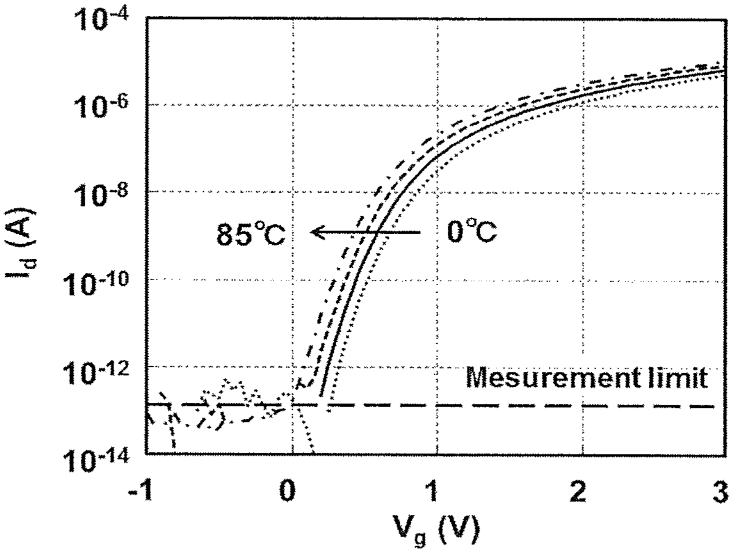
FIG. 43 shows a change in characteristics of an OS transistor at varying temperatures.

Next, temperature dependence of the characteristics of the OS FPGA will be described. FIG. 43 shows the Id-Vg characteristics of an IGZO transistor at 0° C., 27° C. (room temperature), 60° C., and 85° C. The IGZO transistor had a channel length L of 0.81 μm, a channel width W of 2.96 μm, and Vd of 3.3 V.

Although Vth of the IGZO transistor decreased as the temperature increased, the amount of Vth change was smaller than that of a Si transistor and the off-state current ($I_{off}$) remained below the measurement limit ($1\times10^{-13}$ A). Consequently, analog memory using an OS transistor can have favorable retention characteristics even at high temperatures. The present OS FPGA is aimed for a device employing energy harvesting, and therefore high resistance of the OS transistor to temperature change is effective for the present OS FPGA.

Figure 44:
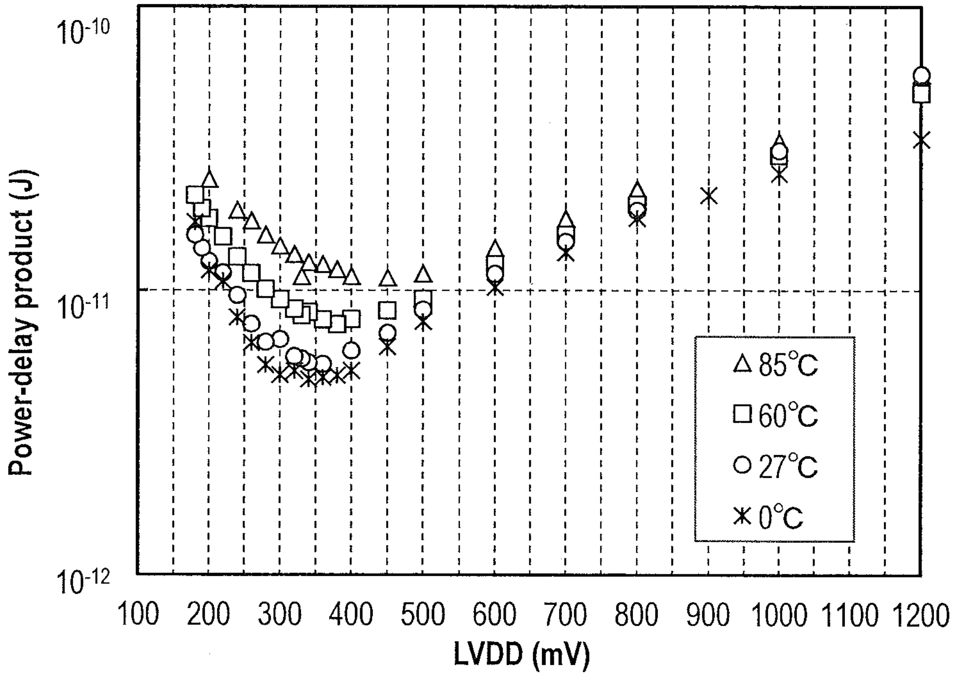
FIG. 44 shows temperature dependence of the power-delay product of the present OS FPGA with a three-stage ring oscillator configuration.

FIG. 44 shows the temperature dependence of the PDP of the present OS FPGA with the RO3 configuration. Temperatures for the measurement were the same as those in FIG. 43. In a Si transistor, which determines the dynamic characteristics of the present OS FPGA, Vth decreases and $I_{on}$ increases as the temperature increases; therefore, the frequency and power consumption of the present OS FPGA increase as the temperature increases. At this time, the amount of increase in power consumption is larger than that in frequency, whereby the minimum PDP is increased. Here, the minimum PDPs were 4.86 pJ (340 mV, 0° C.), 5.51 pJ (360 mV, 27° C.), 7.60 pJ (380 mV, 60° C.), and 11.1 pJ (450 mV, 85° C.). Furthermore, the present OS FPGA was demonstrated to perform ultralow-voltage driving at 200 mV under the same temperature conditions.

Figure 45:
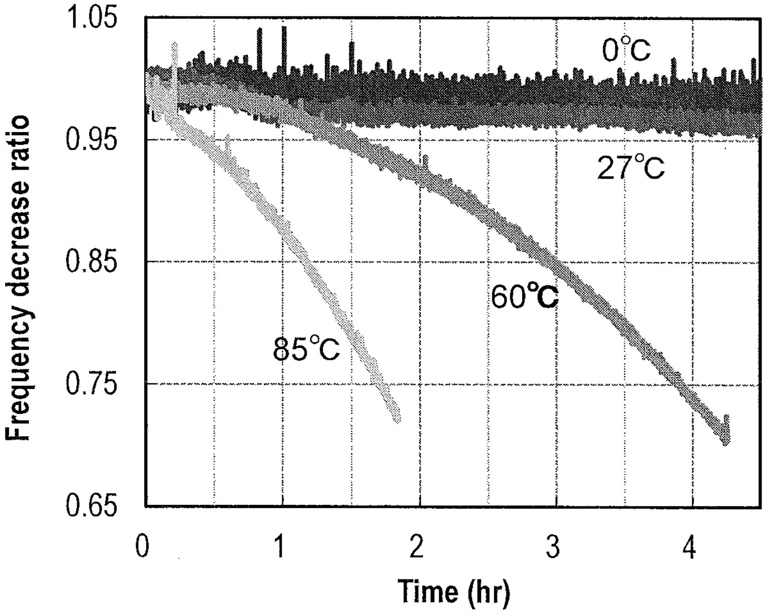
FIG. 45 shows a temporal change in temperature dependence of the oscillation frequency ratio of the present OS FPGA with a three-stage ring oscillator configuration.

FIG. 45 shows the temporal change of the oscillation frequency ratio in the RO3 configuration. Temperatures for the measurement were the same as those in FIG. 43. Here, the oscillation frequency ratio was based on the oscillation frequency at the start of operation at 330 mV (the operating voltage with which the PDP is the lowest at 27° C. in the CNT4 configuration).

Since Vth of the OS transistor decreases with rising temperature, the retention time decreased with rising temperature from 4.5 hours or longer (at 0° C. and 27° C.) to 4.2 hours (at 60° C.) and 1.8 hours (at 85° C.). The PPS probably contributes significantly to the retention time. The gate-source voltage of the OS transistor increases with a higher negative potential of $N_{pps}$; thus, off-leakage current from the floating node through the OS transistor increases. A lower voltage of $N_{pps}$ decreases the amount of current supplied to $PLE_{core}$, and eventually a signal is not correctly transmitted to a logic circuit and the circuit operation stops. Providing a storage capacitor improves the retention time. Moreover, refresh operation using context switching is effective in extending the operating time. In particular, at high temperatures, decreasing the interval between refresh operations (e.g., a 5% decrease every 25 minutes at 85° C.) is preferable.

<<V. Summary>>

As described above, the subthreshold voltage operation of the OS FPGA is achieved with positive overdriving of the PRS for the routing switch between PLEs and negative overdriving of the PPS. The prototyped OS FPGA chip with a combinational circuit configuration operates at 180 mV. The OS FPGA with a sequential circuit configuration can operate at 12.5 kHz with 190 mV and at 8.6 MHz with 900 mV, and scores the minimum PDP of 3.40 pJ at 330 mV. This is accomplished using a floating node with ideal charge retention characteristics achieved with an OS transistor exhibiting ultralow $I_{off}$. In addition to low-power driving at ultralow voltage, the present OS FPGA is capable of executing high-speed processing on the order of megahertz in high-voltage driving, and can thus be a device having a flexible circuit structure corresponding to applications.

The present OS FPGA has features such as stable driving at low voltage in the user operation mode, low standby power due to fine-grained power gating and nonvolatile configuration memory, and fast configuration switching using multi-context, and is highly preferable for a sensor network device.

Information about this specification and the like will be described below.

In the drawings, the size, the layer thickness, or the region may be exaggerated for clarity in some cases. Therefore, embodiments of the present invention are not limited to such a scale. Note that the drawings are schematic views showing ideal examples, and embodiments of the present invention are not limited to shapes or values shown in the drawings. For example, the following can be included: variation in signal, voltage, or current due to noise or difference in timing.

Note that in this specification, terms for describing arrangement, such as "over" and "under", are sometimes used for convenience to describe a positional relation between components with reference to drawings. The positional relation between components is changed as appropriate in accordance with a direction in which the components are described. Therefore, the terms for explaining arrangement are not limited to those used in this specification and may be changed to other terms as appropriate depending on the situation.

The positional relation of circuit blocks illustrated in a block diagram is specified for description. Even when a block diagram shows that different functions are achieved by different circuit blocks, one circuit block may be actually configured to achieve the different functions. Functions of circuit blocks are specified for description, and even when a diagram shows one circuit block performing given processing, a plurality of circuit blocks may be actually provided to perform the processing.

Note that the terms "film" and "layer" can be interchanged with each other depending on the situation or circumstances. For example, in some cases, the term "conductive film" can be used instead of the term "conductive layer," and the term "insulating layer" can be used instead of the term "insulating film."

In this specification and the like, the trigonal and rhombohedral crystal systems are included in the hexagonal crystal system.

In this specification and the like, the term "parallel" indicates that the angle formed between two straight lines ranges from −10° to 10°, and accordingly also includes the case where the angle ranges from −5° to 5°. The term "substantially parallel" indicates that the angle formed between two straight lines ranges from −30° to 30°. The term "perpendicular" indicates that the angle formed between two straight lines ranges from 80° to 100°, and accordingly also includes the case where the angle ranges from 85° to 95°. The term "substantially perpendicular" indicates that the angle formed between two straight lines ranges from 60° to 120°.

In this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention is clear even when connection portions are not specified. Furthermore, in the case where a connection portion is disclosed in this specification and the like, it can be determined in some cases that one embodiment of the invention in which a connection portion is not specified is disclosed in this specification and the like. In particular, in the case where the number of portions to which the terminal is connected may be more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified or when at least a function of a circuit is specified. In other words, one embodiment of the invention is clear when the function of a circuit is specified. It can be determined in some cases that one embodiment of the invention in which a function is specified is disclosed in this specification and the like. Thus, when the connection portion of a circuit is specified, the circuit is disclosed as one embodiment of the invention even if a function is not specified, and one embodiment of the invention can be constituted. Moreover, when the function of a circuit is specified, the circuit is disclosed as one embodiment of the invention even if a connection portion is not specified, and one embodiment of the invention can be constituted.

One embodiment of the invention can be constituted by excluding contents that are not specified in this specification and the like. When the range of a value that is defined by the maximum and minimum values is described, narrowing the range appropriately or removing part of the range can constitute one embodiment of the invention excluding part of the range. In such a manner, it is possible to specify the technical scope of one embodiment of the present invention so that a conventional technology is excluded, for example.

Specifically, given that a circuit including first to fifth transistors is shown in a circuit diagram, the invention can be defined as a circuit that does not include a sixth transistor or as a circuit that does not include a capacitor. Moreover, the invention can be constituted by specifying that the circuit does not include a sixth transistor with a particular connection structure or that the circuit does not include a capacitor with a particular connection structure. For example, the invention can be specified such that a sixth transistor whose gate is connected to a gate of the third transistor is not included, or that a capacitor whose first electrode is connected to the gate of the third transistor is not included.

Note that in this specification and the like, in a diagram or a text described in one embodiment, part of the diagram or the text is taken out, and one embodiment of the invention can be constituted. Thus, in the case where a diagram or text related to a certain portion is described, the contexts taken out from part of the diagram or the text are also disclosed as one embodiment of the invention, and one embodiment of the invention can be constituted. The embodiment of the invention is clear. Thus, for example, in a diagram or text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, and the like are described, part of the diagram or the text is taken out, and one embodiment of the invention can be constituted. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where $M<N$). As another example, from a circuit diagram in which N layers (N is an integer) are provided, it is possible to constitute one embodiment of the invention by taking out M layers (M is an integer, where $M<N$). As another example, from a flow chart in which N elements (N is an integer) are provided, it is possible to constitute one embodiment of the invention by taking out M elements (M is an integer, where M<N). As another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

In the case where at least one specific example is described in a diagram or text in one embodiment in this specification and the like, it will be readily appreciated by those skilled in the art that a broader concept of the specific example can be derived. Thus, in the case where at least one specific example is described in the diagram or the text in one embodiment, a broader concept of the specific example is disclosed as one embodiment of the invention, and one embodiment of the invention can be constituted. The embodiment of the invention is clear.

In this specification and the like, contents described in at least a diagram (or part of the diagram) are disclosed as one embodiment of the invention, and one embodiment of the invention can be constituted. Thus, when certain contents are described in a diagram, the contents are disclosed as one embodiment of the invention even if the contents are not described with a text, and one embodiment of the invention can be constituted. Similarly, part of a diagram that is taken out from the diagram is disclosed as one embodiment of the invention, and one embodiment of the invention can be constituted. The embodiment of the invention is clear.

In one embodiment of the present invention, a variety of switches can be used as a switch. A switch is conducting or not conducting (is turned on or off) to determine whether current flows therethrough or not. Alternatively, a switch has a function of determining and changing a current path. For example, a switch has a function of determining whether current can flow through a path 1 or a path 2 and switching the paths. For example, an electrical switch or a mechanical switch can be used. That is, a switch is not limited to a certain element and can be any element capable of controlling current. Examples of a switch are a transistor (e.g., a bipolar transistor or a metal-oxide-semiconductor (MOS) transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined. An example of a mechanical switch is a switch formed using a microelectromechanical system (MEMS) technology, such as a digital micromirror device (DMD). Such a switch includes an electrode that can be moved mechanically, and operates by controlling conduction and non-conduction in accordance with movement of the electrode.

In one embodiment of the present invention, there is no particular limitation on the device structure of a capacitor intentionally provided as an element. For example, a MIM capacitor or a MOS capacitor can be used.

This application is based on Japanese Patent Applications serial no. 2015-014997 and no. 2015-161815 filed with Japan Patent Office on Jan. 29, 2015 and Aug. 19, 2015, respectively, the entire contents of which are hereby incorporated by reference.

What is claimed is:

1. A method for driving a semiconductor device comprising a first transistor; a second transistor and a circuit wherein the second transistor comprises a channel formation region comprising an oxide semiconductor, wherein one of a source and a drain of the second transistor is electrically connected to a gate of the first transistor and wherein one of a source and a drain of the first transistor is electrically connected to the circuit, the method comprising the steps of:

inputting a first potential applied to the other of the source and the drain of the second transistor to the gate of the first transistor by turning on the second transistor while applying a second potential to the other of the source and the drain of the first transistor;

electrically floating the gate of the first transistor by turning off the second transistor; and changing a potential of the other of the source and the drain of the first transistor from the second potential to a third potential while the second transistor is in an off-state.

2. The method according to claim 1, wherein the other of the source and the drain of the first transistor is electrically connected to a power supply line.

3. The method according to claim 1, wherein a memory circuit comprises the second transistor.

4. The method according to claim 1, wherein the circuit is a programmable logic element.

5. The method according to claim 1, wherein a potential of the gate of the first transistor is changed from the first potential to a fourth potential by changing the potential of the other of the source and the drain of the first transistor from the second potential to the third potential while the second transistor is in the off-state.

6. A method for driving a semiconductor device comprising a first transistor; a second transistor and a circuit wherein the second transistor comprises a channel formation region comprising an oxide semiconductor, wherein one of a source and a drain of the second transistor is electrically connected to a gate of the first transistor, wherein one of a source and a drain of the first transistor is electrically connected to the circuit and wherein the first transistor is a p-channel transistor, the method comprising the steps of:

inputting a first potential applied to the other of the source and the drain of the second transistor to the gate of the first transistor by turning on the second transistor while applying a second potential to the other of the source and the drain of the first transistor;

electrically floating the gate of the first transistor by turning off the second transistor; and changing a potential of the other of the source and the drain of the first transistor from the second potential to a third potential while the second transistor is in an off-state, wherein the second potential is higher than the third potential.

7. The method according to claim 6, wherein the other of the source and the drain of the first transistor is electrically connected to a power supply line.

8. The method according to claim 6, wherein a memory circuit comprises the second transistor.

9. The method according to claim 6, wherein the circuit is a programmable logic element.

10. The method according to claim 6, wherein a potential of the gate of the first transistor is changed from the first potential to a fourth potential by changing the potential of the other of the source and the drain of the first transistor from the second potential to the third potential while the second transistor is in the off-state.

11. A method for driving a programmable power switch comprising a power switch and a memory circuit, wherein the power switch comprises a first transistor, wherein the memory circuit comprises a second transistor, wherein the second transistor comprises a channel formation region comprising an oxide semiconductor, wherein one of a source and a drain of the second transistor is electrically connected to a gate of the first transistor, wherein one of a source and a drain of the first transistor is electrically connected to a circuit and wherein the first transistor is a p-channel transistor, the method comprising the steps of:

inputting a first potential applied to the other of the source and the drain of the second transistor to the gate of the first transistor by turning on the second transistor while applying a second potential to the other of the source and the drain of the first transistor;

electrically floating the gate of the first transistor by turning off the second transistor; and changing a potential of the other of the source and the drain of the first transistor from the second potential to a third potential while the second transistor is in an off-state, wherein the second potential is higher than the third potential.

12. The method according to claim 11, wherein the other of the source and the drain of the first transistor is electrically connected to a power supply line.

13. The method according to claim 11, wherein the circuit is a programmable logic element.

14. The method according to claim 11, wherein a potential of the gate of the first transistor is changed from the first potential to a fourth potential by changing the potential of the other of the source and the drain of the first transistor from the second potential to the third potential while the second transistor is in the off-state.

* * * * *